(12) United States Patent
Bieber et al.

(10) Patent No.: US 11,637,501 B2
(45) Date of Patent: Apr. 25, 2023

(54) DRIVE CIRCUIT FOR REGULATING VOLTAGE AND REDUCING ENERGY CONSUMED

(71) Applicant: Solaredge Technologies Ltd., Herzeliya (IL)

(72) Inventors: Ofir Bieber, Ra'anana (IL); Shay Avner, Tel Aviv (IL); Tomer Bar-On, Harutzim (IL)

(73) Assignee: Solaredge Technologies Ltd., Herzeliya (IL)

( * ) Notice: Subject to any disclaimer, the term of this patent is extended or adjusted under 35 U.S.C. 154(b) by 16 days.

(21) Appl. No.: 16/744,400

(22) Filed: Jan. 16, 2020

(65) Prior Publication Data

US 2020/0235672 A1    Jul. 23, 2020

Related U.S. Application Data

(60) Provisional application No. 62/865,467, filed on Jun. 24, 2019, provisional application No. 62/793,656, filed on Jan. 17, 2019.

(51) Int. Cl.
  *H02M 1/08*     (2006.01)
  *H02M 3/335*    (2006.01)
  (Continued)

(52) U.S. Cl.
  CPC ......... *H02M 3/33576* (2013.01); *H02M 1/08* (2013.01); *H03K 17/133* (2013.01); *H03K 17/691* (2013.01)

(58) Field of Classification Search
  CPC ...... H03K 17/13; H03K 17/56; H03K 17/296; H03K 17/166; H03K 17/133;
  (Continued)

(56) References Cited

U.S. PATENT DOCUMENTS 5,822,199 A     10/1998  Jacobs et al.
2001/0044640 A1 *  11/2001  Akiyama ............. H03K 17/691
                                                         607/2

(Continued)

FOREIGN PATENT DOCUMENTS

EP    1143619 A2    10/2001
EP    2725693 A1     4/2014
(Continued)

OTHER PUBLICATIONS

Mar. 16, 2020—EP Search Report—EP 20152171.3.

*Primary Examiner* — Kyle J Moody
*Assistant Examiner* — Jye-June Lee
(74) *Attorney, Agent, or Firm* — Banner & Witcoff, Ltd.

(57) ABSTRACT

A fully isolated drive circuit to be used for regulating an output voltage across a load. The isolated drive circuit may charge, discharge, or preserve the load charge using a controller that controls one or more switches. The controller may operate a switch according to an internal/external clock or an external control signal received by the controller. The isolated drive circuit may be an effective solution to simplify the drive design and decrease the amount of energy dissipated by the drive, especially when the load, associated with the drive, requires a high input voltage level.

20 Claims, 27 Drawing Sheets

(51) Int. Cl.
  *H03K 17/691* (2006.01)
  *H03K 17/13* (2006.01)
(58) Field of Classification Search
  CPC .... H03K 17/689; H03K 17/691; H03K 17/74;
    H02M 3/33576; H02M 3/33561; H02M
    3/33538; H02M 1/00; H02M 1/08; H02M
    2001/0006; H02M 2001/0048; H02M
    2001/0058; Y02B 70/10
  See application file for complete search history.

(56) References Cited

U.S. PATENT DOCUMENTS

| | | | |
|---|---|---|---|
| 2006/0170042 A1 | 8/2006 | Yang et al. | |
| 2012/0206171 A1* | 8/2012 | Kimura | H03K 17/691 |
| | | | 327/109 |
| 2014/0203666 A1* | 7/2014 | Liu | H03K 17/691 |
| | | | 307/140 |
| 2018/0219546 A1* | 8/2018 | Yang | H03K 17/168 |

FOREIGN PATENT DOCUMENTS

| | | | |
|---|---|---|---|
| FR | 3057722 A1 | | 4/2018 |
| JP | 2004194450 A | * | 10/2004 |
| WO | 2016159948 A1 | | 10/2016 |

* cited by examiner

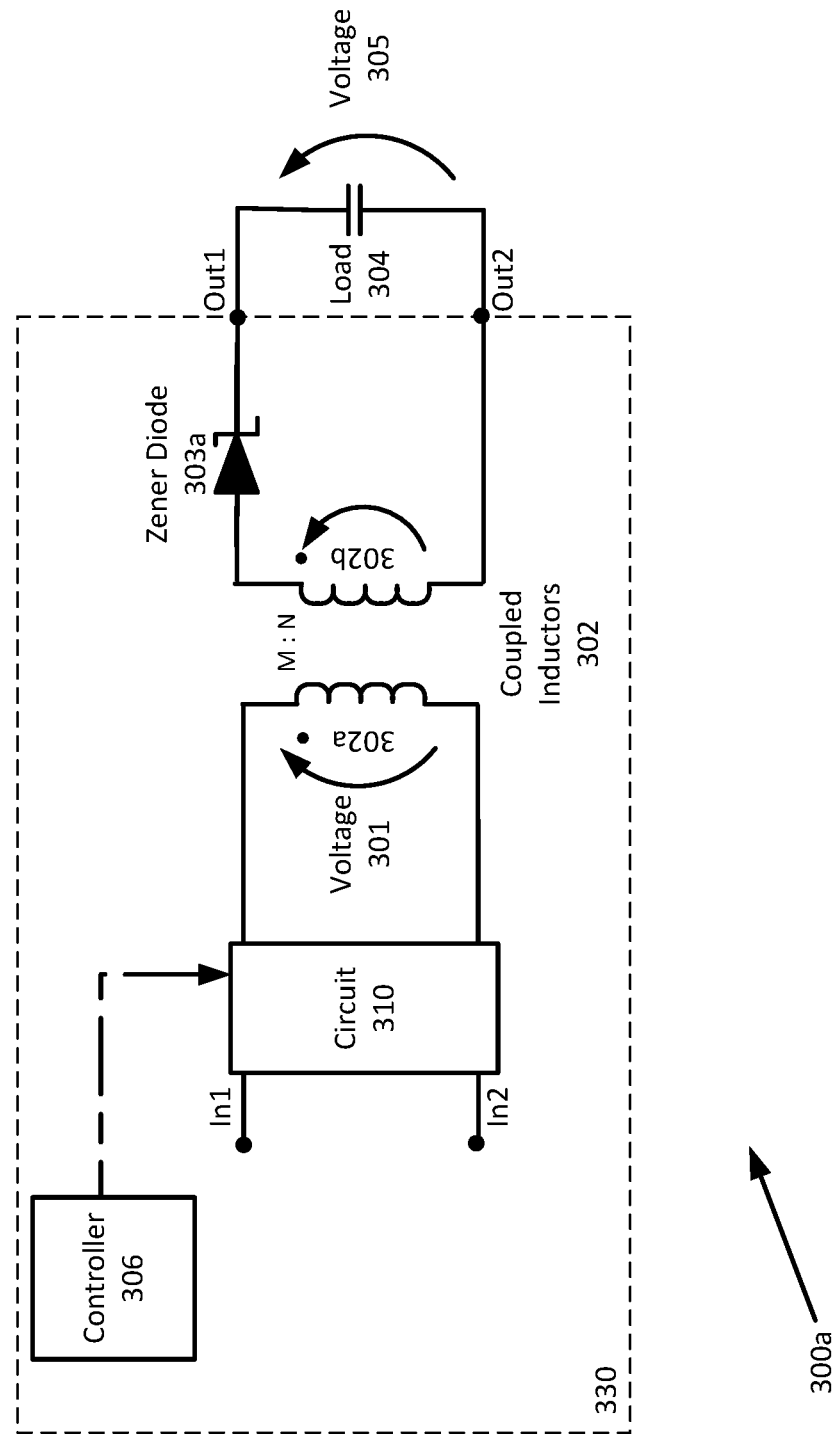

DRIVE CIRCUIT FOR REGULATING VOLTAGE AND REDUCING ENERGY CONSUMED

CROSS-REFERENCE TO RELATED APPLICATIONS

This application is a non-provisional of and claims priority to U.S. Provisional Patent Application No. 62/793,656, filed Jan. 17, 2019, and U.S. Provisional Patent Application No. 62/865,467, filed Jun. 24, 2019, each of which is hereby incorporated by reference in its entirety.

BACKGROUND

In some electrical applications, an electronic component (e.g., a drive or other electronic circuit) may control an electrical device such as a high power transistor, liquid crystal display (LCD), etc. Control of such a device is sometimes performed by regulating an input voltage level to the device or a current flowing through the device. In some instances, the input voltage level for driving the electrical device may be high relative to the ground such as, for example, a voltage greater than 80-100V in some applications. In such instances, the drive may consume a substantial amount of energy to regulate such a relatively high input voltage of the electronic device. For instance, in a conventional driver, the consumed energy in each cycle to charge and discharge the load is approximately proportional to $E_{cycle}=CV_{CC}^2$ ($E_{charge}=\frac{1}{2}CV_{CC}^2$ due to charging a load and $E_{discharge}=\frac{1}{2}CV_{CC}^2$ due to discharging a load), where C represents the load capacitance and $V_{CC}$ is the driving voltage or the input voltage level to drive the load. This means that, as the input voltage level to drive the load increases, the consumed energy also increases but at a higher rate than the input voltage level. In power electronics, there is an ever-present need to reduce power consumption. Thus, there is a need to regulate input voltage across a load while consuming a low amount of energy.

SUMMARY

The following summary is a short summary of some of the inventive concepts for illustrative purposes only, and is not intended to limit or constrain the inventions and examples in the detailed description.

Aspects of the disclosure herein may employ systems (or parts thereof) and methods for improving the efficiency of drives to reduce energy consumed in regulating input voltage of a capacitive load such as a metal-oxide-semiconductor field-effect transistor (MOSFET), a capacitive impedance of a communication system (e.g., loop signaling, transmitter), etc. For example, a drive may regulate the input voltage of the load in accordance with an enable signal, e.g., an internal or external clock, or an external signal (due to a voltage or a current measurement).

The drive may reduce energy consumed in regulating the load's input voltage by reusing the energy consumed during regulation of the load's input voltage. For example, during regulation of the load's input voltage, the drive consumes energy provided by an input power supply. At least some of this energy may be stored (e.g., in the load or in the drive circuit) and returned to the input power supply to reuse the energy. By feeding back some of the energy originally transmitted to the drive, total power consumption of the voltage drive is reduced as the energy is not wasted. The drive may utilize some of the energy returned to the input power supply to continue regulation of the load's input voltage to provide improved power efficiency.

Aspects of the disclosure herein include an isolated drive for reusing energy. The drive may include an isolating inductive element comprising two or more inductors, windings or coils that are galvanically isolated and linked by electromagnetic induction (e.g., coupled inductors, transformer, flyback transformer, etc.), at least one switch, input terminals to be coupled with a controllable power supply (e.g., an electrical circuit or element which provides two or more voltage levels), output terminals to be coupled with a capacitive load, and an optional controller. The controllable power supply may be a controllable voltage supply or a controllable current supply. A controllable power supply (e.g., an inverter, a full bridge, a half bridge) may be coupled with the input terminals of the drive and apply voltage across a primary winding of the inductive element, in accordance with an enable signal (e.g., due to a voltage or a current measurement), which, in turn, induces a voltage in a secondary winding of the inductive element. The induced voltage in the secondary winding creates a current that may flow through a switch and the load coupled in series across the secondary winding of the inductive element. The switch may be coupled in series with the load, which may be any load having capacitive characteristics (e.g., a gate terminal of high power transistor, LCD, etc.).

Current and voltage (power) induced on the secondary winding of the inductive element may charge the load, discharge the load, and/or preserve the load charge similar or in about the same level, depending on the applied voltage and/or generated current (for example, based on a voltage mode control and/or current mode control) across the primary winding of the inductive element by the controllable power supply, and/or on the operation mode of the switch. The operational mode of the switch may be determined according to one or more electrical parameters of the drive in order to be turned on and enable current when the drive charges the load and/or discharges the load, and to be turned off when the drive preserves the load charge such that the load charge is held at or about a particular level (e.g., a level at time switch is turned off).

The switch may be coupled between a secondary winding of an inductive element and a load having capacitive characteristics. In some cases, rather than using a switch, alternative electronic circuits or electronic elements that are functionally similar (or the same) as the switch may be used. The alternative electronic circuits or electronic elements may enable the charge of the load, discharge of the load, and/or the preservation of about the same charge level across the load, depending on an applied voltage in a primary winding of the inductive element and/or a corresponding induced voltage in the secondary winding of the inductive element.

In aspects of the disclosure herein, a free-wheeling diode may be coupled in parallel with a primary winding of an inductive element of a drive. A free-wheeling diode may be connected across an inductor and used to eliminate flyback. Configuring a drive to include a free-wheeling diode may provide additional improved power efficiency of the drive.

Aspects of the disclosure herein include methods for regulating an output voltage of a drive (e.g., an input voltage of a load) by applying voltage, via the controllable power supply, across the primary winding of the inductive element to achieve the desired functionality of the isolated drive circuit (e.g., charge, discharge, or preserve the load charge at a similar or same level). For instance, the regulation of the output voltage may depend on the operation mode of the controllable power supply, which may operate according to an enable signal received by the controllable power supply.

Some aspects of the disclosure may include methods for applying voltage across the primary winding of the inductive element by the controllable power supply to enable soft-switching (e.g., zero voltage switching, zero current switching) in a secondary winding of the inductive element and in the controllable power supply (e.g., a full-bridge circuit, a half bridge circuit).

Aspects of the disclosure herein may employ systems (or parts thereof) and methods for improving the dynamic performance and the efficiency of a drive circuit to reduce response time and energy consumed in monitoring/controlling/regulating input voltage of a load having a capacitance such as a metal-oxide-semiconductor field-effect transistor (MOSFET), a communication system (e.g., loop signaling, transmitter), etc. For example, a drive may monitor/control/regulate the input voltage of the load in accordance with one or more enable signals, e.g., an internal or external clock (e.g., pulse-width modulation (PWM)), or an external signal (e.g., due to a voltage or a current measurement), received by a controller. The drive may monitor/control/regulate the load's input voltage to DC voltage levels by using the controller.

The drive may reduce energy consumed in regulating the load's input voltage by reusing the energy consumed during regulation of the load's input voltage. For example, during regulation of the load's input voltage, the drive may consume energy provided by an input power supply. At least some of this energy may be stored (e.g., in the load or in the drive circuit) and returned to the input power supply to reuse the energy. By feeding back some of the energy originally transmitted to the drive, total power consumption of the voltage drive is reduced as the energy is not wasted. The drive may utilize some of the energy returned to the input power supply to continue regulation of the load's input voltage to provide improved power efficiency.

Aspects of the disclosure herein include a drive that may include an inductive element (e.g. an inductor, coupled inductors including a first inductor and a second inductor, flyback transformer, transformer, etc.), a switching circuit including at least one switch, input terminals to be coupled to a power supply, output terminals to be coupled to a load with capacitive features (e.g., a gate terminal of high power transistor, LCD, etc.), and one or more optional controllers.

The drive may use the resonant characteristics of the inductive element, the capacitive load and the switching circuit to use resonant drive techniques.

Aspects of the disclosure herein include methods for monitoring/controlling/regulating an output voltage of a drive (e.g., an input voltage of a load) by applying voltage, via the switching circuit, across the inductive element to achieve the desired functionality of the drive (e.g., charge, discharge, or preserve the load charge at a similar or same level). For instance, the regulation of the output voltage may depend on the operation mode of the switching circuit, which may operate according to one or more enable and/or pre-charge signals.

The drive may include a synchronization circuit. The synchronization circuit may receive a first enable signal and, based on previous occurrences of the first enable signal, may estimate/predict an arrival time (e.g., a change in the first enable signal, such as a rise and/or a fall of the enable signal) of a subsequent first enable signal (e.g., to be received after the first enable signal). Based on the estimated/predicted characteristic (e.g., estimated arrival time) of the subsequent first enable signal, the synchronization circuit may generate a second enable signal, e.g., a pre-charge signal. The estimating/predicting may include a detection of a frequency or a phase of previous occurrences of the first enable signal.

In some aspects, the pre-charge signal may precede an arrival of a subsequent enable signal. In such cases, by virtue of the pre-charge signal generated by the synchronization circuit, the drive may implement steps aimed to speed up the transient period of controlling the load's input voltage, thereby reducing the response time and improving the dynamic performance.

In some aspects, the controller and/or synchronization circuit may receive one or more estimations and/or determinations (e.g., measurements collected by sensors) and/or data, of one or more electrical parameters of the drive circuit.

The configurations/states of the drive circuit according to some aspects of the disclosure may demonstrate a wide-dynamic range of features and provide a flexible and adaptable control system for the drive to meet different requirements, and/or specifications, and/or design considerations.

In some aspects, the controller/drive circuit may prioritize timing considerations while implementing steps to control/monitor the load's input voltage, while in some aspects the controller/drive may prioritize efficiency considerations over timing considerations. For example, the drive may support a scenario where the first enable signal is not having periodic features and/or a scenario where synchronization circuit might not estimate/predict successfully an arrival time of the first enable signal.

In some aspects, the drive circuit may monitor/control/regulate input voltage of two or more capacitive loads (e.g., MOSFET's gate terminal). Driving two capacitive loads by a common drive may reduce the total energy consumed in monitoring/controlling/regulating the loads' input voltage by reusing the energy consumed during regulation of a first load to charge the second load, and may reduce the size and the costs of the system, by sharing and using common components (e.g., inductor).

In some examples, the load may be a MOSFET whose operation mode is controlled by the voltage difference between the source and gate terminals.

Some aspects of the disclosure may include methods for reducing voltage across a switch(es) prior to switching on, by the drive circuit, to enable soft switching (e.g., zero voltage switching, zero current switching) of the switch(es) of the switching circuit (e.g., a full-bridge circuit, a half bridge circuit).

In illustrative aspects of the disclosure herein, a free-wheeling diode may be coupled in parallel with an inductive element. A free-wheeling diode may be connected across an inductor and used to eliminate flyback. Flyback refers to the sudden voltage increases (e.g., spikes) across an inductive load if the supply current is suddenly reduced or interrupted, as may occur as a result of switching provided by the switch. The configuration of a free-wheeling diode in some illustrative aspects of the disclosure herein may provide additional improved power efficiency of a drive.

In some aspects, the drive circuit may be a single-inductor-multiple-output (SIMO) circuit. The drive may monitor/control/regulate input voltage of two or more capacitive loads (e.g., MOSFET's gate terminal) having capacitive elements by a single inductor.

In some aspects, the drive circuit may include an isolating inductive element (e.g., coupled inductors, a transformer) including two or more windings.

In such case, the drive circuit may drive/monitor a load with a single input voltage (e.g., power supply), thereby reducing power consumption of the drive and the size and costs of the system.

As noted above, this Summary is merely a summary of some of the features described herein and is provided to introduce a selection of concepts in a simplified form that are further described below in the Detailed Description. The Summary is not exhaustive, is not intended to identify key features or essential features of the claimed subject matter, and is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

FIG. 3 illustrates a diagram of an electrical circuit according to aspects of the disclosure.

DETAILED DESCRIPTION

Figure 1A:
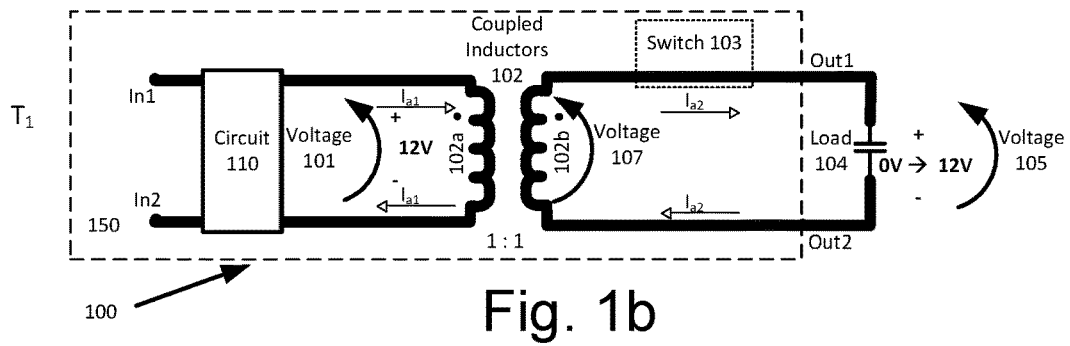
FIG. 1a illustrates a diagram of an electrical circuit according to aspects of the disclosure.

In the following description of various aspects of the disclosure, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

It is noted that the teachings of the presently disclosed subject matter are not bound by the examples described with reference to the figures. Equivalent and/or modified functionality can be consolidated or divided in another manner and can be implemented in any appropriate combination.

The terms, "substantially", and, "about", used herein include variations that are equivalent for an intended purpose or function (e.g., within a permissible variation range). Certain ranges are presented herein with numerical values being preceded by the terms "substantially" and "about". The terms "substantially" and "about" are used herein to provide literal support for the exact number that it precedes, as well as a number that is near to or approximately the number that the term precedes. In determining whether a number is near to or approximately a specifically recited number, the near or approximating unrequited number may be a number, which, in the context in which it is presented, provides the substantial equivalent of the specifically recited number.

All values are examples, and are not meant to be taken as limiting. Also, all given values include values that are substantially equal to the given values. For example, a given value of 12V can include any value that would be operationally equivalent, e.g., about 12V, 11.9V, 12.1V, etc.

There is an ever-present need to reduce power consumption in power circuits such as a voltage drive, which regulates voltage input of a load (e.g., a gate terminal of a MOSFET, an LCD, and the like). A fully isolated drive may be an effective solution to decrease the amount of energy dissipated by the drive. The effectiveness of the drive to decrease the amount of dissipated energy may be even more significant in embodiments where the capacitive load, coupled with the drive, uses a high input voltage level (e.g., high-side transistor). In such instances, the fully isolated drive may include an isolating inductive element (e.g., coupled inductors, a transformer) whose primary winding voltage level is relatively low as compared to the high input voltage of the load. The inductive element, by virtue of its isolating and voltage inducing characteristics, may use a relatively low voltage in a circuit connected to the primary winding of the inductive element (e.g., input power supply voltage) to induce a relatively high voltage level across the secondary side of the inductive element that is coupled with a floating circuit (e.g., which is not referenced to ground), thereby driving a load with a relatively high input voltage and reducing power consumption of the drive.

Aspects provided herein illustrate a fully isolated drive (e.g., a resonant gate drive circuit) that may consume a low amount of energy when regulating a high input voltage of a load, in comparison to other drives that use power from an additional floating power supply (e.g., a bootstrap circuit) coupled with a floating circuit of the drive (e.g., the secondary winding circuit that is not referenced to earth/ground). In some instances, the additional floating power supply may operate at a high-frequency (e.g., kHz, MHz, GHz). As a result of using an additional power supply that operates at high frequencies in the floating circuits of other drives, the other drives may consume a substantial amount of energy. Thus, additional power consumption may be eliminated if the additional power supply is removed.

Additional power consumption is avoided according to various aspects of a fully isolated drive disclosed herein that provide a stable voltage in the floating circuit of the drive, thereby generating an internal power supply. For example, the fully isolated drive may activate a controller by providing an appropriate stable voltage to the power input of the controller.

Reference is now made to FIGS. 1a-1d, which illustrate diagrams of an electrical circuit (an isolated resonant gate drive circuit) according to aspects of the disclosure herein. FIGS. 1a-1d illustrate possible states of the isolated drive circuit control according to one or more electrical parameters of circuit 100 (e.g., applied voltage 101, output voltage 105) in accordance with embodiments herein. Circuit 100 includes coupled inductors 102 comprising primary winding 102a and secondary winding 102b, switch 103, load 104, circuit 110, a controller (not depicted in FIGS. 1a-1d), input terminals In1 and In2 and output terminals Out1 and Out2. The coupled inductors 102, switch 103, circuit 110 and controller may be collectively referred to as a drive 150 (e.g., a fully isolated drive circuit) and configured to reduce power consumption in regulating voltage 105 across load 104. Drive 150 may regulate voltage 105 across load 104 to two voltage levels, V1 (e.g., 12V, 5V, 3.3V) and V2 (e.g., 0V). The drive may include input terminals In1 and In2 coupled with circuit 110 that may include a controllable power supply (e.g., a controllable voltage supply or a controllable current supply). The input terminals In1 and In2 may receive a direct current (DC) or alternating current (AC) for controlling load 104. Circuit 110 (e.g. the controllable power supply) may also be coupled to primary winding 102a of the coupled inductors 102. Circuit 110 (e.g. DC-DC converter, AC-DC converter) may provide a voltage 101 to the primary winding 102a of the coupled inductors 102. The drive may include output terminals Out1 and Out2 configured to be coupled with the load 104 such that switch 103 and load 104 are connected in series across (optionally through additional circuit elements, such as a series resistor, a switch, an inductor, etc.) the terminals of secondary winding 102b of coupled inductors 102 to form a closed loop.

In some aspects of the disclosure herein, a ratio M:N (e.g., M and N are real numbers) between the winding turns of primary winding 102a (M) and the winding turns of secondary winding 102b (N) may change correspondingly to design changes of coupled inductors 102 that one skilled in the art can make, thereby changing the transformer or coupled inductors voltage ratio, which is directly proportional to the winding turns ratio (e.g., M:N). When voltage 101 is at varying voltage level V (e.g., V1, V2, V3, etc.), a voltage that is proportional to V (e.g., N/M·V) is induced on secondary winding 102b. For example, in FIGS. 1a-1d the winding turns ratio may be 1:1 (M, N=1).

In operation, circuit 110 may supply a voltage 101 across primary winding 102a. Voltage 101 may be a time varying voltage that varies periodically between multiple direct current (DC) voltage levels. For example, voltage 101 may vary between three voltage levels: V1, V2 and V3. V1 may be a positive voltage (e.g., +12V), V2 may be a null voltage (e.g., 0V, 0.1V, −0.1V, etc. which may be due to a short circuit or near-short circuit across primary winding 102a), and V3 may be a negative voltage (e.g., −12V) having a polarity opposite to V1.

The duration of each voltage level may be controlled by circuit 110 or a controller. The duration of each voltage level during each period may be controlled in accordance with an enable signal (e.g., a pulse-width modulated signal). The control may be based on a voltage mode control and/or a current mode control. For example, the enable signal may be generated by circuit 100 (e.g., a controller of the circuit 100, a quartz crystal in the controller, circuit 110) according to a clock, an external control signal (for example, a signal generated based on a measurement of an electrical parameter in a circuit comprising the transistor, which its gate capacitance is controlled by drive 150), or a determination or estimation of one or more electrical parameters of drive 150 (e.g., current flow through coupled inductors 102, voltage 105 across load 104). For example, circuit 110 may apply voltage 101 across primary winding 102a, according to a determination or an estimation of the peak current flowing through primary winding 102a. The peak current may be calculated/estimated such that the energy stored in the magnetic field of inductor (e.g., $E_L = \frac{1}{2}LI^2$ where L represents the inductance of primary winding 102a) may be equal to the energy required to charge load 104 to a voltage level V (e.g., $E_C = \frac{1}{2}CV^2$ where C represents the load capacitance). In some cases, the duration of a particular voltage level may remain constant for each interval of the particular voltage level. In other cases, the duration of a particular voltage level may change over time for each interval of the particular voltage level.

In some aspects, drive 150 may include a synchronization circuit. The synchronization circuit may receive a first enable signal and, based on previous occurrences of the first enable signal, may estimate/predict an arrival time (e.g., a change in the first enable signal, such as a rise and/or a fall of the enable signal) of a subsequent first enable signal (e.g., to be received after the first enable signal). Based on the estimated/predicted characteristic (e.g., estimated arrival time) of the subsequent first enable signal, the synchronization circuit may generate a second enable signal, e.g., a pre-charge signal. The estimating/predicting may include a detection of a frequency or a phase of previous occurrences of the first enable signal.

In some aspects, circuit 110 may supply voltage 101 across primary winding 102a based on and/or using a closed loop control system that may monitor one of the measured/estimated/sensed parameters (for example, rise time sampling of voltage 105 across load 104, peak current flowing through couple inductors 102, etc.) that may be obtained by a sampling/sensing circuit [not shown].

Switch 103 may be responsible for connecting and disconnecting the load 104 to the secondary winding 102b of the coupled inductors 102 and, in combination with voltage or current from the secondary winding 102b, cause the load 104 to charge (e.g., transferring energy to the load), discharge (e.g., transferring energy from the load), or maintain a particular charge. Control of the switch 103 is directly or indirectly based on varying the input voltage level 101 (e.g., V1, V2 and V3) as explained in the following paragraphs. The control method of the switch 103 and the voltage level of the applied input voltage 101 may vary, for example according to the relative polarity of the windings of coupled inductors 102.

Circuit 110 (e.g. the controllable power supply) may be implemented as a switching circuit, a DC-DC converter (e.g. a full bridge circuit, a half bridge circuit), an AC-DC converter, etc.

Load 104 may have a capacitance, for example, an equivalent capacitance between source and gate terminals of a transistor (gate-source capacitance—$C_{gs}$), a capacitive impedance of a communication circuit (e.g., used for loop signaling), etc. The load 104 may have an input voltage 105. Drive 150 may use the resonant characteristics of coupled inductors 102, the capacitive characteristics of load 104, and switch 103 to use resonant drive techniques to discharge and charge load 104.

The capacitance of load 104 may vary during operation, according to different circumstances. For example, when the capacitance of load 104 represents a gate capacitance (e.g., of a transistor) comprising a capacitance between source and gate terminals of a transistor (gate-source capacitance—Cgs) and a capacitance between drain and gate terminals of a transistor (gate-drain capacitance—Cgd), the Miller effect may increase this capacitance in certain circuits, for example, in inverting voltage amplifiers.

FIG. 1a illustrates driving of voltage level V1 (e.g., 12V) across load 104 by drive 150. In an initial state, voltage 105 across load 104 may be 0V and voltage 101 across circuit 110 may be 0V. Responsive to an enable signal, circuit 110 may change voltage 101 to voltage level V1 (e.g., 12V). Based on increasing voltage 101 across primary winding 102a, a first current $I_{a1}$ may flow through primary winding 102a (e.g., the arrow in the figure indicates the direction of the first current $I_{a1}$) and a voltage that is proportional to V1 and the winding turns ratio (e.g., V1·N) may be induced across secondary winding 102b (e.g., 12V).

By virtue of the switching characteristics of switch 103, or the controller of circuit 100 or a feedback control circuit (for example, a circuit that may control switch 103 due to the voltage across secondary winding 102b) may close switch 103 which, in turn, causes a short-circuit and conduction (e.g., a current is passed) between secondary winding 102b and load 104. As a result and by virtue of the resonant characteristics, a second current $I_{a2}$ may flow from secondary winding 102b through switch 103 to charge load 104 (e.g., transfer energy to the load) until voltage 105 across load 104 reaches a voltage level that is about the same as the voltage level of voltage 101 (e.g., 12V). Second current $I_{a2}$ may decrease to zero when voltage 105 reaches a voltage level that is about 12V.

Figure 1B:
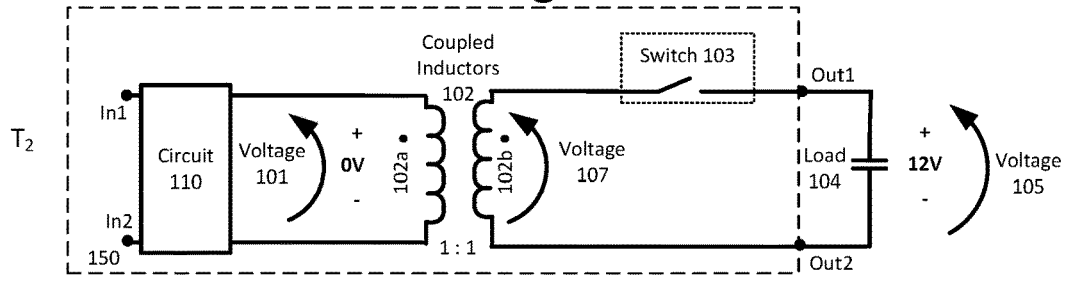
FIG. 1b illustrates a diagram of an electrical circuit according to aspects of the disclosure.

FIG. 1b illustrates the regulation (maintaining) of voltage level V1 (e.g., 12V) across load 104 by circuit 150. When voltage 105 across load 104 is 12V and voltage 101 changes to voltage level V2 (e.g., 0V, 0.1V or another voltage corresponding to a ripple voltage or a noise), the controller of circuit 100 or a feedback control circuit may open switch 103 (e.g., a current is restricted from passing through switch 103) which, in turn, causes an open circuit between load 104 and secondary winding 102b. As a result, no current may flow in the secondary winding 102b and, thus, voltage 105 across load 104 may remain at about the same as voltage level V1 (e.g., 12V). A free-wheeling current may flow in primary winding 102a.

Figure 1C:
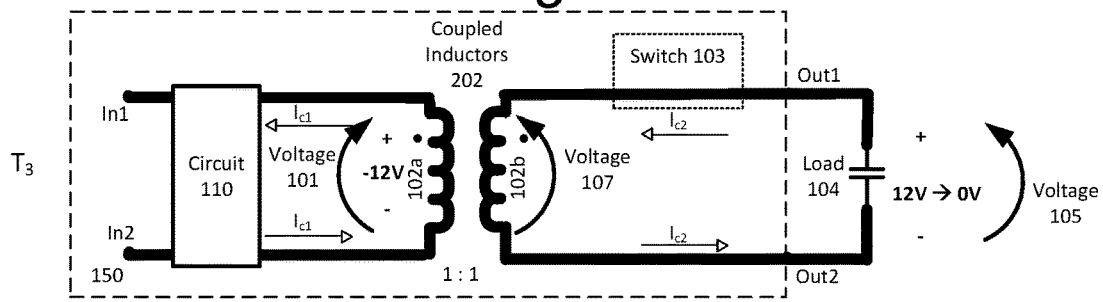
FIG. 1c illustrates a diagram of an electrical circuit according to aspects of the disclosure.

FIG. 1c illustrates discharging load 104 by drive 150, e.g., from voltage level 12V to 0V, following one of the steps described above. The drive 150 may, using circuit 110, discharge the load to substantially 0V (e.g. voltage level V2) responsive to a determination made by the controller or an occurrence of an enable signal. Following the above examples, when voltage 105 across load 104 is still at about 12V (as it is in FIG. 1b) circuit 110 changes voltage 101 to −12V (e.g., voltage level V3), a corresponding voltage 107 may be induced across secondary winding 102b. In response, switch 103 may be turned-on (due to the characteristics of switch 103, or because the controller may turn on switch 103) to provide conduction (e.g., a short circuit) between the secondary winding of the coupled inductors 102b and the load 104. Hence, by virtue of the resonant characteristics, a third current L2 may flow from load 104 towards secondary winding 102b (e.g., as indicated by the arrow in FIG. 1c) which, in turn, causes voltage 105 across load 104 to discharge until voltage 105 across load 104 reaches a voltage level that may be about voltage level V2 (e.g., 0V, 0.1 V, or another voltage corresponding to a ripple voltage or a noise). A fourth current $I_{c1}$ may flow through the primary winding 102a (e.g., as indicated by the arrow in FIG. 1c).

Figure 1D:
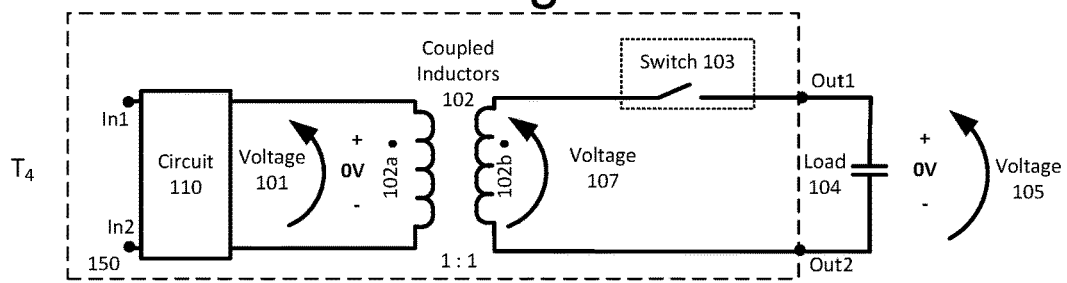
FIG. 1d illustrates a diagram of an electrical circuit according to aspects of the disclosure.

FIG. 1d illustrates the regulation (maintaining) of voltage level V2 (e.g., 0V) across load 104 by circuit 150. When voltage 105 across load 104 is 0V and voltage 101 changes to voltage level V2 (e.g., 0V), controller or a feedback control circuit may open switch 103 (e.g., a current is restricted from passing through switch 103) which, in turn, causes an open circuit between load 104 and secondary winding 102b. As a result, no current may flow in the secondary winding 102b and, thus, voltage 105 across load 104 may remain at about the same as voltage level V2 (e.g., 0V). A free-wheeling current may flow in primary winding 102a.

Figure 1E:
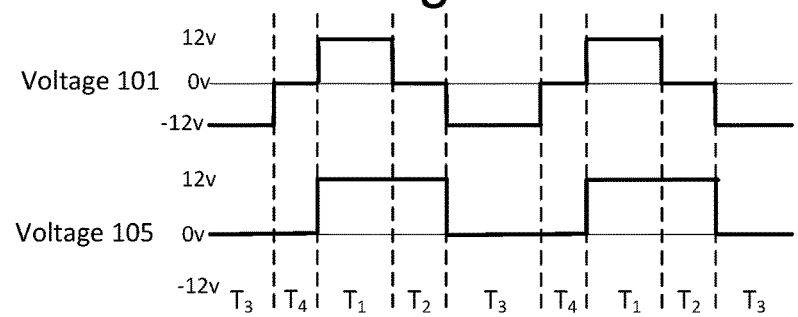
FIG. 1e illustrates a timing diagram of an electrical circuit according to aspects of the disclosure.

Reference is now made to FIG. 1e. FIG. 1e illustrates two timelines showing waveforms that describe change of voltage 105 (e.g., the voltage across load 104 in FIGS. 1a-1d), as a function of changing voltage 101 (e.g., the voltage that circuit 110 applies across primary winding 102a in FIGS. 1a-1d), according to implementations of the steps discussed above with respect to FIGS. 1a-1d.

Time intervals $T_1$, $T_2$, $T_3$, $T_4$ represent the duration of each voltage level of voltage 101 during each period, in accordance with the steps described above with respect to FIGS. 1a, 1b, 1c and 1d respectively. The duration of each voltage level during each period may be controlled in accordance with one or more enable signals (e.g., pulse width modulated signals).

The waveforms describe two cycles of charging and discharging voltage 105 by changing voltage 101. The waveforms depict the steady voltage level of voltages 101 and 105 throughout time intervals $T_1$-$T_4$ and the transitions between voltage levels as being immediate. However, it should be understood that the transitions might not be immediate and some of the currents shown in FIGS. 1a-1d may flow throughout the transitions.

In some cases, the duration of a particular voltage level may remain constant for each interval of the particular voltage level. In other cases, the duration of a particular voltage level may change over time for each interval of the particular voltage level. For example, $T_1$ may last 5 ms in a first cycle, while in the following cycle $T_1$ may last 2 ms.

Reference is now made to FIGS. 2a-2d, which illustrate diagrams of an electrical circuit (e.g., an isolated drive circuit) according to aspects of the disclosure herein. FIGS. 2a-2d illustrate possible states of the isolated drive circuit control according to one or more electrical parameters of circuit 200 (e.g., applied voltage 201, output voltage 205) in accordance with embodiments herein. Circuit 200 includes coupled inductors 202 comprising primary winding 202a and secondary winding 202b with a winding turns ratio 1:N (e.g., N=5), switch 203 (having different characteristics from switch 103 of FIGS. 1a-1d), load 204, circuit 210, controller (not depicted in FIGS. 2a-2d), input terminals In1-In2 and output terminals Out1-Out2. The coupled inductors 202, switch 203, circuit 210 and controller may be collectively referred to as a drive 250 (e.g., a fully isolated drive circuit) and configured to reduce power consumption in regulating load 204. Drive 250 may regulate voltage 205 across load 204 to voltage levels, V4 (e.g., 15V), V5 (e.g., 0V) and V6 (e.g., −15V). The drive may include input terminals In1 and In2 configured to be coupled with circuit 210 that may function as a controllable power supply. Circuit 210 (e.g. the controllable power supply) may also be coupled with primary winding 202a of the coupled inductors 202. Circuit 210 (e.g. DC-DC converter, AC-DC converter) may provide a voltage 201 to the primary winding 202a of the coupled inductors 202. The drive may include output terminals Out1 and Out2 configured to be coupled with the load 204 such that switch 203 is connected between load 204 and one of the terminals of secondary winding 202b of coupled inductors 202 (load 204 and switch 203 are connected in series across the terminals of secondary winding 202b of coupled inductors 202).

In operation, circuit 210 may supply a voltage 201 across primary winding 202a.

Voltage 201 may be a time varying voltage that varies periodically between multiple direct current (DC) voltage levels. For example, voltage 201 may vary between three voltage levels: V1, V2 and V3. V1 may be a positive voltage (e.g., +3V), V2 may be a null voltage (e.g., 0V, 0.1V, or another voltage, which may be produced by a short circuit or near-short circuit across primary winding 202a, including a voltage ripple or a noise), and V3 may be a negative voltage (e.g., −3V) having a polarity opposite to V1.

In some aspects, circuit 210 may supply voltage 201 across primary winding 202a based on and/or using a closed loop control system that may monitor one of the measured/estimated/sensed parameters (for example, rise time sampling of voltage 205 across load 204, peak current flowing through couple inductors 202, etc.) that may be obtained by a sampling/sensing circuit [not shown].

Figure 2A:
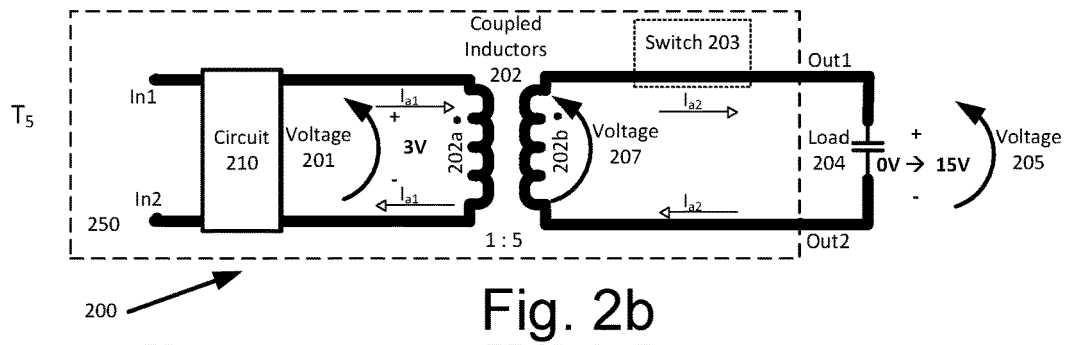
FIG. 2a illustrates a diagram of an electrical circuit according to aspects of the disclosure.

FIG. 2a, illustrates driving of voltage level V4 (e.g., 15V) across load 204 by drive 250. In an initial state, voltage 205 across load 204 may be 0V and voltage 201 across circuit 210 may be 0V. Responsive to an enable signal, circuit 210 changes voltage 201 to V1 (e.g., 3V). As a result of increasing voltage 201 across primary winding 202a, a first current $I_{a1}$ may flow through primary winding 202a (e.g., the arrow in the figure indicates the direction of the flowing current $I_{a1}$) and a voltage (e.g., V4) that is proportional to V1 current $I_{a1}$ and the winding turns ratio (e.g., V1·N where N=5) may be induced across secondary winding 202b (e.g., 15V), which is voltage 207.

A controller of circuit 200 or a feedback control circuit may close switch 203 which, in turn, causes a short-circuit and conduction (e.g., a current is passed) between secondary winding 202b and load 204. As a result and by virtue of the resonant characteristics, a second current $I_{a2}$ may flow from secondary winding 202b through switch 203 to charge load 204 (e.g., transfer energy to the load) until voltage 205 across load 204 reaches a voltage level that is about the same as the voltage level of voltage 207 (e.g., 15V).

Figure 2B:
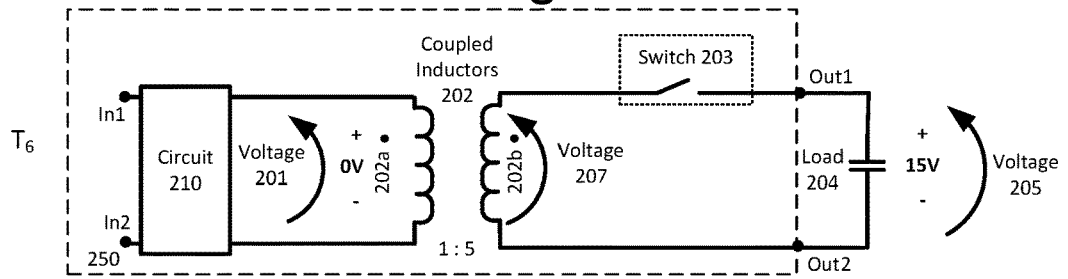
FIG. 2b illustrates a diagram of an electrical circuit according to aspects of the disclosure.

FIG. 2b illustrates the regulation (maintaining) of voltage level V4 (e.g., 15V) across load 204 by circuit 250. When voltage 205 across load 204 is 15V and voltage 201 changes to voltage level V2 (e.g., 0V), the controller of circuit 200 or a feedback control circuit may open switch 203 (e.g., a current is restricted from passing through switch 203) which, in turn, causes an open circuit between load 204 and secondary winding 202b. As a result, no current may flow in the secondary winding 202b and, thus, voltage 205 across load 204 may remain at about the same as voltage level V4 (e.g., 15V). A free-wheeling current may flow in primary winding 202a.

Figure 2C:
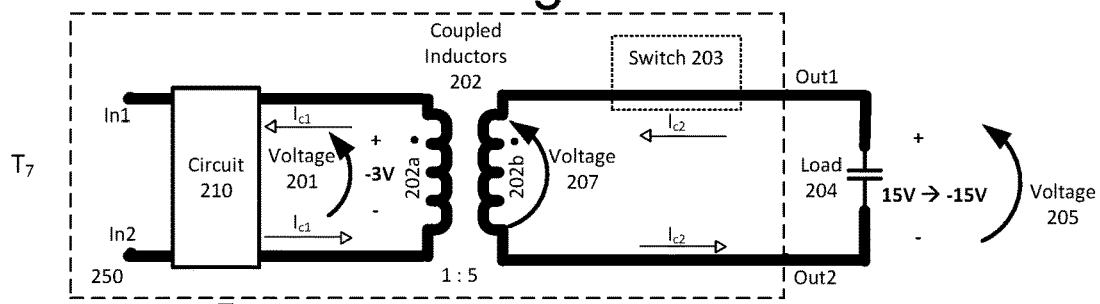
FIG. 2c illustrates a diagram of an electrical circuit according to aspects of the disclosure.

FIG. 2c illustrates discharging load 204 by drive 250, e.g., from voltage level 15V to voltage level −15V (e.g., V6), following one of the steps described above. The drive 250 may, using circuit 210, discharge the load to −15V responsive to a determination made by the controller or an occurrence of an enable signal. Following the above examples, when voltage 205 across load 204 is still at about 15V (as it is in FIG. 1b) circuit 210 changes voltage 201 to −3V (e.g., voltage level V3), a corresponding voltage that is proportional to V3 and the winding turns ratio (e.g., V1·N where N=5) may be induced across secondary winding 202b (e.g., −15V). Based on the induced voltage, switch 203 may be turned-on (due to the characteristics of switch 103, or because the controller may turn on switch 203) to provide conduction between the secondary winding of the coupled inductors 202b and the load 204. Hence, a third current L2 may flow from load 204 towards secondary winding 202b (e.g., as indicated by the arrow in FIG. 2c) which, in turn, causes voltage 205 across load 204 to discharge (e.g., transferring energy from the load due to the resonant characteristics) until voltage 205 across load 204 reaches a voltage level that may be about voltage level V6 (e.g., −15V). A fourth current $I_{c1}$ may flow through the primary winding 202a (e.g., as indicated by the arrow in FIG. 2c).

Figure 2D:
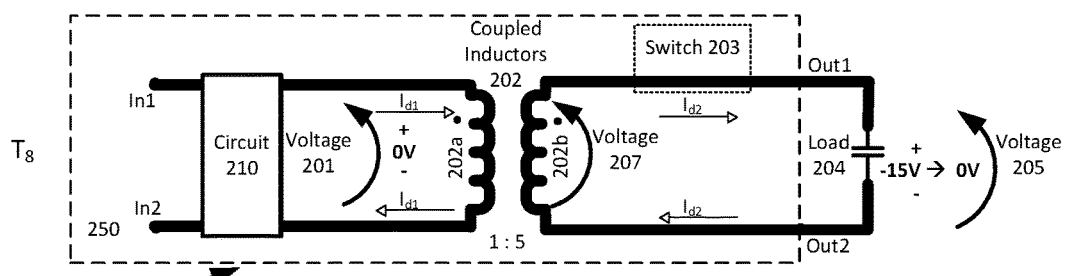
FIG. 2d illustrates a diagram of an electrical circuit according to aspects of the disclosure.

FIG. 2d illustrates charging load 204 by drive 250 from voltage level V6 (e.g., −15V) to voltage level V5 (e.g., 0V). When voltage 205 across load 204 is −15V and voltage 201 changes to voltage level V2 (e.g., 0V), switch 203 may be turned-on (due to the characteristics of switch 203, or because the controller or a feedback control circuit may turn on switch 203) to provide conduction between the secondary winding of the coupled inductors 202b and the load 204.

Hence, a fifth current $I_{d2}$ may flow from load 204 towards secondary winding 202b (e.g., as indicated by the arrow in FIG. 2d) which, in turn, causes voltage 205 across load 204 to increase until voltage 205 across load 204 reaches a voltage level that may be about voltage level V5 (e.g., 0V). A sixth current $I_{d1}$ may flow through the primary winding 202a (e.g., as indicated by the arrow in FIG. 2d).

An optional soft-switching (e.g., zero-voltage switching, zero-current switching, etc.) method (not shown in FIGS. 2a-2e) of the isolated drive circuit 250 to discharge load 204 by drive 250 from voltage level V4 (e.g., 15V) to voltage level V6 (e.g., −15V) may be implemented, following one of the steps described herein. For example, when isolated drive circuit 250 is in the state as illustrated in FIG. 2b, voltage 205 across load 204 is about the same as voltage level V4 (e.g., 15V) and the controller receives an enable signal to discharge load 204 to voltage level V6 (e.g., −15V). Isolated drive circuit 250 may change voltage 201 to voltage level V1 (e.g., 3V) by circuit 210, thereby applying voltage level V1 across the primary winding 202a of the coupled inductors 202. A corresponding voltage that is proportional to V1 and the winding turns ratio (e.g., V1·N where N=5) may be induced across secondary winding 202b (e.g., 15V). In response, a voltage difference between a first terminal of switch 203 (e.g., source terminal in case that switch 203 is a MOSFET) and a second terminal of switch 203 (e.g., drain terminal in case that switch 203 is a MOSFET) may be about the same as voltage level V2 (e.g., zero voltage). According to an estimation and/or determination that the voltage difference is about voltage level V2, circuit 210 may change voltage 201 to voltage level V3 (e.g., −3V), a corresponding voltage that is proportional to V3 and the winding turns ratio (e.g., V3·N where N=5) may be induced across secondary winding 202b (e.g., −15V). Based on the induced voltage, switch 203 may be turned-on (due to the characteristics of switch 103, or because the controller may turn on switch 203) to provide conduction between the secondary winding of the coupled inductors 202b and the load 204. Due to the resonant characteristics, a current may flow from load 204 towards secondary winding 202b which, in turn, causes voltage 205 across load 204 to decrease until voltage 205 across load 204 reaches a voltage level that may be about voltage level V6 (e.g., −15V).

Hence, in some aspects of the disclosure herein, the optional method may bring the voltage across switch 203, between a first terminal of switch 203 and a second terminal of switch 203 (e.g., drain-source voltage of a MOSFET used for switch 103) to zero or nearly zero prior to turning on switch 203, thereby reducing the switching losses of switch 203 due to zero-voltage switching (ZVS) method.

Figure 2E:
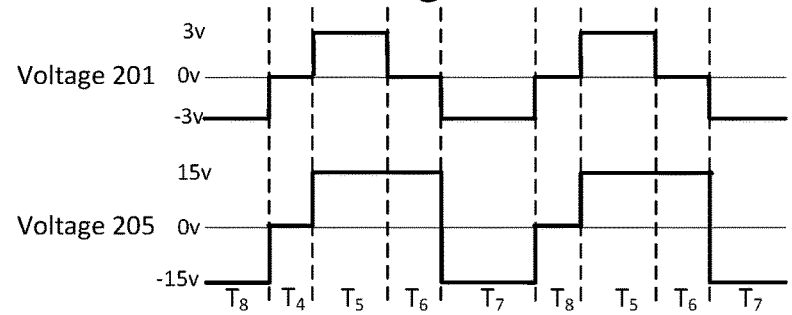
FIG. 2e illustrates a timing diagram of an electrical circuit according to aspects of the disclosure

Reference is now made to FIG. 2e. FIG. 2e illustrates two timelines showing waveforms that describe change of voltage 205 (e.g., the voltage across load 204 in FIGS. 2a-2d), as a function of changing voltage 201 (e.g., the voltage that circuit 210 applies across primary winding 202a in FIGS. 2a-2d), according to implementations of the steps discussed above with respect to FIGS. 2a-2d.

Time intervals $T_5$, $T_6$, $T_7$, $T_8$ represent the duration of each voltage level of voltage 201 during each period, in accordance with the steps described above with respect to FIGS. 2a, 2b, 2c and 2d respectively. The duration of each voltage level during each period may be controlled in accordance with one or more enable signals (e.g., pulse width modulated signals).

The waveforms describe two cycles of charging and discharging voltage 205 by changing voltage 201. The waveforms depict the steady voltage level of voltages 201 and 205 throughout time intervals $T_5$-$T_8$ and the transitions between voltage levels as being immediate. However, it should be understood that the transitions might not be immediate and some of the currents shown in FIGS. 2a-2d may flow throughout the transitions.

In some cases, the duration of a particular voltage level may remain constant for each interval of the particular voltage level. In other cases, the duration of a particular voltage level may change over time for each interval of the particular voltage level. For example, $T_5$ may last 5 ms in a first cycle, while in the following cycle $T_5$ may last 2 ms.

Reference is now made to FIG. 3, which illustrates a diagram of electrical circuit 300a, an example of circuit 100 of FIGS. 1a-1e, according to aspects of the disclosure. As shown in FIG. 3, in some aspects, switch 103 of FIG. 1 is a Zener diode 303a.

Circuit 300a includes: coupled inductors 302 comprising primary winding 302a and secondary winding 302b with a winding turns ratio M:N (M is the number of turns in the primary winding 302a, N is the number of turns in the secondary winding), Zener diode 303a, circuit 310, controller 306, input terminals In1-In2, and output terminals Out1-Out2.

Coupled inductors 302, Zener diode 303a, circuit 310, and controller 306 may be collectively referred to as a drive 330 (e.g., a fully isolated drive circuit) and configured to reduce power consumption in regulating load 304.

The anode of Zener diode 303a may be coupled with secondary winding 302b and the cathode of Zener diode 303a may be coupled with load 304.

Circuit 310 (e.g. a controllable power supply) may apply voltage 301 across primary winding 302a according to aspects of the disclosure herein. For example, voltage 301 may be a time varying voltage that varies periodically between multiple direct current (DC) voltage levels, V1, V2 and V3 of FIGS. 1a-1e.

For example, during time interval $T_1$ of FIG. 1e, circuit 310 may change voltage 301 to voltage level V1 across primary winding 302a thereby inducing a magnetic field in the windings of coupled inductors 302. A corresponding voltage $$\frac{N}{M} \cdot V1$$

may be induced across secondary winding 302b, which, in turn, causes Zener diode 303a to become forward-biased. The corresponding voltage causes the secondary winding 302b to generate a current (due to the energy stored in the coupled inductors 302 and the relative low impedance of the secondary winding circuit compared with impedance of the primary winding circuit) that flows from the anode of diode 303a to the cathode of diode 303a and to the load 304, and decreases the induced magnetic field of coupled inductors 302. The power dissipated by the current flowing through diode 303a is negligible, since the diode resistance for the forward bias is insignificant. The load 304, based on the received current, causes its voltage 305 across load 304 to increase until voltage 305 reaches a voltage level that may be about the same as $$\frac{N}{M} \cdot V1.$$

Thus, load 304 may charge with almost no power dissipation.

Circuit 310 may use a first residual induced magnetic field of coupled inductors 302 (if left in the windings of coupled inductors 302 after transferring energy to load 304) to generate current flowing in the primary winding 302a. When the residual induced magnetic field of coupled inductors 302 reaches zero, circuit 310 may generate current (e.g., current $Ic_1$ of FIG. 1c) and induce a magnetic field having the opposite polarity.

During time interval $T_2$ of FIG. 1e, the drive 330 may, using circuit 310, maintain the first voltage (e.g., V1) across the load 304. Following the above example, when voltage 305 across load 304 is still about voltage level V1 and circuit 310 changes voltage 301 across the primary winding 302a to voltage level V2, a corresponding voltage may be induced across secondary winding 302b. The corresponding voltage may cause Zener diode 303a to change from being forward-biased to being reverse-biased. As a result of Zener diode 303 being reverse-biased, no current may flow through Zener diode 303a which, in turn, causes voltage 305 across load 304 to be maintained at about the same voltage level (e.g., V1).

During time interval $T_3$ of FIG. 1e, circuit 330 may, using circuit 310, discharge the load 304 to a second voltage V2 (e.g., a zero voltage). Following the above example, when voltage 305 across load 304 is still about voltage level V1, circuit 310 may induce an opposite polarity magnetic field to generate a second induced current across secondary winding 302b and may apply a corresponding voltage across Zener diode 303a. The corresponding voltage may decrease the voltage across secondary winding 302b to voltage level V3 (e.g. negative voltage with about the same absolute value as V1), a voltage level which is above Zener diode's 303a reverse breakdown voltage. Hence, Zener diode 303a may change from being reverse-biased to being in a breakdown mode. A current may then flow from the cathode to the anode of Zener diode 303a which, in turn, causes voltage 305 across load 304 to decrease until voltage 305 across load 304 reaches a voltage level that may be about the same as voltage level V2 (e.g., a zero voltage), which is the initial regulated voltage value of voltage 305.

Circuit 310 may use a second residual induced magnetic field of coupled inductors 302 (if left in the windings of coupled inductors 302) to generate current flowing in the primary winding 302a.

The power dissipated by the current flowing through diode 303a in a breakdown mode is approximately equal to the Zener voltage (the breakdown voltage of the diode) multiplied by the current flowing across it, $P_{discharge}=I*V_{Zenger}$. The current I is about the same absolute value of the charging current (voltages V1 and V3 applied across primary winding 302a are about the same absolute value, and thus generate currents with about the same level) and may be expressed as follows:

$$I = C\frac{\Delta V}{\Delta t} = CV_{CC}f.$$

Therefore, an approximation of the dissipated energy due to discharging of the load 304 may be expressed as follows: $E_{discharge}=CV_{CC}^2$. Thus, an approximation of the total dissipated energy in each cycle due to charging and discharging the load 304 may be expressed as follows: $E_{cycle}=E_{charge}+E_{discharge}=CV_{CC}^2$.

Electrical circuit 300a, an example of circuit 100 of FIG. 1, is a fully isolated drive which eliminates the need for an additional power supply that operates at high frequencies in the secondary (floating) winding circuit of circuit 330. Thus, additional power consumption is eliminated by not using an additional power supply. Therefore, circuit 330 may regulate input voltage 305 across load 304 while consuming a low amount of energy (though reuse of the energy is not implemented) and may still provide the features found in other isolated drivers that are powered by additional power supplies.

In this example, the properties of Zener diode 303a may provide appropriate switching characteristics (and is not controlled by a controller), such that the Zener diode 303a may be used as switch 103. Aspects disclosed herein include the aforementioned modifications, and other modifications that will be evident to one of ordinary skill in the art.

Figure 4:
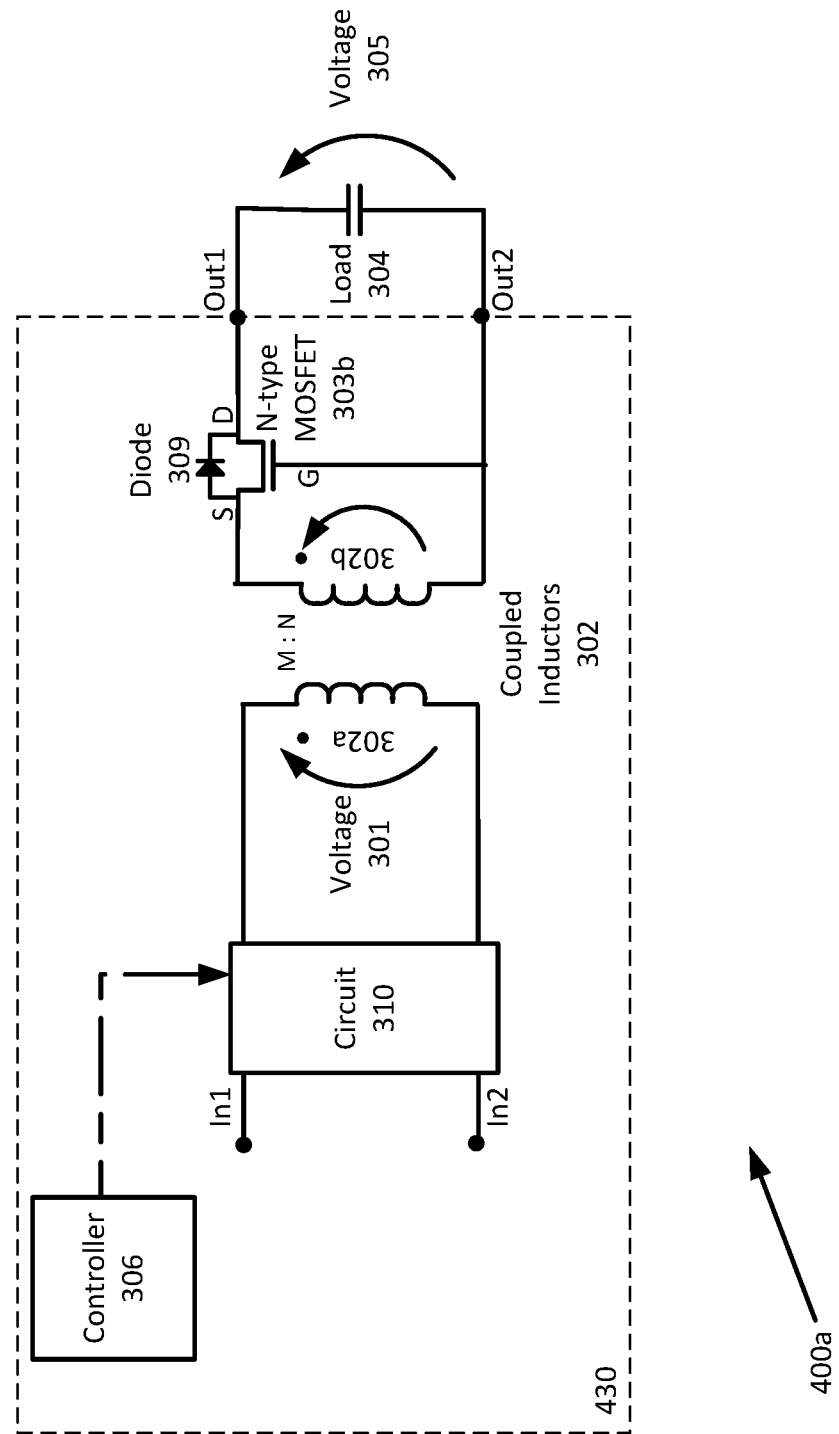
FIG. 4 illustrates a diagram of an electrical circuit according to aspects of the disclosure.

Reference is now made to FIG. 4, which illustrates a diagram of an electrical circuit 400a, an example of circuit 100 of FIGS. 1a-1e or circuit 200 of FIGS. 2a-2e, according to aspects of the disclosure. In some aspects, switch 103 of FIG. 1a-1d or switch 203 of FIGS. 2a-2d is a metal-oxide-semiconductor field-effect transistor (MOSFET) 303b. For example, MOSFET 303b may be an n-type enhancement metal-oxide-semiconductor field-effect transistor comprising drain, source and gate terminals (denoted D, S and G respectively).

In some aspects of the disclosure herein, the source may be coupled with a first terminal of secondary winding 302b, the drain may be coupled with load 304 and the gate may be coupled with a second terminal of secondary winding 302b. Diode 309 may be a parasitic diode of MOSFET 303b or an independent diode that is connected across MOSFET 303b with the anode coupled with secondary winding 302b and the cathode coupled with load 304. Other reference numbers of FIG. 4 are similar to the reference numbers of FIG. 3. In this instance, coupled inductors 302, circuit 310, MOSFET 303b and diode 309, may be referred to as drive 430. The drive 430 may also have input terminals configured to be coupled with circuit 310 (e.g. a controllable power supply) and output terminals Out1 and Out2 configured to be coupled with load 304.

Circuit 310 (e.g. a controllable power supply) may apply voltage 301 across primary winding 302a according to aspects of the disclosure herein. For example, voltage 301 may be a time varying voltage that varies periodically between multiple direct current (DC) voltage levels, V1, V2 and V3 of FIGS. 2a-2e.

For example, during time interval $T_5$ of FIG. 2e, the drive 430 may, using circuit 310 (e.g. the controllable power supply), charge the load 304 to a first voltage (e.g., voltage level V4). As an example, V2 (e.g., a zero voltage) may be assumed to be the initial voltage values of voltage 301 and voltage 305. Circuit 310 may apply voltage level V1 to circuit 430 such that voltage 301 across the primary winding 302a of the coupled inductors 302 is V1. As a result, a generated current may flow through coupled inductors 302 and may increase the induced magnetic field of coupled inductors 302. A corresponding voltage $$\frac{N}{M} \cdot V1$$

may be induced across secondary winding 302b, which, in turn, causes the voltage difference between the gate and source (gate-source voltage) of the MOSFET 303b to be about the same as voltage level $$\frac{N}{M} \cdot V1.$$

As a result of the gate-source voltage being about voltage level $$\frac{N}{M} \cdot V1,$$

MOSFET 303b may be turned-off (e.g., no conduction between drain and source), but diode 309 coupled in parallel with (or across) MOSFET 303b may be in forward mode. Hence, a first current may flow from secondary winding 302b (due to the energy stored in the coupled inductors and the relative low impedance of the secondary winding circuit compared with impedance of the primary winding circuit) towards load 304 through diode 309. In response, the induced magnetic field of coupled inductors 302 may decrease and voltage 305 across load 304 may increase until it reaches a voltage level that may be about the same as $$\frac{N}{M} \cdot V1.$$

The power dissipated by the first current flowing through diode 309 is negligible, since the diode resistance for the forward bias is insignificant. Hence, nearly no energy is dissipated due to charging load 304 by drive 430 ($E_{charge}$=0).

Circuit 310 may use a first residual induced magnetic field of coupled inductors 302 (if left in the windings of coupled inductors 302 after transferring energy to load 304) to generate current flowing in the primary winding 302a. When the residual induced magnetic field of coupled inductors 302 reaches zero, circuit 310 may generate current (e.g., current $I_{c_1}$ of FIG. 2c) and induce a magnetic field having the opposite polarity.

During time interval $T_6$ of FIG. 2e, the drive 430 may, using circuit 310, maintain the first voltage $$\left(e.g., \frac{N}{M} \cdot V1\right)$$

across the load 304. Following the above example, when voltage 305 across load 304 is still about the same as voltage level $$\frac{N}{M} \cdot V1$$

and circuit 310 changes the voltage 301 to voltage level V2, a corresponding voltage may be induced across secondary winding 302b. The voltage difference between the source and the gate may then become about V2 and, in response, MOSFET 303b may remain turned-off. Diode 309 may become reverse-biased and voltage 305 across load 304 may remain at about the same as voltage level V1.

During time interval $T_7$ of FIG. 2e, the drive 430 may, using circuit 310, discharge the load 304 to voltage level V6

$$\left(e.g., \text{ a negative voltage} - \frac{N}{M} \cdot V1\right).$$

Following the above example, when voltage 305 across load 304 is still at about the same as voltage level $$\frac{N}{M} \cdot V1,$$

circuit 310 may enable the induced opposite polarity magnetic field to generate a second induced current across secondary winding 302b and may change the voltage across secondary winding 302b correspondingly $$\left(-\frac{N}{M} \cdot V1\right).$$

The voltage difference between the source and the gate terminals may change according to the decrease of the voltage across secondary winding 302b. The voltage difference between the source and the gate terminals may reach the threshold voltage ($V_T$) of MOSFET 303b, and may be similar to voltage level V6. In response to the gate-source voltage reaching the threshold voltage ($V_T$), MOSFET 303b may be turned-on to provide conduction between the drain and source of MOSFET 303b. Hence, a second current may flow from load 304 towards secondary winding 302b which, in turn, causes voltage 305 across load 304 to decrease until voltage 305 across load 304 reaches a voltage level that may be about the same as voltage level V6 (since MOSFET 303b is still turned-on).

The current level of the second induced current may be dependent on voltage level V3. For example, in a case wherein the absolute values of V1 and V3 are approximately equal, the first and second induced currents may be approximately the same current level but in opposite directions. Circuit 310 may enable a second residual induced magnetic field (if left) of coupled inductors 302 to generate current flowing in the primary winding 302a.

The dissipated energy due to discharging load 304 by driver 430 is mainly corresponding to the switching losses of MOSFET 303b, since the drain-source on-state resistance ($R_{DS_{on}}$) of MOSFET 303b is insignificant, the conductance losses of MOSFET 303B are negligible. The dissipated energy due to switching on MOSFET 303b is $E_{switching-on} = E_{discharge} = \frac{1}{2} C_{sq} V_{DS}^2$, where $C_{eq}$ represents the equivalent capacitance (the load capacitance C is much more significant than the equivalent MOSFET's capacitance ($C >> C_{MOSFET}$) and therefore $C_{eq}$=C) and $V_{DS}$ is the drain-source voltage of MOSFET 303b prior to its switching on (e.g. $V_{DS}=V_{CC}$).

During time interval $T_8$ of FIG. 2e, the drive 430 may, using circuit 310, charge the load 304 to voltage level V2 (e.g., a zero voltage). Following the above example, when voltage 305 across load 304 may be about the same as voltage level V6, circuit 310 may change voltage 301 to voltage level V1. A corresponding voltage may be induced across secondary winding 302b that may apply a voltage level that opposes the built-in potential of diode 309. As a result, diode 309 may become forward-biased and a current may flow from the anode to the cathode of diode 309. Voltage 305 across load 304 may then increase until voltage 305 across load 304 reaches a voltage level that may be about the same as voltage level V2, which is the initial regulated voltage value of voltage 305.

In turn, the generated current flowing from the anode to the cathode of diode 309 may flow through secondary side 302b and may increase the induced magnetic field of coupled inductors 302. The induced magnetic field of coupled inductors 302 may generate a corresponding induced current across primary winding 302a. The current may flow back to circuit 310 (e.g. the controllable power supply) to reuse the redundant energy stored in coupled inductors 302.

Hence, the total dissipated energy in each cycle due to charging and discharging load 304 by drive 430 is approximately proportional to $E_{cycle}=E_{discharge}=\frac{1}{2}CV_{CC}^2$, due to power reuse of about 50% of the energy back to circuit 310 (e.g. the power controllable supply).

In this example, the properties of the voltage difference between the source and gate terminals ($V_{GS}$) of MOSFET 303b may provide appropriate switching characteristics, depending on the configuration of the gate terminal (e.g., where $V_{GS}$>0 turns on MOSFET 303b and enables current flowing across it, and $V_{GS}$<0 turns off MOSFET 303b). Aspects disclosed herein include the aforementioned modifications, and other modifications, which will be evident to one of ordinary skill in the art.

Figure 5:
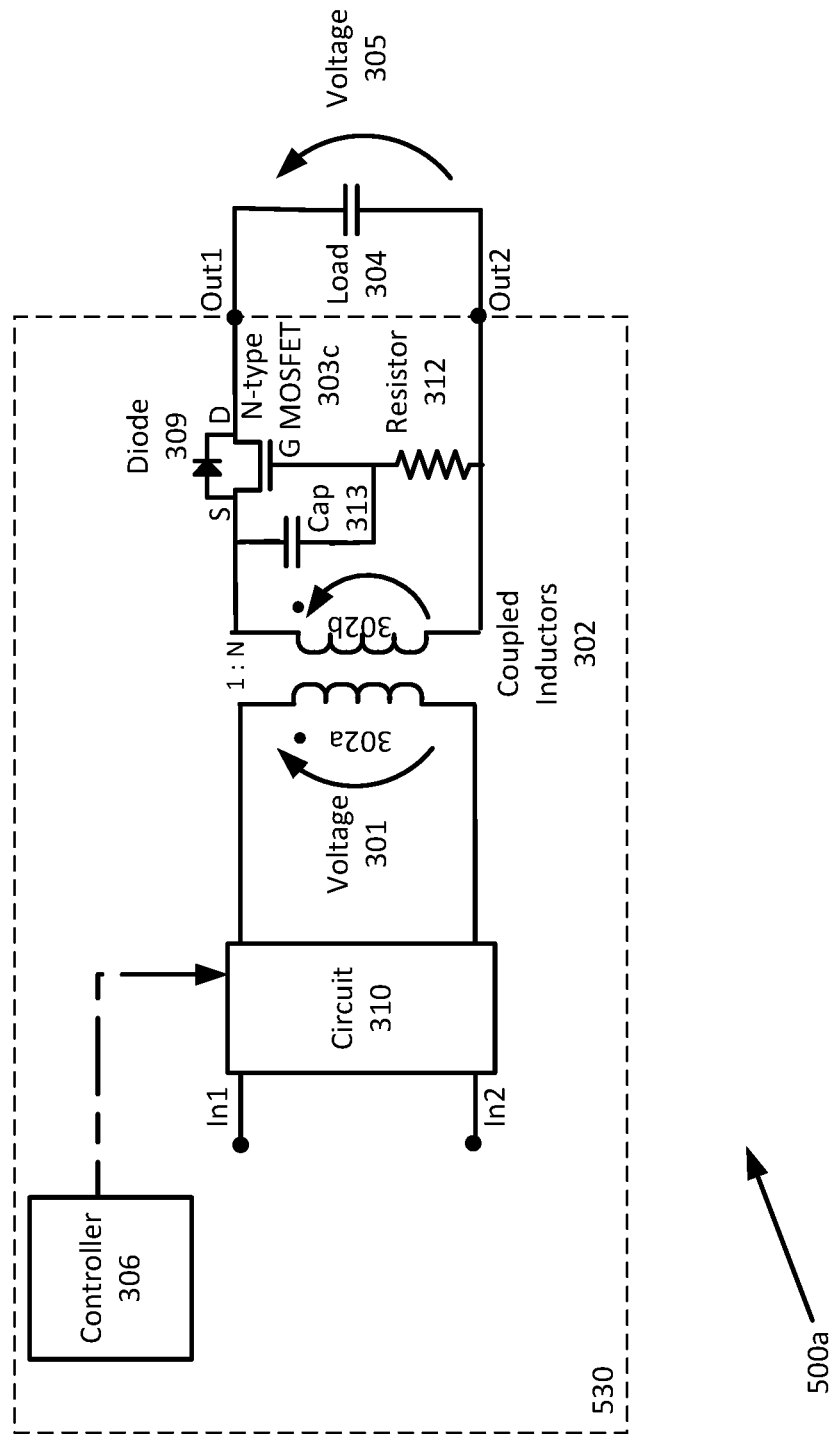
FIG. 5 illustrates a diagram of an electrical circuit according to aspects of the disclosure.

Reference is now made to FIG. 5, which illustrates a diagram of an electrical circuit 500a, an example of circuit 100 of FIGS. 1a-1e or circuit 200 of FIGS. 2a-2e, according to aspects of the disclosure. In some aspects, switch 103 of FIG. 1a-1d or switch 203 of FIGS. 2a-2d is a metal-oxide-semiconductor field-effect transistor (MOSFET) 303c. For example, MOSFET 303c may be an n-type enhancement metal-oxide-semiconductor field-effect transistor comprising drain, source, and gate terminals (denoted D, S and G respectively).

In some aspects of the disclosure herein, controller 306 of FIG. 5 may be a passive control circuit. In this example, controller 306 is a resistor-capacitor circuit (RC circuit) that controls the voltage difference between the source and gate terminals of MOSFET 303c. The source may be coupled with a first terminal of secondary winding 302b, the drain may be coupled with load 304, and the gate may be coupled with a second terminal of 302b through resistor 312 (or a resistive component including one or more resistors). Capacitor 313 is coupled between the source and the gate. Capacitor 313 may represent an effective capacitance between the source and gate terminals or may be a discrete capacitive component (e.g., one or more capacitors). Diode 309 is connected across MOSFET 303c with the anode coupled with secondary winding 302b and the cathode coupled with load 304.

Other reference numbers of FIG. 5 are similar to the reference numbers of FIG. 3. In this instance, coupled inductors 302, diode 309, circuit 310, MOSFET 303c, capacitor 313 and resistor 312 may be referred to as isolated drive circuit 530. Drive circuit 530 may also be configured to be coupled with circuit 310 (e.g., a controllable power supply) and output terminals Out1 and Out 2 configured to be coupled with load 304.

The operational mode of circuit 530 of FIG. 5 may be similar to the operational mode of circuit 430 of FIG. 4, as explained above. A difference between the operational mode of circuit 530 of FIG. 5 and the operational mode of circuit 430 may be in the time duration to close and open the MOSFETs (MOSFET 303c and MOSFET 303b respectively). The time duration to close or open MOSFET 303c may last longer due to the resistor-capacitor (RC) time constant that is equal to the product of the circuit resistance (in ohms) and the circuit capacitance (in farads). Thus, the time duration to close or open MOSFET 303c may vary due to the circuit components (e.g., Capacitor 313 and Resistor 312) and the properties of the voltage difference between the source and gate terminals ($V_{GS}$) of the MOSFET 303c may provide appropriate switching characteristics, depending on the configuration of the gate terminal (e.g., where $V_{GS}$>0 turns on MOSFET 303c and enables current flowing across it, and $V_{GS}$<0 turns off MOSFET 303b). Aspects disclosed herein include the aforementioned modifications, and other modifications, which will be evident to one of ordinary skill in the art.

Figure 6:
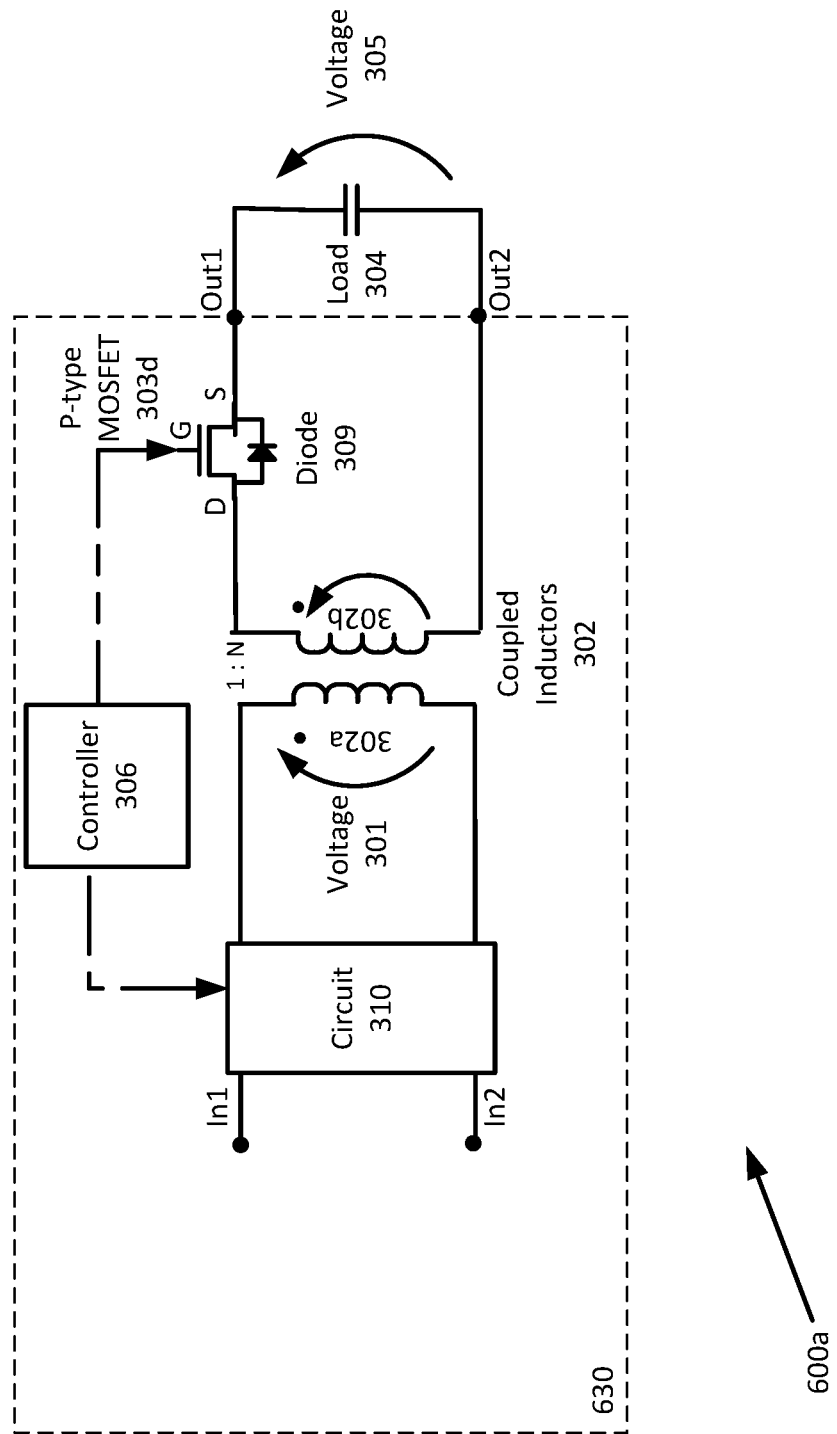
FIG. 6 illustrates a diagram of an electrical circuit according to aspects of the disclosure.

Reference is now made to FIG. 6, which illustrates a diagram of an electrical circuit 600a, an example of circuit 100 of FIGS. 1a-1e or circuit 200 of FIGS. 2a-2e, according to aspects of the disclosure. In some aspects, switch 103 of FIG. 1a-1d or switch 203 of FIGS. 2a-2d is a metal-oxide-semiconductor field-effect transistor (MOSFET) 303d. For example, MOSFET 303d may be a p-type enhancement metal-oxide-semiconductor field-effect transistor comprising drain, source and gate terminals (denoted D, S and G respectively).

In some aspects of the disclosure herein, controller 306 of FIG. 6 may be implemented as an independent circuit or component. The implementation may be digital (e.g. using a microprocessor), analog (e.g. using an integrator), or both (e.g., using a digital-analog converter). In this example, controller 306 is an independent circuit that controls the voltage difference between the source and gate terminals of MOSFET 303d. The drain may be coupled with a first terminal of secondary winding 302b, the source may be coupled with load 304 and the gate may be coupled with a signal driven by controller 306. Diode 309 is connected across MOSFET 303d with the anode coupled with secondary winding 302b and the cathode coupled with load 304.

In some aspects, MOSFET 303d may be an n-type enhancement metal-oxide-semiconductor field-effect transistor comprising drain, source and gate terminals (denoted D, S and G respectively). In these aspects, diode 309 may be connected across MOSFET 303d with the anode coupled with load 304 and the cathode coupled with secondary winding 302b.

In FIG. 6, coupled inductors 302, diode 309, circuit 310 and MOSFET 303d may be referred to as isolated drive circuit 630. The drive 630 may also have input terminals configured to be coupled with circuit 310 (e.g. a controllable power supply) and output terminals Out1 and Out2 configured to be coupled with load 304.

Other reference numbers of FIG. 6 are similar to the reference numbers of FIG. 3.

Circuit 310 (e.g. a controllable power supply) may apply voltage 301 across primary winding 302a according to aspects of the disclosure herein. For example, voltage 301 may be a time varying voltage that varies periodically between multiple direct current (DC) voltage levels, V1, V2 and V3 of FIGS. 2a-2e.

Some aspects of the disclosure herein may be implemented along with the optional method described in reference to FIGS. 2a-2e, to reduce switching-on losses of MOSFET 303d by employing zero-voltage switching (ZVS) for MOSFET 303d. As described above, zero-voltage switching (ZVS) is a soft-switching technique addressing the high turn-on losses of the voltage regulator/converter by eliminating high current body diode conduction prior to turning on the high side MOSFET, bringing the drain-source voltage of the high side MOSFET to zero or nearly zero and producing no high current spikes or damaging ringing.

For example, the optional method may bring the drain-source voltage of MOSFET 303d to zero, or nearly zero, prior to turning on the high side of MOSFET 303d. The optional method may be applied when circuit 630, using circuit 310, discharges the load 304 from voltage level V4 (of FIGS. 2a-2e) to a voltage level V6 (e.g., a negative voltage as explained in the FIG. 2a-2e) or to voltage level V5 (e.g., a zero voltage). The discharging of load 304 to the voltage level V5 is possible due to the fact that controller 306 may apply voltage or signal to turn off MOSFET 303d following a decrease of voltage 305 to about the same as voltage level V5. Following the above example, when voltage 305 across load 304 is still at about voltage level V4 and before circuit 310 changes voltage 301 to voltage level V3, circuit 300 may change voltage 301 across the primary winding 302a of the coupled inductors 302 to voltage level V1. A corresponding voltage may be induced across secondary winding 302b (e.g., the corresponding voltage may be V4, which is equal to V1·N where the winding turns ratio is 1:N). The voltage difference between the source and gate of the MOSFET 303d may be about the same as voltage level V2 (e.g. zero voltage).

Due to implementing the above-mentioned zero-voltage switching (ZVS) optional method prior to changing voltage 301 to voltage level V3, the dissipated energy due to switching on MOSFET 303d may tend to zero, since the drain-source voltage ($V_{DS}$) of MOSFET 303d prior to its switching on is about zero (e.g., $E_{Switching\text{-}on}$ ($V_{DS}$=0)=½$C_{eq}V_{DS}^2$=0). Hence, the total dissipated energy in each cycle due to charging and discharging load 304 by drive 630 when applying the zero-voltage switching (ZVS) optional method is approximately zero, meaning drive 630 may potentially reuse about 100% of the energy consumed in a cycle (assuming there are no parasitic effects). The implementation of the zero-voltage switching (ZVS) optional method will be discussed below with respect to FIG. 10b.

Figure 7:
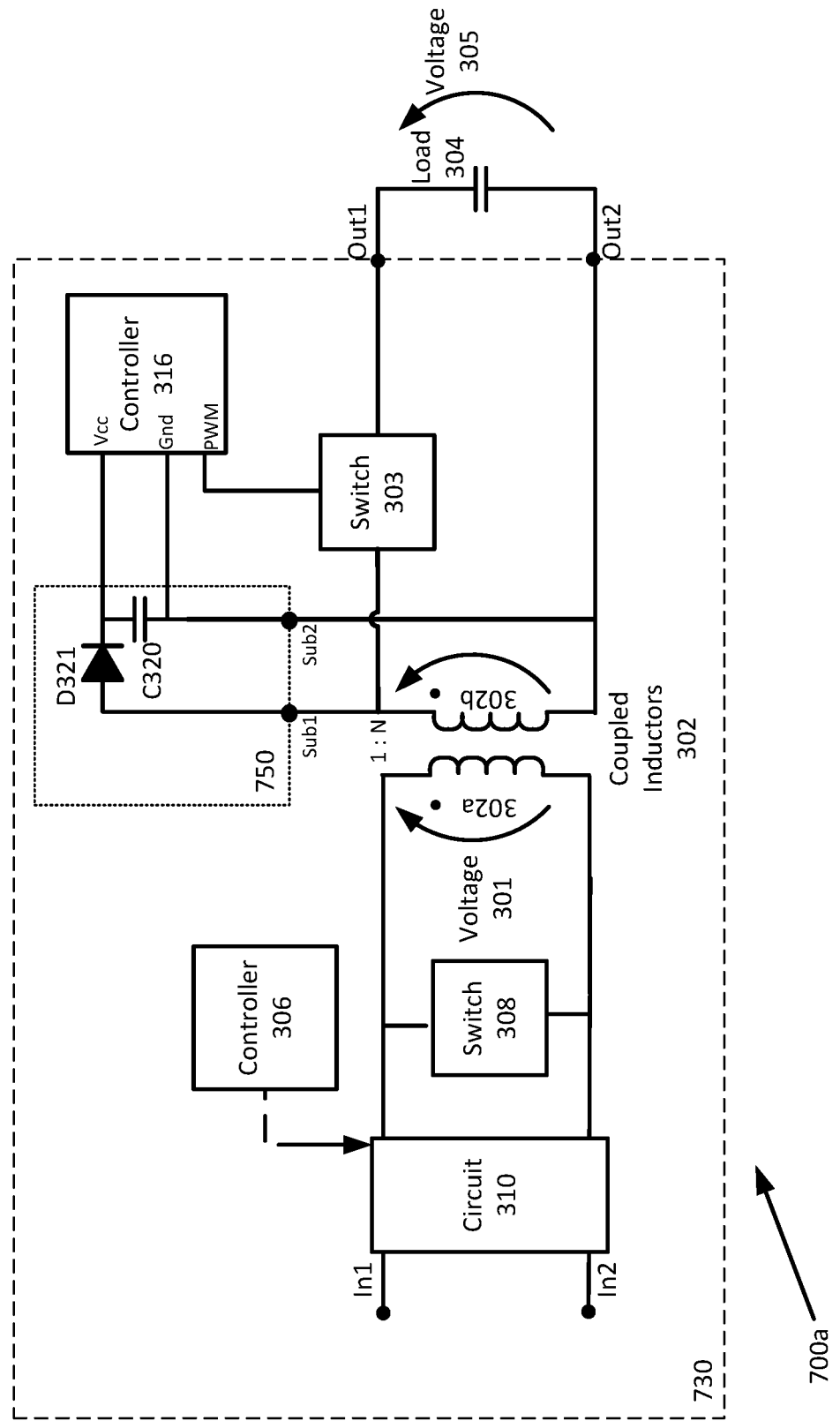
FIG. 7 illustrates a diagram of an electrical circuit according to aspects of the disclosure.

Reference is now made to FIG. 7, which illustrates a diagram of an electrical circuit 700a, an example of circuit 100 of FIGS. 1a-1e or circuit 200 of FIGS. 2. 2a-2e, according to aspects of the disclosure herein.

In some aspects of the disclosure herein, an optional switch 308 (e.g. a free-wheeling diode, a MOSFET, etc.) may be coupled in parallel with primary winding 302a. The switch connected across an inductor (i.e., primary winding 302a) is used to eliminate flyback. Flyback refers to sudden voltage increases (e.g., spikes) across an inductive load if the supply current is suddenly reduced or interrupted, as may occur as a result of switching. Switch 308 may be closed when voltage 301 is at voltage level V2, causing short-circuiting of primary winding 302a and enabling the residual energy in the windings of coupled inductors 302 to provide a current through switch 308, thereby potentially reducing loss in the system. Switch 308 may be characterized by low conduction losses (e.g., a MOSFET, a diode) in comparison to conduction losses of other switches in the drive circuit and a current flowing through switch 308 may achieve reduced power dissipation.

In some aspects of the disclosure herein, a first controller (e.g., controller 306 of FIG. 7) may control circuit 310 and a second controller (e.g., controller 316 of FIG. 7) may control switch 303. Each of the first and the second controllers may be implemented as an independent circuit or component and may be digital (e.g. use a microprocessor), analog (e.g. use an integrator), or both (e.g., use a digital-analog converter).

Controller 316 of FIG. 7 may be a controller comprising I/O pins: a pin for ground (GND), an pin for input power (Vcc), and an output pin that outputs a pulse-width (or pulse-duration) modulation signal (PWM). The output pin (e.g., PWM pin) may be short-circuited with the control of switch 303 (e.g., gate terminal of a MOSFET), thereby controlling the operational mode of switch 303. Subcircuit 750 may comprise capacitor C320, diode D321 and two input terminals Sub1 and Sub2. Capacitor C320 may be coupled across the GND and Vcc pins of controller 316. A first terminal of the capacitor C320 may be connected to the GND pin and may be coupled with a first terminal of secondary winding 302b. Diode D321 may be coupled between a second terminal of secondary winding 302b and a second terminal of the capacitor C320 that is connected to the Vcc pin. The anode of diode D321 may be connected to the second terminal of secondary winding 302b and the cathode of diode D321 may be connected to the Vcc pin.

Other reference numbers of FIG. 7 are similar to the reference numbers of FIG. 3. In this instance, coupled inductors 302, circuit 310, switch 303, capacitor C320, and diode D321 (e.g., subcircuit 750) may be referred to as isolated drive circuit 730. Drive circuit 730 may also have input terminals In1 and In2 and output terminals Out1 and Out2 coupled with load 304. Controllers 306 and 316 may be integrated in isolated drive circuit 730 or connected to isolated drive circuit 730 externally.

In some instances, the operational mode of circuit 730 of FIG. 7 may be similar to the operational mode of circuit 100 of FIGS. 1a-1e or circuit 200 of FIGS. 2a-2e, as explained above.

In some aspects of the disclosure herein, the fully isolated drive may provide a stable voltage in the floating circuit of the drive, thereby generating an internal power supply referenced to the floating circuit. The internal power supply may provide power for different applications.

For example, isolated drive circuit 730 may contain subcircuit 750 that regulates a stable voltage in the floating circuit of drive 730 across capacitor C320, thereby supplying an appropriate input DC voltage (e.g., +12V) to the Vcc pin of controller 316. Subcircuit 750 may comprise capacitive component C320 (e.g., one or more capacitors), a diode (e.g., D321) or a switch (e.g., a MOSFET) and two terminals Sub1 and Sub2. Terminal Sub1 may be coupled to a first terminal of secondary winding 302b, and terminal Sub2 may be coupled to a second terminal of secondary winding 302b and to the capacitive component (e.g., C320).

Figure 8:
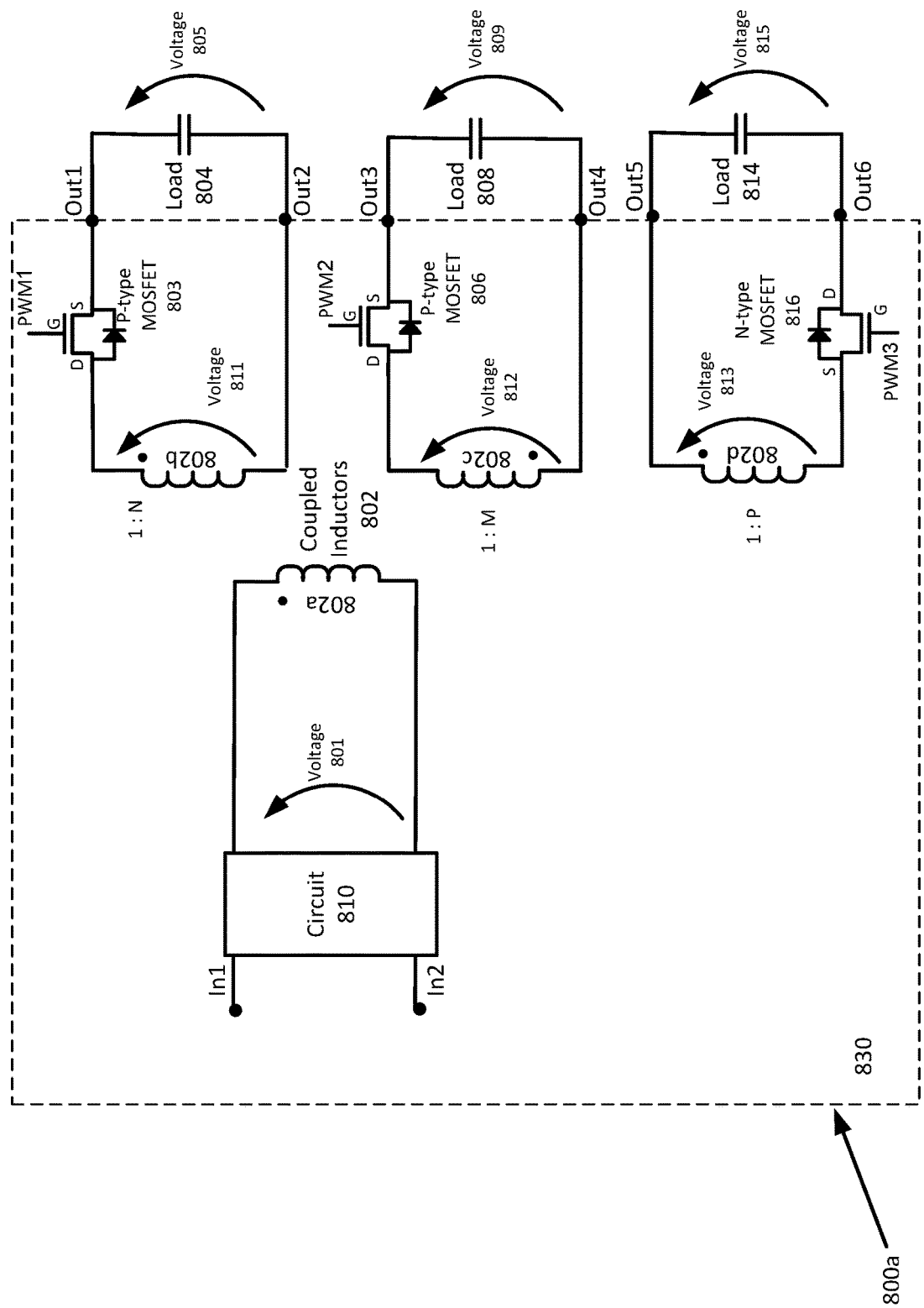
FIG. 8 illustrates a diagram of an electrical circuit according to aspects of the disclosure.

Reference is now made to FIG. 8, which illustrates a diagram of an electrical circuit 800a, an example of circuit 100 of FIGS. 1a-1e or circuit 200 of FIGS. 2a-2e, according to aspects of the disclosure.

In some aspects of the disclosure herein, coupled inductors 102 or 202 of FIGS. 1a-1e and FIGS. 2a-2e respectively, may be a multi-winding transformer or multi-winding coupled inductors that may contain more than one set of primary windings and/or more than one set of secondary windings, wound on a common core. Replacing coupled inductors 102 or 202 by a multi-winding transformer or multi-winding coupled inductors may enable a configuration of a couple of isolated drive circuits on the same power supply that may be controlled accordingly (e.g. synchronously or asynchronously).

For example, circuit 800a includes multi-winding coupled inductors 802 comprising primary winding 802a, secondary winding 302b with a winding turns ratio of 1:N with respect to primary winding 802a (N is the number of turns in the secondary winding), tertiary winding 802c with a winding turns ratio 1:M with respect to primary winding 802a (M is the number of turns in the tertiary winding), and quaternary winding 802d with winding turns ratio of 1:P with respect to primary winding 802a (P is the number of turns in the quaternary winding). Circuit 800a further includes P-type MOSFET 803, P-type MOSFET 806, N-type MOSFET 816, circuit 810, one or more controllers (not shown), input terminals In1-In2, output terminals Out1-Out2, output terminals Out3-Out4, and output terminals Out5-Out6.

Coupled inductors 802, P-type MOSFET 803, P-type MOSFET 806, N-type MOSFET 816, circuit 810 and the one or more controllers may be collectively referred to as a drive 830 (e.g., a fully isolated drive circuit) and configured to reduce power consumption in regulating voltage 805, 809 and 815 across loads 804, 808 and 814 respectively.

P-type MOSFET 803 may be coupled between secondary winding 802b and load 804 (e.g., in series with secondary winding 802b across load 804). P-type MOSFET 806 may be coupled between tertiary winding 802c and load 808 (e.g., in series with tertiary winding 802c across load 808). N-type MOSFET 816 may be coupled between quaternary winding 802d and load 814 (e.g., in series with quaternary winding 802d across load 814). MOSFETs 803, 806 and 816 may each comprise drain, source and gate terminals (denoted D, S and G respectively). The one or more controllers may control MOSFETs 803, 806 and 816 by applying PWM signals (PWM1, PWM2 and PWM3 respectively) that change the voltage difference between the gate and source terminals.

Circuit 810 (e.g. a controllable power supply) may apply voltage 801 across primary winding 802a according to aspects of the disclosure herein. For example, voltage 801 may be a time varying voltage that varies periodically between multiple direct current (DC) voltage levels, V1, V2 and V3 of FIGS. 1a-1e or of FIGS. 2a-2e.

Based on applying voltage 801 (V801) across primary winding 802a, a corresponding voltage that is proportional to voltage 801 and the 1:N winding turns ratio (e.g., V801·N) may be induced across secondary winding 802b, a corresponding voltage that is proportional to voltage 801 and the 1:M winding turns ratio (e.g., V801·M) may be induced across tertiary winding 802c, and a corresponding voltage that is proportional to voltage 801 and the 1:P winding turns ratio (e.g., V801·P) may be induced across quaternary winding 802d.

In response to the corresponding voltage across secondary winding 802b, one of the one or more controllers may turn-on or turn-off P-type MOSFET 803, thereby regulating load 804.

In response to the corresponding voltage across tertiary winding 802c, one of the one or more controllers may turn-on or turn-off P-type MOSFET 806, thereby regulating load 808.

In response to the corresponding voltage across quaternary winding 802d, one of the one or more controllers may turn-on or turn-off N-type MOSFET 816, thereby regulating load 814.

In some aspects of the disclosure herein, drive 830 may regulate load 804, load 808, and load 814 to similar voltage levels and in other aspects to different voltage levels.

In some aspects of the disclosure herein, the relative polarity of the multi-winding coupled inductors 802 may be the same or opposite. For example, positively increasing instantaneous current entering primary winding's (802a) 'dot' end induces positive polarity voltage exiting the same end of secondary winding 802b and the same end of quaternary winding 802d (as indicated by the 'dots' on the top (in FIG. 8) ends of the primary, secondary, and quaternary windings). However, positively increasing instantaneous current entering primary winding's (802a) 'dot' end induces positive polarity voltage exiting tertiary winding 802c's opposite end (as indicated by the 'dot' on the opposite (bottom in FIG. 8) end of the tertiary winding). The relative polarity of the multi-winding coupled inductors 802 may influence whether drive 830 (e.g., a fully isolated drive circuit) may regulate loads 804, 808 and 814 synchronously or asynchronously.

In some aspects of the disclosure herein, the switch in the floating circuit portion of the drive (e.g., switch 103 of FIGS. 1a-1d, switch 203 of FIGS. 2a-2d) may be referenced to the low-voltage terminal of the load or to the high-voltage terminal of the load.

For example, P-type MOSFETs 803 and 806 are connected to the high-voltage terminal of the loads 804 (e.g., Out1) and 808 (e.g., Out3) respectively. On the other hand, N-type MOSFET 816 is connected to the low-voltage terminal of the load 814 (e.g., Out6).

Figure 9:
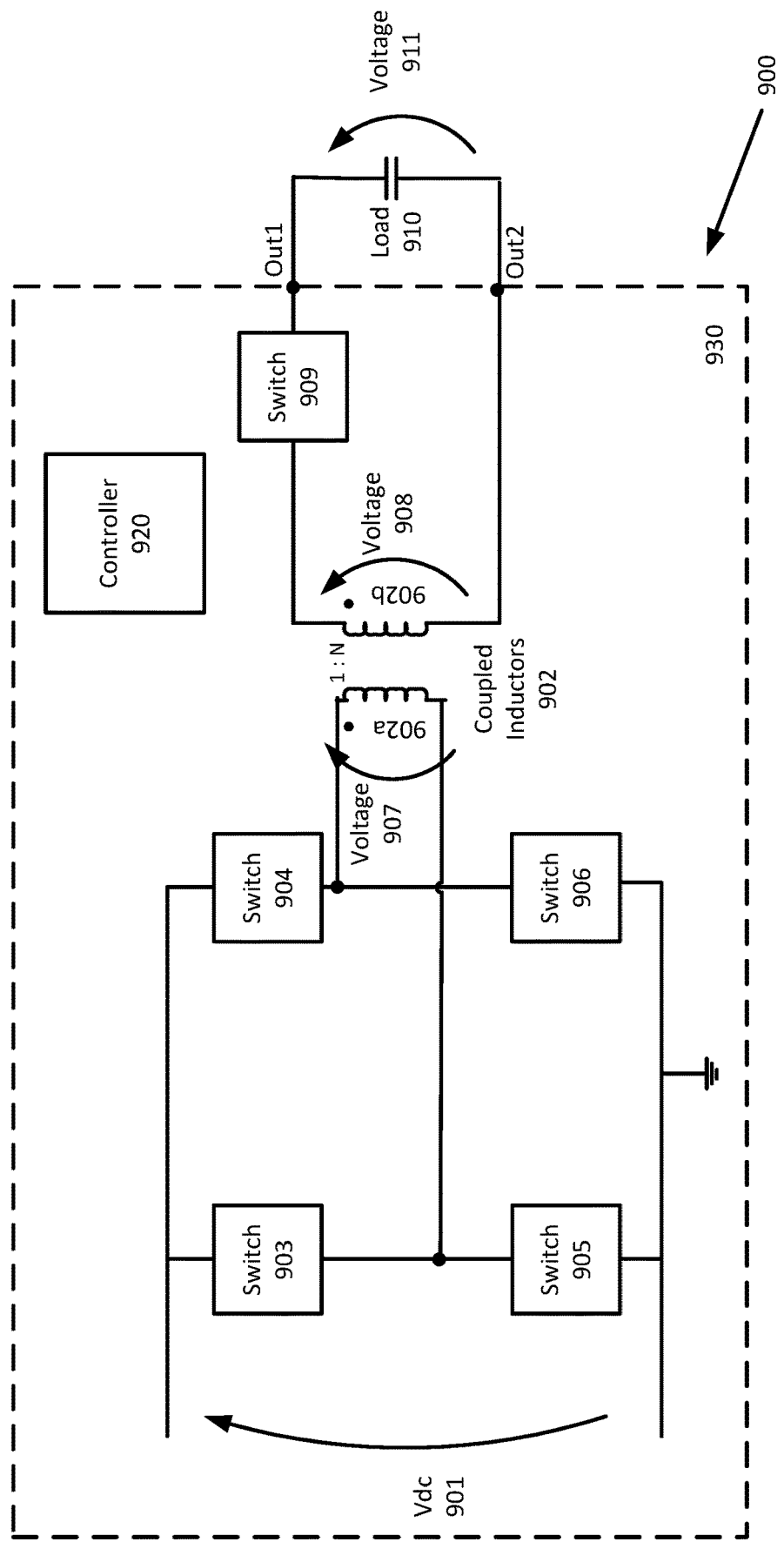
FIG. 9 illustrates a diagram of an electrical circuit according to aspects of the disclosure.

Reference is now made to FIG. 9, which illustrates a diagram of an electrical circuit according to aspects of the disclosure herein. In the following example, a full-bridge circuit may replace circuit 110 (e.g. the controllable power supply), circuit 210, and circuit 310 of FIGS. 1a-1e, 2a-2e, and 3-8 respectively.

Circuit 900 includes coupled inductors 902 comprising primary winding 902a and secondary winding 902b with a winding turns ratio 1:N (N is the number of turns in the secondary winding), switches 903-906 controlled by controller 920, switch 909 and load 904. The coupled inductors 902, switch 909, controller 920, switches 903-906, and optional controller 920 may be collectively referred to as a drive 930 (e.g., a fully isolated drive) and configured to reduce power consumption in regulating voltage 911 across load 910. The drive may include input terminals coupled with a direct current voltage source 901 (Vdc). The input terminals are coupled with a full bridge circuit comprising switches 903-906 and a primary winding 902a of coupled inductors 902. The full bridge circuit may provide a voltage 907 to the primary winding 902a of the coupled inductors 902. A corresponding voltage 908 (voltage 907·N) may be induced to the secondary winding 902b. The drive 930 may include output terminals Out1 and Out2 coupled with the load 910 such that load 910 is coupled across the output terminals (and thus across the secondary winding 902b coupled in series with switch 909).

In operation, DC voltage 901 may occur across the input terminals of the full bridge circuit. By controlling switches 903-906 (using controller 920 or another controller not shown in the figure), the full bridge circuit may apply voltage 907 across the primary winding 902a of the coupled inductors 902 according to some aspects of the disclosure. For example, as described in reference with FIGS. 1a-1e or FIGS. 2a-2e. Voltage 907 may be a time varying voltage that varies between multiple direct current (DC) voltage levels. For example, voltage 907 may vary between three voltage levels—V1, V2 and V3. V1 may be a positive voltage, V2 may be a null voltage (e.g., a short circuit or near-short circuit across primary winding 102a), and V3 may be a negative voltage having a polarity opposite to V1.

For example, to apply positive voltage level V1 across the primary winding 902a of the coupled inductors 902 (voltage 907), controller 920 may turn on switches 904 and 905 and turn off switches 903 and 906, thereby voltage 907 may be about the same as Vdc.

To apply negative voltage level V3 across the primary winding 902a of the coupled inductors 902 (voltage 907), controller 920 may turn off switches 904 and 905 and turn on switches 903 and 906, thereby voltage 907 may be about the same as the inverse value of Vdc.

To apply voltage level V2 (e.g., a zero voltage level) across the primary winding 902a of the coupled inductors 902 (voltage 907), controller 920 may turn off a couple of the switches of the full-bridge (e.g., switches 903-904, switches 905-906, etc.). For example, turning off switches 903 and 904 and turning on switches 905 and 906 may cause voltage 907 to be about 0V.

The duration of each voltage level may be controlled by a controller such as controller 920 (the controller may be implemented with various components, e.g. analog components, digital components, or a digital-analog converter). The duration of each voltage level may be controlled in accordance with an enable signal.

In some aspects of the disclosure herein, controller 920 may control switches 903-906 differently than mentioned above, due to design and control considerations. For example, controller 920 may turn-off switches 903-905 and turn-on switch 906 to enable a residual induced magnetic field of coupled inductors 902 to decrease.

Soft-switching methods such as zero-voltage switching (ZVS) and/or zero-current switching (ZCS) may be implemented while switching switches 903-906 to conserve energy (reduce energy losses). The methods may be applied by controller 920 or a similar one through phase-shifted switching due to the resonant characteristics of the circuit and it components.

In some instances, an optional switch (e.g., a free-wheeling diode as switch 308 of FIG. 7) may be coupled across (e.g., in parallel with) primary winding 902a. The switch may be closed when voltage 907 is at voltage level V2 (e.g., a zero voltage), thereby short-circuiting primary winding 902a and enabling the residual energy in primary winding 902a to flow as current through the optional switch, which may potentially reduce loss in the system. For instance, the optional switch may be characterized by low conduction losses in comparison to conduction losses of other switches in the isolated drive circuit and a current flowing through the optional switch may achieve reduced power dissipation.

Figure 10A:
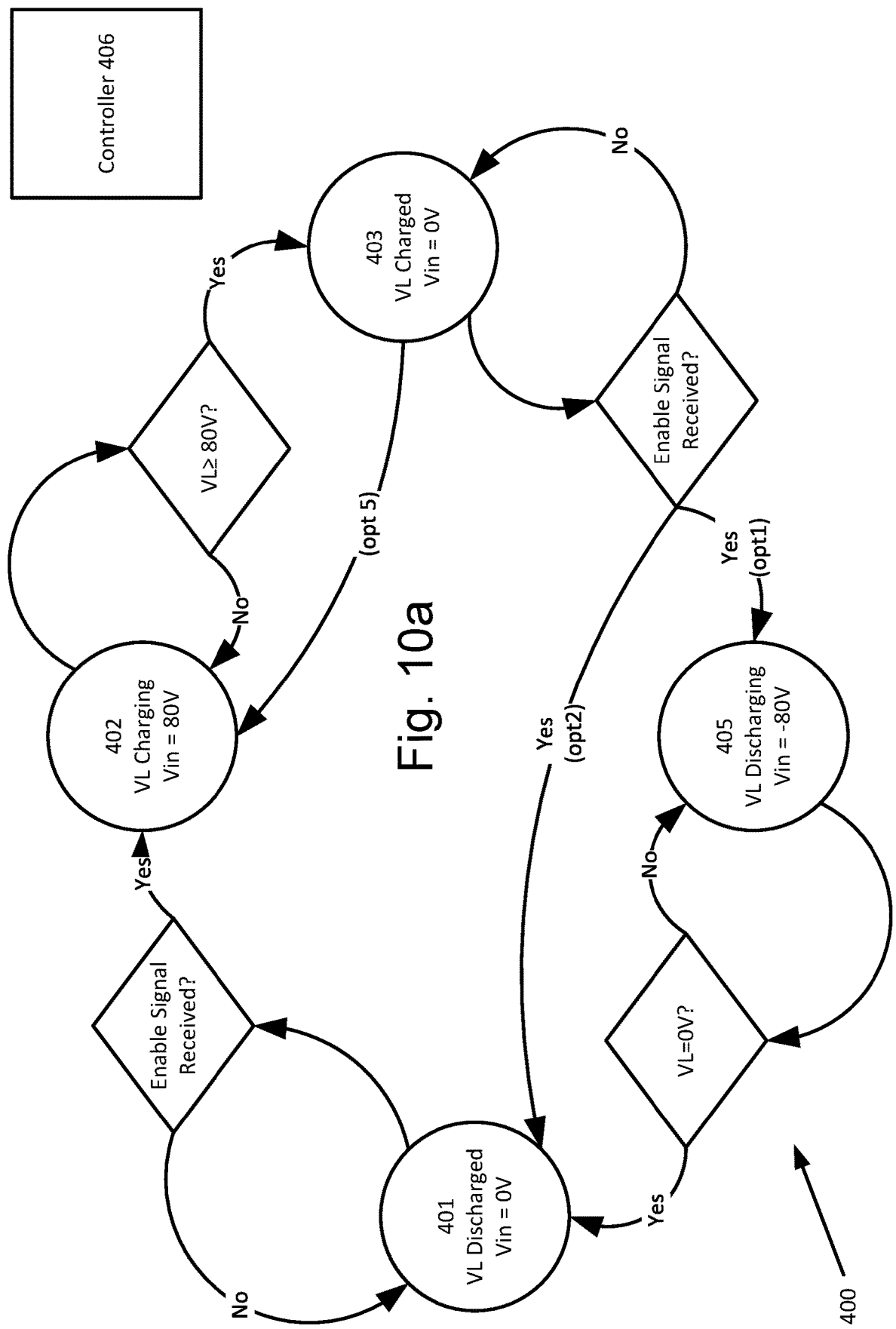
FIG. 10a illustrates an operation process of electrical circuits according to aspects of the disclosure.

Reference is now made to FIG. 10a, which illustrates, in state diagram form, a method 400. Method 400 is an example of a process for operating electrical circuits comprising an isolated drive circuit (e.g., circuits 150, 250, and 330 of FIGS. 1a-1e, 2a-2e, and 3, respectively) according to aspects of the disclosure herein. Method 400, which may include steps 401, 402, 403 and 405, represents one of the techniques that controller 406 (e.g., a controllable power supply) may use to operate and control an input voltage (denoted Vin) for an isolated drive circuit to regulate a voltage (denoted VL) for a load (e.g., a gate capacitance of a MOSFET) in accordance with an occurrence of an enable signal (e.g., pulse-width modulation signal, a signal generated by the controller according to one or more electrical parameters of the drive). Controller 406 may be similar to or the same as the controllers discussed herein (e.g., controllers discussed in connection with FIGS. 1a-1e and 2a-2e). Also, Vin and VL may be similar to or the same as voltage 101 and voltage 105 of FIGS. 1a-1e or voltage 201 and voltage 205 of FIGS. 2a-2e. The entry point of method 400 depicted in FIG. 10a may be step 401. In this example, V1, V2, and V3 may be 80V, 0V, and −80V, respectively, and the winding turns ratio of the coupled inductors may be 1:1.

In step 401, the input voltage (Vin), may be at voltage level V2 (e.g., 0V), and the output voltage (VL) may be at V2 (e.g., 0V). When controller 406 receives an enable signal (e.g., a rise time of a PWM signal) for turning on a switch 103, 203 (e.g., an associated MOSFET that is turned on by driving the gate capacitance of the MOSFET) and for increasing VL to voltage level V1 (e.g., 80V), controller 406 may advance to step 402.

In step 402, the controller 406 may increase Vin to V1 (e.g., 80V), charge VL to voltage level V1 (e.g., 80V) and determine, for example by a direct measurement or a time constant calculation based on values of circuit components, etc., if VL reached voltage level V1 (e.g., 80V) or greater. If controller 406 determines that VL did not reach voltage level V1 (e.g., 80V), controller 406 may remain in step 402 and continue to monitor whether VL reaches voltage level V1 (e.g., 80V). If a predetermined period of time has elapsed since entering step 402 or controller 406 determines that VL reached voltage level V1 (e.g., 80V), controller 406 may advance to step 403.

In step 403, controller 406 may decrease Vin to voltage level V2 (e.g., 0V) to preserve the output voltage VL at about the same level (e.g., 80V). Further, controller 406 may, in step 403, determine if controller 406 should turn on an associated switch 103, 203 (e.g., a MOSFET that can be turned on by charging the gate capacitance of the MOSFET) and decrease VL to the voltage level V2 (e.g., 0V). The determination in step 403 may be based on an enable signal, which may be, for example, a fall time of a PWM signal or an internal or external (with respect to controller 406) clock signal and the determination may include determining that a predetermined period of time has elapsed since entering step 403. Or, the determination in step 403 may be based on a signal generated due to a voltage or current measurement. If controller 406 determines that controller 406 should not decrease VL to the voltage level V2 (e.g., 0V), controller 406 may remain in step 403 and continue to monitor whether controller 406 should decrease VL to voltage level V2. If controller 406 determines that controller 406 should decrease VL and discharge the load, controller 406 may have two possible options to choose from, depending on the implementation of the associated controlled electrical circuit.

According to a first option in step 403 (for example, where switch 103 of FIGS. 1a-d is implemented with a Zener diode), controller 406 may advance to step 405. In step 405, controller 406 may decrease Vin to voltage level V3 (e.g., −80V) to discharge VL to voltage level V2 (e.g., to enable a current path to discharge the load). Further, controller 406 may, in step 405, determine if VL reached voltage level V2 (e.g., 0V). If controller 406 determines that VL did not reach voltage level V2 (e.g., 0V), controller 406 may remain in step 405 and continue to monitor whether VL reaches voltage level V2 (e.g., 0V). If controller 406 determines, for example by a direct measurement or a time constant calculation based on values of circuit components, etc., that VL reached voltage level V2 (e.g., 0V), it may advance to step 401 and increase Vin to voltage level V2 (e.g., 0V), thereby maintaining voltage VL at voltage level V2 (e.g., 0V). By advancing to step 401, the system may return to the entry point of method 400, where controller 406 may repeat the steps described above.

According to a second option in step 403, controller 406 may advance to step 401 and decrease Vin to voltage level V2 (e.g., 0V), thereby decreasing voltage VL to voltage level V2 (e.g., 0V). By advancing to step 401, the system may return to the entry point of method 400, where controller 406 may repeat the steps described above.

In some illustrative embodiments, controller 406 may return from step 403 to step 402 (through option 5 in FIGS. 10a and 10b) to ensure that voltage VL is charged to voltage level V1 (e.g., 80V). For example, in some cases voltage VL may slowly discharge and decrease while waiting for an enable signal to arrive and/or a time constant or a measured value to achieve a predetermined value. In such cases, controller 406 may refresh the voltage across the load by charging voltage VL (and returning to step 402) until advancing to the following steps (e.g., step 401 or 405). The refreshing can be done by controller 406 in a repetitive manner and may ensure that voltage VL is charged to voltage level V1 (e.g., 80V).

In some illustrative embodiments, controller 406 may not determine if VL reached voltage level V1 (e.g., 80V) and voltage level V2 (e.g., 0V) in steps 402 and 405, respectively, and may advance to the sequential step based on an enable signal and/or by a time constant calculation based on values of circuit components, etc.

Figure 10B:
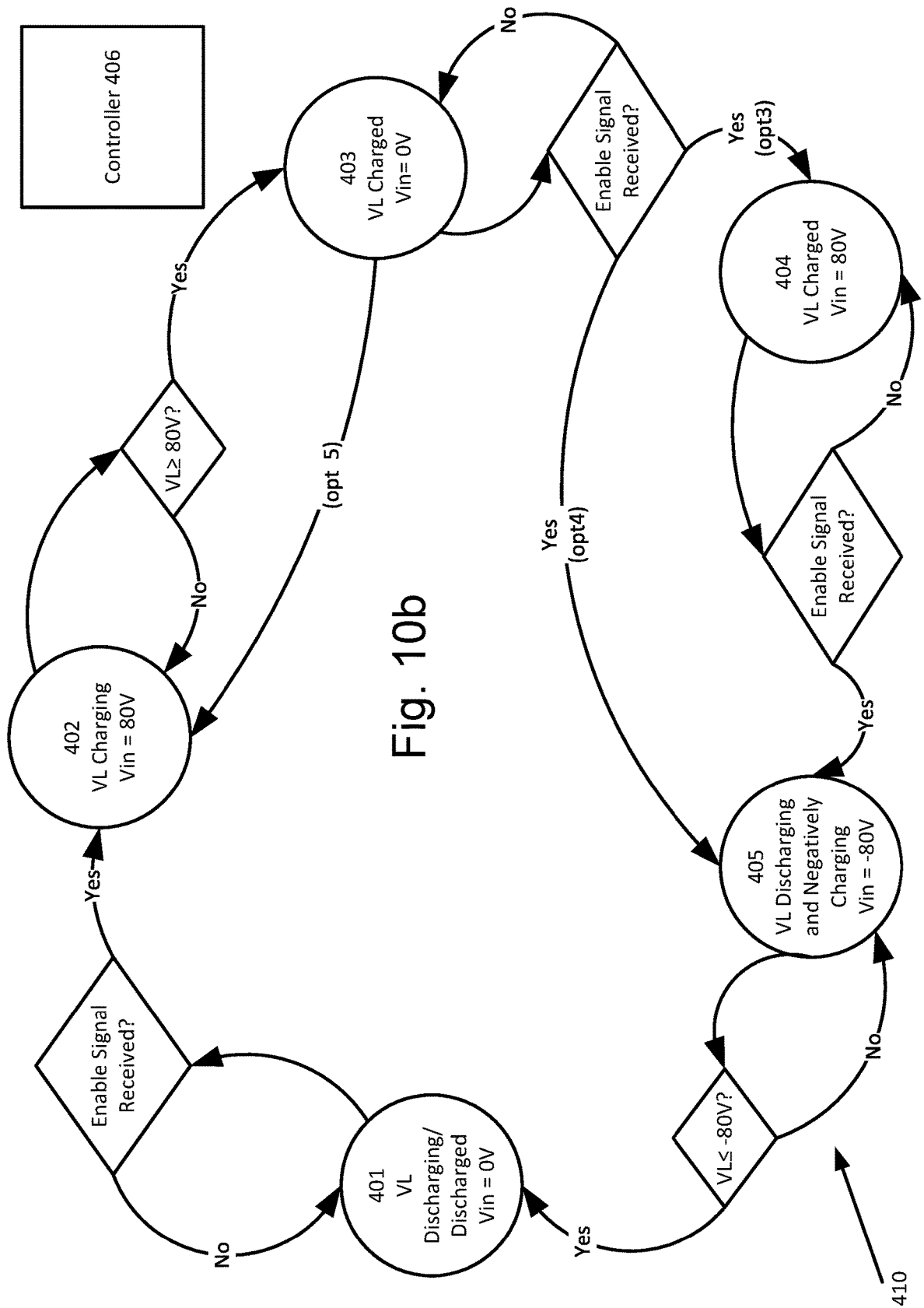
FIG. 10b illustrates an operation process of electrical circuits according to aspects of the disclosure.

Reference is now made to FIG. 10b, which illustrates, in state diagram form, a method 410. Method 410 may be an example operation process of some electrical circuits discussed herein according to embodiments of the present disclosure. The operation process of FIG. 10b may be implemented in embodiments wherein switch 203 of FIGS. 2a-2e is implemented with a field-effect transistor (FET) controlled by a controller or an independent circuit that controls the voltage difference between the source and gate terminals of the FET (for example, as shown in FIGS. 4-6). In method 410, a zero-voltage switching (ZVS) (e.g., a soft-switching method) may be used. Also, steps 401, 402, 403, and 405 as described with respect to FIG. 10a may be implemented as steps 401, 402, 403, and 405 in method 410 of FIG. 10b along with an additional step 404. Thus, the below description of method 410 starts at step 403.

In step 403 of method 410, if controller 406 receives a signal (e.g., a fall time of a PWM signal) that controller 406 should decrease VL and should turn on an associated switch 103, 203 (e.g., a MOSFET that is turned on by charging the gate capacitance of the MOSFET) and if the implementation of the associated controlled electrical circuit is compatible with a third option (e.g., switch 203 is a field-effect transistor (FET) controlled by a controller or an independent circuit), controller 406 may advance to step 404. In step 404, controller 406 may increase Vin to voltage level V1 (e.g., 80V), which may decrease voltage across switch 203 (e.g., drain-source voltage of switch 203) to zero and reduce switching losses by virtue of zero-voltage switching (ZVS), as shown in FIG. 2a-2e. After step 404, the controller may advance to step 405 (e.g., in which the switch is closed).

If controller 406 determines, for example by a direct measurement or a time constant calculation based on values of circuit components, etc., that voltage level V1 (e.g., 80V) is induced in the secondary winding circuit of the drive circuit and the voltage across switch 203 decreased to substantially zero, controller 406 may advance to step 405 thereby reducing switching losses (e.g., of switch 203 of the drive, as mentioned in paragraphs 95-105 referring to FIGS. 2a-2e) when turning on switch 203 in step 405.

If controller 406 receives a signal (e.g., a fall time of a PWM signal) that controller 406 should decrease VL and should turn on an associated switch 103, 203 (e.g., a MOSFET that is turned on by charging the gate capacitance of the MOSFET) and the implementation of the associated controlled electrical circuit is compatible with a fourth option, controller 406 may advance from step 403 directly to step 405.

In step 405, controller 406 may decrease Vin to voltage level V3 (e.g., −80V) to discharge VL to voltage level V3 (e.g., to enable a current path to discharge the load or to negatively charge the load). Further, controller 406 may, in step 405, determine if VL reached voltage level V3 (e.g., −80V) or less. If controller 406 determines that VL did not reach voltage level V3 (e.g., −80V), controller 406 may remain in step 405 and continue to monitor whether VL reaches voltage level V3. If controller 406 determines, for example by a direct measurement or a time constant calculation based on values of circuit components, etc., that VL reached voltage level V3 (e.g., −80V) or less, it may advance to step 401 and increase Vin to voltage level V2 or 0V), thereby bringing voltage VL to voltage level V2 (e.g., 0V). By advancing to step 401 the system may return to the entry point of method 410, where controller 406 may repeat the steps described above.

Figure 11A:
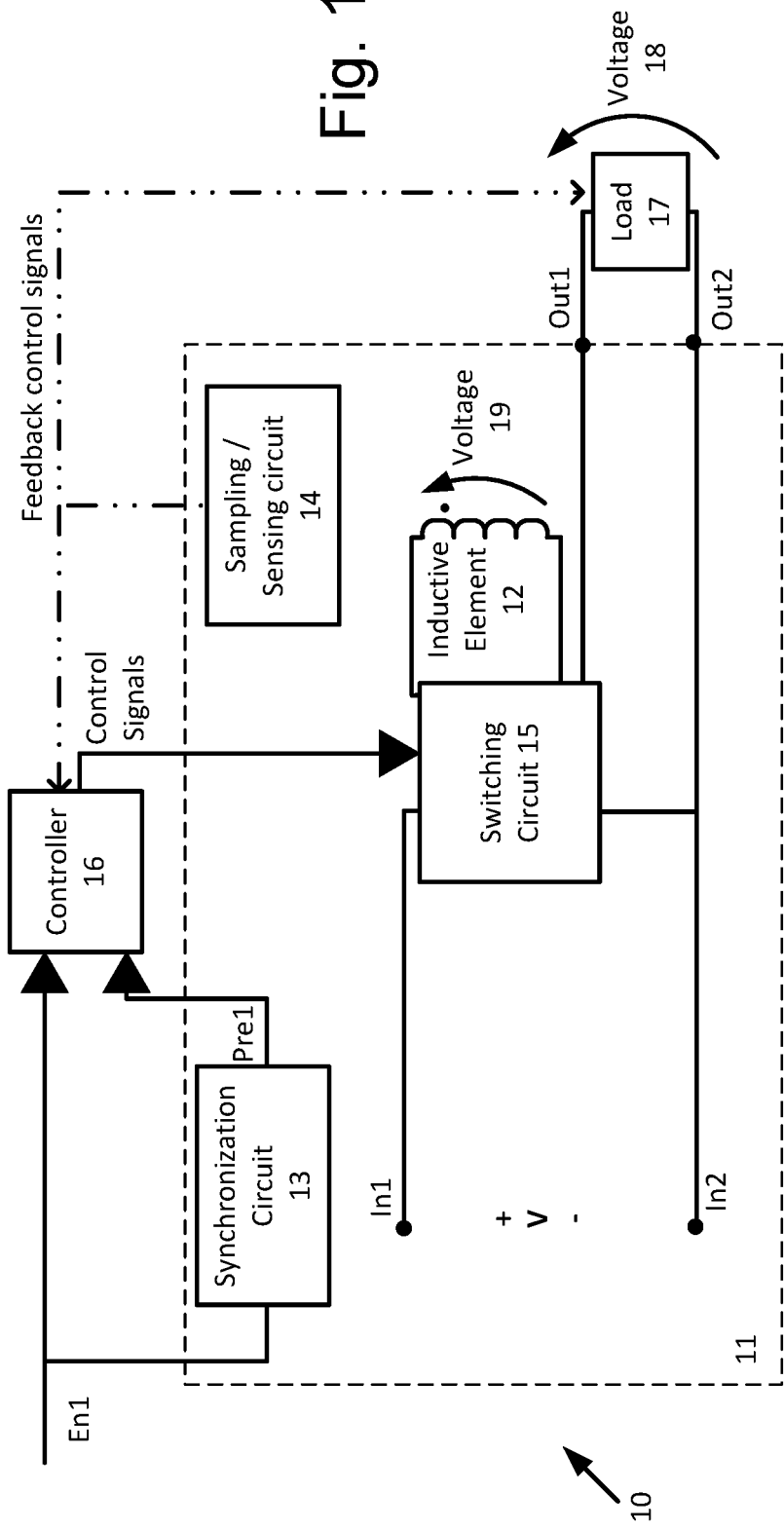
FIGS. 11a-11b illustrate a block diagram and timing diagram of an electrical circuit according to aspects of the disclosure.

The controller (e.g., controller 16 of FIG. 11a) may be implemented as one or more controllers. The controller may be coupled to a drive (e.g., drive 11 as illustrated in FIG. 11a), and/or incorporated into the drive. The synchronization circuit (e.g., synchronization circuit 13 of FIG. 11a) may be coupled to the drive, and/or incorporated into drive (as illustrated in 11a). The synchronization circuit may include a phase-locked loop (PLL) or a delay-locked loop (DLL).

Figure 11B:
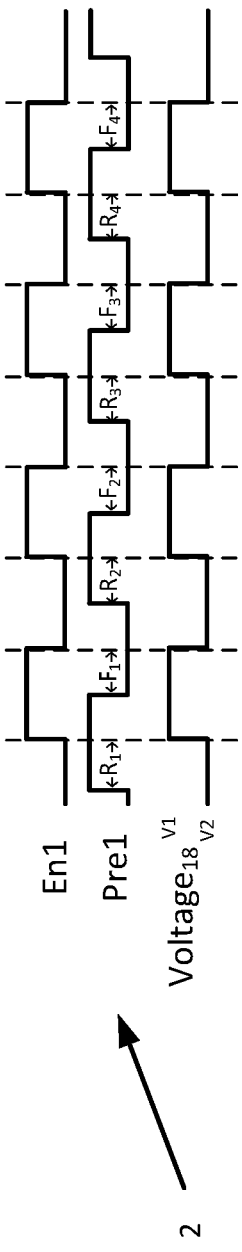

Reference is now made to FIGS. 11a and 11b, which illustrate a diagram of an electrical circuit 10 and a timing diagram 2 according to aspects of the disclosure herein. Circuit 10 includes inductive element 12 (e.g., an inductor, a transformer, a coupled inductor, etc.), synchronization circuit 13, switching circuit 15, controller 16, load 17 including capacitive element(s), input terminals In1-In2 (e.g., positive and negative) and output terminals Out1-Out2.

Inductive element 12, synchronization circuit 13, switching circuit 15, input terminals In1-In2 and output terminals Out1-Out2 may be collectively referred to as a drive 11. Drive 11 may be a resonant gate drive circuit controlling a gate capacitor of a transistor (e.g., an insulated-gate bipolar transistor, a MOSFET).

In some aspects, controller 16 and/or synchronization circuit 13 may receive one or more parameters related to one or more electrical parameters of circuit 10. The received parameter may be, for example: a measured parameter, e.g., a measurement collected by one or more sensors (for example, sampling/sensing circuit 14), a calculated parameter, determined or estimated, e.g., based on one or more measured parameters, any other appropriate data, etc. As an example, the electrical parameter may be: current, voltage, power, frequency, etc. In some aspects, controller 16 may control drive 11 based on and/or using a closed loop control system that may monitor one of the measured/estimated/sensed parameters (for example, rise time sampling of voltage 18 across load 17, peak current flowing through inductive element 12, etc.) that may be obtained by sampling/sensing circuit 14.

Drive 11 may regulate voltage 18 across load 17 to about two DC voltage levels, level V1 (e.g., 3.3V, 5V, 12V, etc.) and level V2 (e.g., 0V, 1V, etc.), based on an arrival of enable signal En1. For example, as shown in the timing diagram 2, drive 11 may charge and discharge voltage 18 to about level V1 and about level V2, e.g., to about V1=12V and about V2=0V respectively, in accordance with enable signal En1.

A rise of enable signal En1 may indicate drive 11 to charge voltage 18 across load 17 to a voltage level (e.g., to about level V1=12V), and a fall of enable signal En1 may indicate drive 11 to discharge voltage 18 to a null voltage (e.g., 0V, 0.1V, −0.1V, etc. which may be due to a short circuit or near-short circuit across load 17).

Input terminals In1 and In2 (e.g., positive and negative) may be coupled with switching circuit 15 and may provide switching circuit 15 a DC power supply (e.g., 12V, 5V, 3.3V). Switching circuit 15 (e.g. DC-DC converter, DC-AC converter) may also be coupled to winding(s) of inductive element 12. Load 17 may be coupled between output terminals Out1 and Out2, such that output terminal Out1 may be coupled to one terminal of inductive element 12 and output terminal Out2 may be coupled (optionally through additional circuit elements, such as a series resistor, a switch, an inductor, etc.) to input terminal In2.

In operation, switching circuit 15 may supply voltage 19 across winding(s) of inductive element 12. Voltage 19 may be a time varying voltage that varies/changes periodically between multiple direct current (DC) voltage levels. For example, voltage 19 may vary between three voltage levels: V1, V2 and V3. V1 may be a positive voltage (e.g., +12V, +5V, +3.3V), V2 may be a null voltage (e.g., 0V, 0.1V, −0.1V, etc. which may be due to a short circuit or near-short circuit across winding(s) of inductive element 12), and V3 may be a negative voltage (e.g., −12V, −5V, −3.3V) having a polarity opposite to V1.

Voltage 19 may charge and discharge inductive element 12, according to the relationship between the time-varying voltage v(t) across inductive element 12 with inductance L and the time-varying current i(t) passing through it, the relationship being $$v(t) = L\frac{di(t)}{dt}.$$

For example, when charging inductive element 12 controller 16 may apply a positive voltage V1 across inductive element 12 until the current through inductive element 12 reaches a threshold value (e.g., 1 A) or higher. The threshold value may be calculated/estimated such that the energy stored in the magnetic field of inductor (e.g., $E_L = \frac{1}{2}LI^2$ here L represents the inductance of inductive element 12) may be equal to the energy required to charge load 17 to a voltage level V (e.g., $E_C = \frac{1}{2}CV^2$ where C represents the load capacitance).

The duration of each voltage level may be controlled by control signals generated by controller 16 to drive one or more switches of switching circuit 15. The duration of each voltage level during each period may be controlled in accordance with an enable signal (e.g., a pulse-width modulated signal, etc.). The control may be based on a voltage mode control and/or a current mode control. For example, enable signal En1 may be generated by controller 16 (e.g., a clock of controller 16, a quartz crystal in controller 16, etc.), or another appropriate circuit or device, for example: a digital signal processing [DSP] circuit, a field programmable gate array [FPGA] device, etc. Enable signal En1 may be generated according to, for example: a clock, an external control signal, a determination or an estimation of one or more electrical parameters of circuit 10 (e.g., current flow through inductive element 12, voltage 18 across load 17), etc. For example, an electrical parameter may be a rise time sampling of voltage 18 across load 17, a peak current flowing through inductive element 12, etc. In some aspects, the duration of a particular voltage level may remain constant for each interval of the particular voltage level. In other cases, the duration of a particular voltage level may change over time for each interval of the particular voltage level.

Depending on the configuration of switching circuit 15, e.g., the states of the switches, the charging and discharging of inductive element 12 may transfer power/energy/charge between the DC power supply, inductive element 12 and load 17. For example, when inductive element 12 and load 17 form a closed loop with resonant characteristics, the charge may flow from the storing element (e.g., inductive element 12 or load 17) to the other, as will be discussed below with respect to FIGS. 13a-13i, 14a-14f, 15a-15f, 16a-16f, 17a-17e, and 18a-18f.

Controller 16 may monitor load 17 using a closed-loop (e.g., feedback) control circuit, for example based on one or more measurements of one or more electrical parameters of circuit 10 that may be done by sampling/sensing circuit 14.

In some aspects, controller 16 may monitor load 17 using an open loop control circuit, for example based on a predetermined duty-cycle, a predetermined operating frequency, a predetermined amount of time load 17 may be charged, etc.

Load 17 may have a capacitance (e.g., capacitive elements), for example, an equivalent capacitance between source and gate terminals of a transistor (gate-source capacitance—$C_{gs}$), a capacitive impedance of a communication circuit (e.g., used for loop signaling), etc.

The capacitance of load 17 may vary during operation, according to different circumstances. For example, when the capacitance of load 17 represents a gate capacitance (e.g., of a transistor) comprising a capacitance between source and gate terminals of a transistor (gate-source capacitance—Cgs) and a capacitance between drain and gate terminals of a transistor (gate-drain capacitance—Cgd), the Miller effect may increase this capacitance in certain circuits, for example, in inverting voltage amplifiers. As another example, according to some aspects the capacitance of load 17 may change in correspondence to a change of voltage 18.

Synchronization circuit 13 may be configured to receive enable signals En1 and, based on estimated/predicted characteristic(s) (e.g., previous occurrences) of a first enable signal En1, may estimate/predict one or more characteristics (e.g., amplitude, duration, etc.) of a subsequent enable signal En1 (e.g., to be received after the first enable signal En1). For example, synchronization circuit 13 may estimate/predict an arrival time (e.g., a rise of En1, a fall of En1) of a subsequent enable signal En1. Based on the estimated/predicted characteristic(s), e.g., arrival time, of a subsequent enable signal En1, synchronization circuit 13 may generate pre-charge signal Pre1. The estimating/predicting may include a detection of a frequency or a phase of previous occurrences of enable signal En1. Pre-charge signal Pre1 may be generated to replicate enable signal En1, e.g. at an offset to the enable signal. Synchronization circuit 13 may generate pre-charge signal Pre1 having a voltage level corresponding with the voltage level of enable signal En1. In some examples, pre-charge signal is substantially the same as one or more previous enable signals, except with a different arrival time than the enable signal (e.g., the signals may be nearly identical aside from an offset in time).

For example, synchronization circuit 13 may include a phase-locked loop (PLL). The PLL may estimate and generate an output signal Pre1 whose phase and frequency may be related to the phase and frequency of input signal En1. The PLL may include an oscillator and may compare the phase of the oscillator with the input enable signal En1 to generate an error signal. The PLL may use the error signal to adjust the oscillator to keep the phases and the frequencies of signals En1 and Pre1 matched.

As another example, synchronization circuit 13 may include a delay-locked loop (DLL). The DLL may compare the phase of the last output of signal Pre1 with the input signal En1 to generate an error signal. The DLL may use the error signal to adjust the oscillator to keep the phases and the frequencies of signals En1 and Pre1 matched.

The estimation of the arrival time of a subsequent enable signal En1 may enable synchronization circuit 13 to generate pre-charge signal Pre1, that may reduce the response time of drive 11 to the occurrence of enable signal En1, by completely or partially charging the inductive element to about a threshold prior to the occurrence of the subsequent enable signal. For example, increasing a current flowing through inductive element 12, and charging inductive element 12 to about a threshold value may take time. Therefore, using the generated pre-charge signal Pre1, which may precede a subsequent enable signal En1, may enable controller 16 and/or drive 11 to pre-charge inductive element 12 to a current flow substantially equal to or above a threshold value prior to the arrival of the subsequent enable signal En1. As a result, in accordance with the arrival time (e.g., a rise of En1, a fall of En1, etc.) of the subsequent enable signal En1, drive 11 may regulate a positive voltage across load 17 in a reduced response time.

Controller 16 may be configured to receive both enable signal En1 and pre-charge signal Pre1 and, using one or more decision rules, e.g. using decision-making circuits, may generate control signals to drive one or more switches of switching circuit 15, as will be discussed below with respect to FIGS. 13a-13k, 14a-14f, 15a-15f, 16a-16f, 17a-17e, and 18a-18f.

For example, in some aspects the decision-making circuits may prioritize timing considerations while implementing steps to control/monitor load 17's input voltage, while in some aspects the decision-making circuits may prioritize efficiency considerations over timing considerations. As another example, the drive may support a scenario where enable signal En1 is not exhibiting periodic features and/or a scenario where synchronization circuit 13 might not estimate/predict successfully an arrival time of enable signal En1.

For example, the timing diagram 2 of FIG. 11b illustrates a time interval where enable signal En1 has a periodic waveform (or a quasi-periodic waveform). Pre-charge signal Pre1, generated by synchronization circuit 13, may be an early estimation or replica of the waveform of enable signal En1. Receiving pre-charge signal Pre1 prior to a subsequent enable signal En1 may allow controller 16 and/or drive 11 to control switching circuit 15 to apply voltage 19 across inductive element 12. Applying voltage 19 across inductive element 12 may increase positively or negatively the current flowing through inductive element 12 to a threshold value, prior to the arrival (e.g., a rise or a fall) of the subsequent enable signal En1. With the arrival of the subsequent enable signal En1, inductive element 12 may be already charged with a current at least equal to a threshold value and drive 11 may regulate voltage 18 across load 17 within a relatively reduced response time, compared to a system that does not use a pre-charge signal, by having inductive element 12 already charged.

Time intervals $R_1$, $R_2$, $R_3$, $R_4$, $F_1$, $F_2$, $F_3$, $F_4$ may indicate the time that an arrival (e.g., a rise or a fall) of pre-charge signal Pre1 may precede an arrival of enable signal En1.

Each of time intervals $R_1$, $R_2$, $R_3$, $R_4$ may be equal or different in value and/or may be at least equal to the time that it may take for drive 11/controller 16 to positively charge inductive element 12 and positively increase the current flowing through inductive element 12 to a threshold value.

Each of time intervals $F_1$, $F_2$, $F_3$, $F_4$ may be equal or different in value and/or may be at least equal to the time that it may take for drive 11/controller 16 to negatively charge inductive element 12 and negatively increase the current flowing through inductive element 12 to a threshold value.

In some aspects of the disclosure, controller 16 may receive a subsequent enable signal En1 before pre-charge signal Pre1 and/or before the current flowing through inductive element 12 reaches a threshold value. In such cases, controller 16 may, e.g., using one or more decision-making circuits, define and generate one or more control signals to drive switching circuit 15 according to priorities and specifications/requirements of drive 11, e.g., based on one or more decision rules.

Drive 11 may be configured to reduce power consumption in regulating voltage 18 across load 17 by pre-charging the induction element and thus potentially reducing the time it takes to regulate the voltage on the load, thereby reducing transient periods and decreasing consumed energy.

Figure 12:
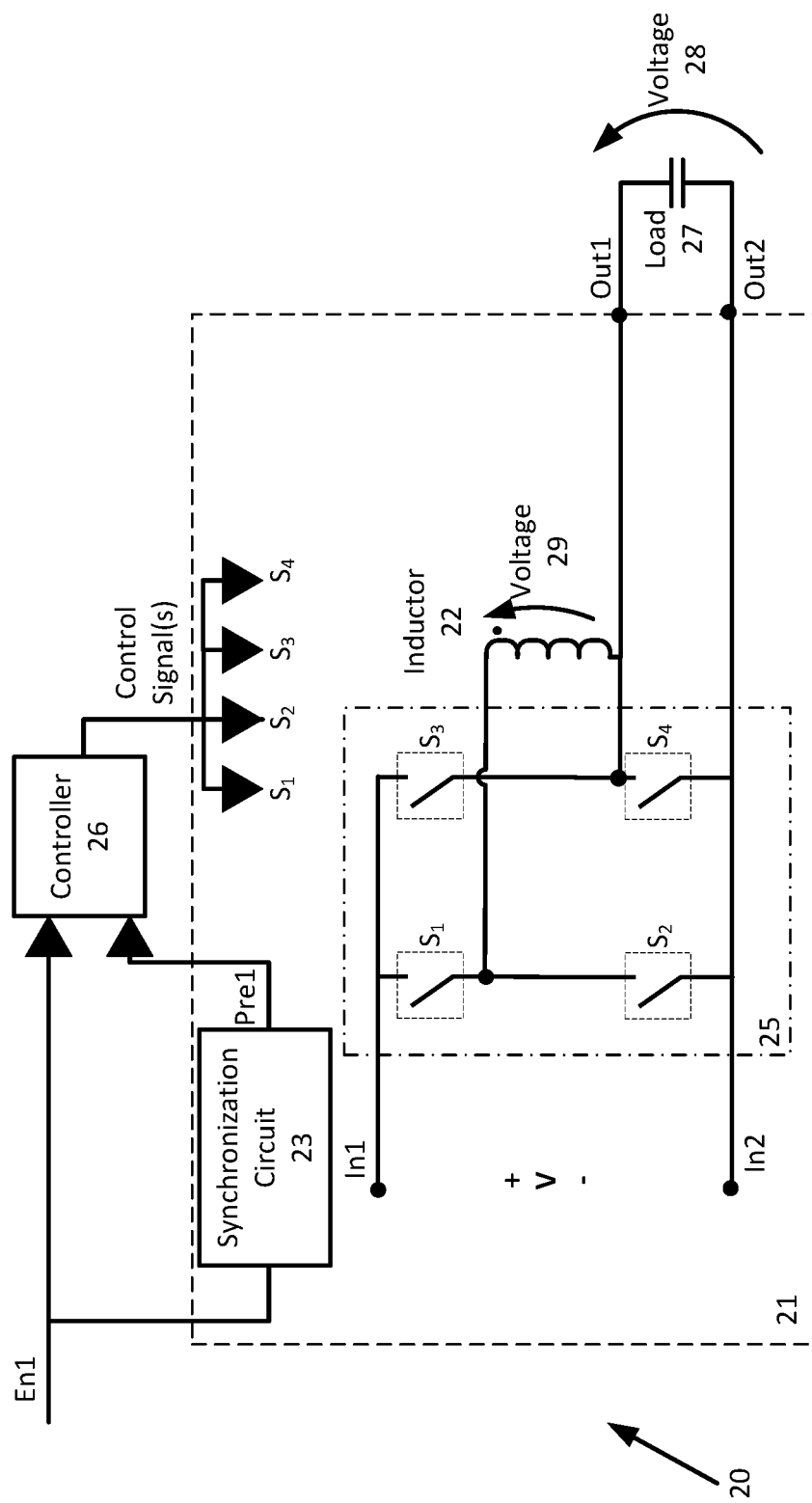
FIG. 12 illustrates a diagram of an electrical circuit according to aspects of the disclosure.

Reference is now made to FIG. 12, which illustrates a diagram of electrical circuit 20, which may be an example of circuit 10 of FIG. 11a, according to aspects of the disclosure. As shown in FIG. 12, in some aspects, switching circuit 15 of FIG. 11a may be a DC-DC converter and/or an H bridge circuit (e.g., an electronic circuit that may switch the polarity of a voltage applied across a load, in this case inductor 22 which is an example of the inductive element 12 of FIG. 11a).

Circuit 20 includes controller 26, switching circuit 25 including H bridge circuit having switches $S_1$, $S_2$, $S_3$, $S_4$ (e.g., a full-bridge), inductor 22, load 27 including capacitive elements, synchronization circuit 23, input terminals In1-In2 (e.g., positive and negative) and output terminals Out1-Out2.

Switching circuit 25 including H bridge circuit having switches $S_1$, $S_2$, $S_3$, $S_4$, inductor 22, synchronization circuit 23, input terminals In1-In2 and output terminals Out1-Out2 may be collectively referred to as a drive 21.

Controller 26 may monitor load 27 using a closed-loop (e.g., feedback) control circuit, for example based on one or more measurements of one or more electrical parameters of circuit 20 (for example, rise time sampling of voltage 28 across load 27, peak current flowing through inductor 22, etc.).

In some aspects, controller 26 may monitor load 27 using an open loop control circuit, for example based on a predetermined duty-cycle, a predetermined operating frequency, a predetermined amount of time load 27 may be charged, etc.

In some aspects, controller 26 and/or synchronization circuit 23 may receive one or more estimations and/or determinations (e.g., measurements collected by sensors) and/or data, of one or more electrical parameters of circuit 20.

Drive 21 may monitor/control/regulate voltage 28 across load 27 to two DC voltage levels, V1 (e.g., 12V, 5V, 3.3V) and V2 (e.g., 0V), based on an arrival or occurrence of enable signal En1.

In operation, switching circuit 25 may supply voltage 29 across winding of inductor 22 by changing the state (e.g., conducting/ON or nonconducting/OFF) of switches $S_1$, $S_2$, $S_3$, $S_4$.

Voltage 29 may be a time varying voltage that varies periodically between multiple direct current (DC) voltage levels. For example, voltage 29 may vary between three voltage levels: V1, V2 and V3. V1 may be a positive voltage (e.g., +3.3V, +5V, +12V), V2 may be a null voltage (e.g., 0V, 0.1V, −0.1V, etc. which may be due to a short circuit or near-short circuit across winding(s) of inductor 22), and V3 may be a negative voltage (e.g., −3.3V, −5V, −12V), for example, having a polarity opposite to V1.

Each one of switches $S_1$, $S_2$, $S_3$, $S_4$ may be controlled by a corresponding control signal respectively (e.g., generated by controller 26), as will be discussed below with respect to FIGS. 13a-13k, 14a-14f, 15a-15f, 16a-16f, 17a-17e, and 18a-18f.

In some aspects, one or more of switches $S_1$-$S_4$ may be one of a field-effect transistor (FET), a diode, a relay, and/or the like.

Drive 21 may be configured to reduce power consumption in monitoring/controlling/regulating voltage 28 across load 27 by pre-charging inductor 22 and thus potentially reducing the time it takes to regulate the voltage on the load, thereby reducing transient periods and decreasing consumed energy.

Reference is now made to FIGS. 13a-13e, which illustrate diagrams of an electrical circuit (a drive circuit with synchronization system) according to aspects of the disclosure herein. FIGS. 13a-13e illustrate possible states of the drive circuit control (e.g. switching circuit) of circuit 20 of FIG. 12 in accordance with embodiments herein. The control may be determined by controller 26, according to one or more electrical parameters of circuit 20 of FIG. 12, for example applied voltage 29, output voltage 28, current flowing through inductor 22, etc. For the sake of convenience, controller 26 and synchronization circuit 23 of FIG. 12 are not shown in FIGS. 13a-13e.

Figure 13A:
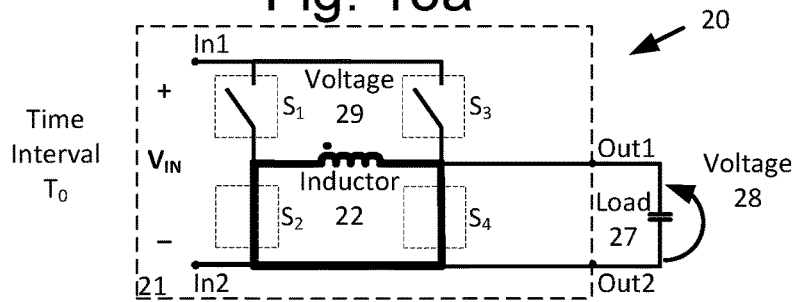
FIGS. 13a-13e illustrate diagrams of an electrical circuit according to aspects of the disclosure.

FIG. 13a illustrates a state of circuit 20 wherein load 27 may be discharged, substantially to a null voltage (e.g., 0V, 0.1V, −0.1V, etc. which may be due to a short circuit or near-short circuit across load 27), and the current flowing through inductor 22 may be substantially a null current (e.g., 0 A, 0.1 A, −0.1 A, etc. which may be due to a short circuit or near-short circuit across inductor 22).

In this state, switches $S_1$ and $S_3$ may be turned OFF (e.g., nonconducting) and switches $S_2$ and $S_4$ may be turned ON (e.g., conducting) which, in turn, causes a short circuit or near-short circuit across inductor 22. As a result, voltage 29 across inductor 22 may be a null voltage and a freewheeling current, e.g. current due to energy stored in the inductor's inductance, may flow through inductor 22.

Figure 13B:
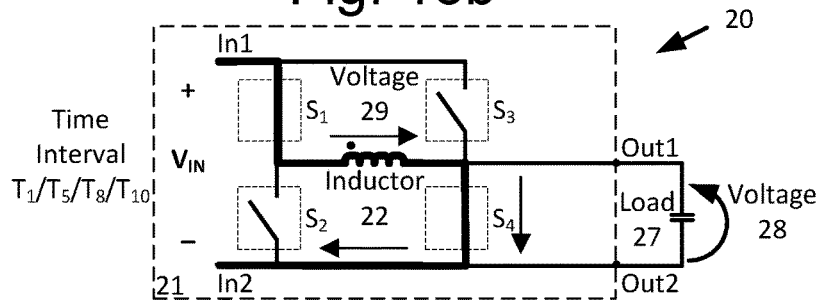

FIG. 13b illustrates a state of circuit 20 charging inductor 22 positively. In this configuration, switches $S_2$ and $S_3$ may be turned OFF (e.g., nonconducting) and switches $S_1$ and $S_4$ may be turned ON (e.g., conducting) which, in turn, forms a closed loop through inductor 22 and input terminals In1 and In2 receiving an input DC power (e.g., $V_{IN}$). When voltage 28 across load 27 is about 0V (as may be the case in FIG. 13a) and drive 21 changes to the state as shown in FIG. 13b, e.g., due to a pre-charge signal Pre1 based on a previous enable signal En1, voltage 29 increases to voltage level $+V_{IN}$. As a result of voltage 29 being about $+V_{IN}$, current flowing through inductor 22 (instantaneous current entering inductor's 22 'dot' end) may increase positively, by virtue of the characteristics of inductive elements. In some aspects, the increase of the current flowing through inductor 22 may be linear.

Figure 13C:
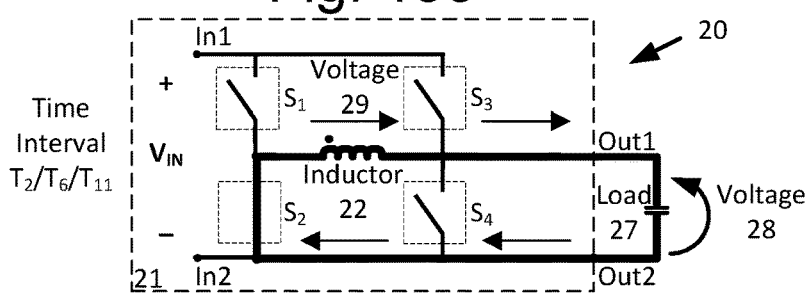

FIG. 13c illustrates a charging/regulation of voltage 28 across load 27 towards a voltage level $+V_{IN}$(e.g., 12V), by circuit 20. In this state, switches $S_1$, $S_3$ and $S_4$ may be turned OFF (e.g., nonconducting) and switch $S_2$ may be turned ON (e.g., conducting) which, in turn, inductor 22 and load 27 form a closed loop with resonant characteristics. When voltage 28 across load 27 is about a null voltage (e.g., 0V) and the current flowing through inductor 22 is equal or above a threshold level (e.g., 1 A, 2 A, 5 A, 10 A) (as may be the case in FIG. 13b), changing the state of drive 21 as shown in FIG. 13c may transfer power from inductor 22 to load 27, e.g., due to a subsequent enable signal En1. The threshold value may be calculated/estimated such that the energy stored in the magnetic field of inductor 22 (e.g., $E_L=\frac{1}{2}LI^2$ where L represents the inductance of inductor 22) may be equal to the energy required to charge load 17 to a voltage level V (e.g., $E_C=\frac{1}{2}CV_{IN}^2$ where C represents the load capacitance). By virtue of the resonant characteristics, voltage 28 across load 27 may increase positively and similarly to a sine wave. Voltage 29 across inductor 22 may decrease accordingly in the opposite polarity. The current flowing through inductor 22 may decrease similarly to a sine wave, due to the resonant behavior of circuit 20 during the state shown in FIG. 13c. Voltage 28 may increase until reaching a voltage level about $+V_{IN}$ (e.g., 12V), or the level of the current flowing through inductor 22 reaches to about a null current (e.g. 0 A, 0.1 A, −0.1 A or another current corresponding to a ripple current or a noise), or drive 21 changes the state of switches $S_1$-$S_4$.

Figure 13D:
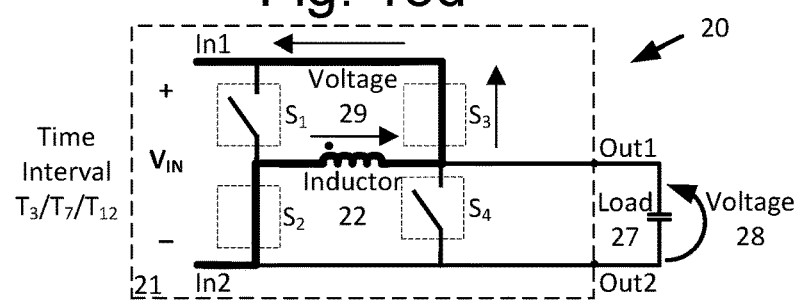

FIG. 13d illustrates a state of circuit 20 enabling a current flowing through inductor 22 to flow back to input terminal In1 (e.g., positive terminal). Accordingly, energy stored in inductor 22 is returned to the input power supply coupled to input terminals In1 and In2. In this state, switches $S_1$ and $S_4$ may be turned OFF (e.g., nonconducting) and switches $S_2$ and $S_3$ may be turned ON (e.g., conducting) which, in turn, forms a closed loop through inductor 22 and input terminals In1 and In2 receiving an input DC power (e.g., $V_{IN}$). When (i) voltage 28 across load 27 is about voltage level $+V_{IN}$ (e.g., 12V), (ii) voltage 29 is about voltage level $-V_{IN}$ (e.g., −12V), and (iii) a current is entering inductor's 22 'dot' end, changing the state of drive 21 as shown in FIG. 13d may transfer power/current from inductor 22 back to the power supply via input terminal In1 (e.g., positive terminal).

Figure 13E:
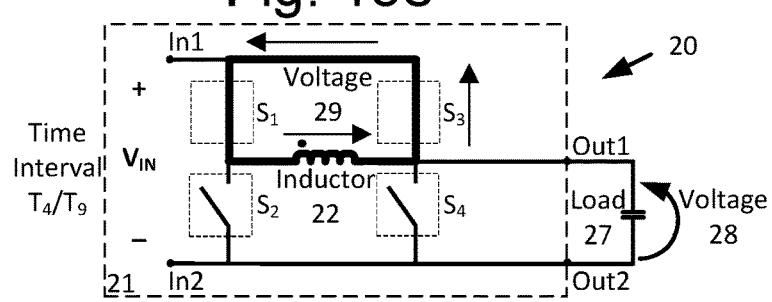

FIG. 13e illustrates a state of circuit 20 wherein load 27 may be charged, substantially to voltage level $+V_{IN}$ (e.g., 12V), and the current flowing through inductor 22 may be substantially a null current (e.g., 0 A, 0.1 A, −0.1 A, etc. which may be due to a short circuit or near-short circuit across inductor 22).

In this state, switches $S_2$ and $S_4$ may be turned OFF (e.g., non conducting) and switches $S_1$ and $S_3$ may be turned ON (e.g., conducting) which, in turn, causes a short circuit or near-short circuit across inductor 22. As a result, voltage 29 across inductor 22 may be a null voltage and a freewheeling current may flow through inductor 22.

Figure 13F:
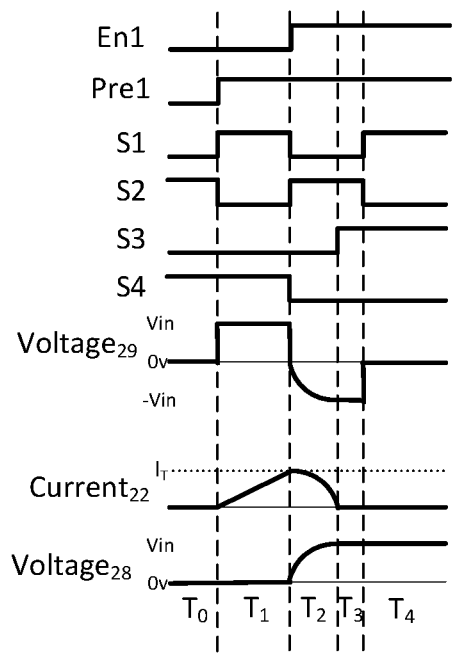
FIGS. 13f-13i illustrate timing diagrams of an electrical circuit according to aspects of the disclosure.
Figure 13G:
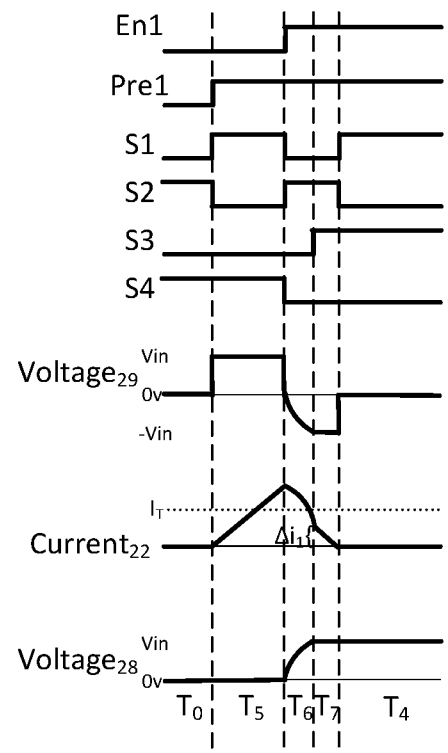

Reference is now made to FIGS. 13f and 13g. FIGS. 13f and 13g illustrate timelines showing waveforms that describe, according to some aspects of the disclosure, changes to voltage 28 (e.g., the voltage across load 27 in FIGS. 13a-13e), as a function of changing the state of switching circuit 25—the states of switches $S_1$-$S_4$ (e.g., turned OFF/ON) controlled by corresponding control signals. Changing the state of switches $S_1$-$S_4$ of switching circuit 25 may change voltage 29 (e.g., the voltage applied across inductor 22 in FIGS. 13a-13e) and the current flowing through inductor 22, according to implementations of the steps discussed above with respect to FIGS. 13a-13e. The waveforms may be part of a periodic waveform or of an interval with periodic characteristics.

Time intervals $T_0$, $T_1$, $T_2$, $T_3$, $T_4$, $T_5$, $T_6$, and $T_7$ represent the duration of a state of switches $S_1$-$S_4$, in accordance with the steps described above with respect to FIGS. 13a-13e respectively. The duration of each state during each time interval may be controlled in accordance with one or more enable signals and/or pre-charge signals (e.g., pulse width modulated signals).

Each waveform in FIGS. 13f and 13g describes a sequence of states of switches $S_1$-$S_4$, according to some aspects of the disclosure, that may charge voltage 28 from a null voltage to a voltage level of about $+V_{IN}$ (e.g., 12V). The waveforms depict the main characteristics of voltages 28 and 29 and the current flowing through inductor 22 throughout time intervals $T_0$-$T_7$ and some of the transitions between voltage/current levels as being immediate. However, it should be understood that the transitions might not be immediate and some of the currents shown in FIGS. 13a-13e may flow throughout the transitions.

In some aspects, the duration of a particular time interval may remain constant for each interval of the particular voltage level. In other cases, the duration of a particular voltage level may change over time for each interval of the particular voltage level. For example, $T_1$ may last 5 ms/50 ns/5 ns in a first cycle, while in the following cycle $T_1$ may last 3 ms/30 ns/3 ns. This change in intervals may be due to changes in the timing of enable signals EN generated by controller 20 based on feedback and/or predictions.

FIG. 13f illustrates a sequence of states of switches $S_1$-$S_4$ (of switching circuit 25) that may pre-charge inductor 22 based on a pre-charge signal and may, based on an arrival of a subsequent enable signal, transfer power stored in inductor 22 to charge load 27.

For example, a zero voltage and a zero current may be assumed to be the initial voltage value of voltage 28 and current value of inductor 22, respectively. During time interval $T_0$ of FIG. 13f, controller 26/drive 21 may, by controlling switches $S_2$ and $S_4$ to be turned ON and switches $S_1$ and $S_3$ to be turned OFF, apply a null voltage across inductor 22 and maintain the current flowing through inductor 22 at about 0 A and voltage 28 at about 0V.

During time interval $T_1$ of FIG. 13f, controller 26/drive 21 may, by controlling switches $S_1$ and $S_4$ to be turned ON and switches $S_2$ and $S_3$ to be turned OFF, apply voltage $+V_{IN}$ (e.g., 12V) across inductor 22 and charge inductor 22. Following the above example, when (i) voltage 29 is still at about a null voltage level, the current flowing through inductor 22 is about a null current and (ii) drive circuit 21 changes, based on an arrival of pre-charge signal Pre1 estimated and generated by synchronization circuit 23 (not shown), to the state where switches $S_1$-$S_4$ are in states as shown in FIG. 13b, a corresponding voltage $+V_{IN}$ (e.g., 12V) may be induced across inductor 22 thereby inducing an increasing magnetic field and storing power in the winding(s) of inductor 22.

During time interval $T_2$ of FIG. 13f, controller 26/drive 21 may, by controlling switch $S_2$ to be turned ON and switches $S_1$, $S_3$ and $S_4$ to be turned OFF, transfer power stored in inductor 22 to charge load 27 to voltage level $+V_{IN}$ (e.g., 12V). Following the above example, when (i) voltage 28 is still at about a null voltage level, (ii) the current flowing through inductor 22 increases to a threshold value $I_T$ (e.g., 1 A, 2 A, 5 A), and (iii) drive circuit 21 changes, based on an arrival of signal En1, to the state where switches $S_1$-$S_4$ are in states as shown in FIG. 13c, power stored in inductor 22 may be transferred to charge load 27 to voltage level $+V_{IN}$ (e.g., 12V), by virtue of the closed loop with resonant characteristics. If and when voltage 28 increases to voltage level $+V_{IN}$ (e.g., 12V), substantially zero energy may be stored in inductor 22.

During time interval $T_3$ of FIG. 13f, controller 26/drive 21 may control switches $S_2$ and $S_3$ to be turned ON and switches $S_1$ and $S_4$ to be turned OFF. Following the above example, when (i) voltage 28 is about voltage level $+V_{IN}$ (e.g., 12V) and (ii) the current flowing through inductor 22 is substantially zero, controller 26 may turn ON switch $S_3$ thereby applying voltage level $-V_{IN}$ (e.g., -12V) across inductor 22. In some aspects, the applied voltage may generate a magnetic field (e.g., opposite to the magnetic field generated in time interval $T_1$) and store power in the winding(s) of inductor 22.

During time interval $T_4$ of FIG. 13f, controller 26/drive 21 may control switches $S_1$ and $S_3$ to be turned ON and switches $S_2$ and $S_4$ to be turned OFF. Following the above example, when (i) voltage 28 is about voltage level $+V_{IN}$ (e.g., 12V) and (ii) controller 26 changes the states of switches $S_1$-$S_4$ as shown in FIG. 3e, voltage 29 across inductor 22 may be a null voltage and a freewheeling current may flow through inductor 22. As a result, voltage 28 and the current flowing through inductor 22 may maintain the voltage and current levels respectively. As a result, voltage 29 across inductor 22 may be a null voltage and a freewheeling current may flow through inductor 22.

The states of switching circuit 25/drive 21 during time intervals $T_0$, $T_5$, $T_6$, $T_7$ and $T_4$ of FIG. 13g may be similar to the states of drive 21 during intervals $T_0$, $T_1$, $T_2$, $T_3$ and $T_4$ of FIG. 13f respectively. The duration of the corresponding time intervals of FIGS. 13f and 13g may be similar or different and, in consequence, the permutations (e.g., change(s) of voltage(s)/current(s)) of drive 21 may be similar or different.

For example, time interval $T_5$ may be longer than time interval $T_1$, such that inductor 22 may be charged to a current level above threshold value $I_T$ as illustrated in FIG. 13g. As a result of charging inductor 22 to a current above threshold value $I_T$, when voltage 28 increases to voltage level $+V_{IN}$ (e.g., 12V) at the end of time interval $T_6$ power/energy may still be stored in the magnetic field of inductor 22 and a current (e.g., at level $\Delta i_1$) may still flow through inductor 22. Charging voltage 28 with a current above threshold value $I_T$ may speed up the charging, such that time interval $T_6$ may be about equal to or shorter than time interval $T_2$. During time interval $T_7$ of FIG. 13g, when drive 21 applies voltage level $-V_{IN}$ (e.g., -12V) across voltage 29 and a current entering inductor's 22 'dot' end is flowing, drive 21 may enable power/current stored in the magnetic field of inductor 22 to flow back to the power supply via input terminal In1 (e.g., positive terminal). Hence, energy at a level $E_L = \frac{1}{2} L \Delta I_1^2$ (e.g., where L represents the inductance of inductor 22) consumed during charging/regulating load's input voltage, may be reused by drive 21.

Figure 13H:
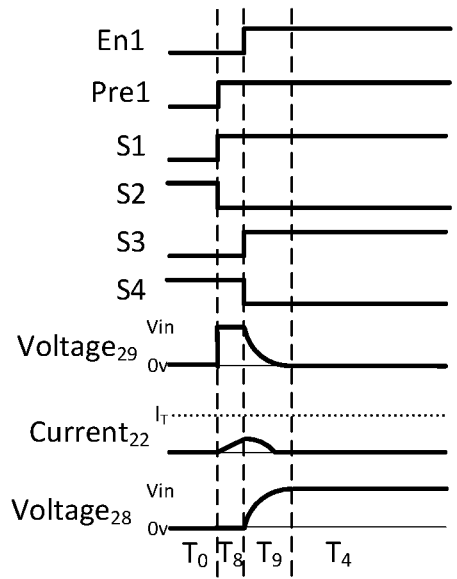
Figure 13I:
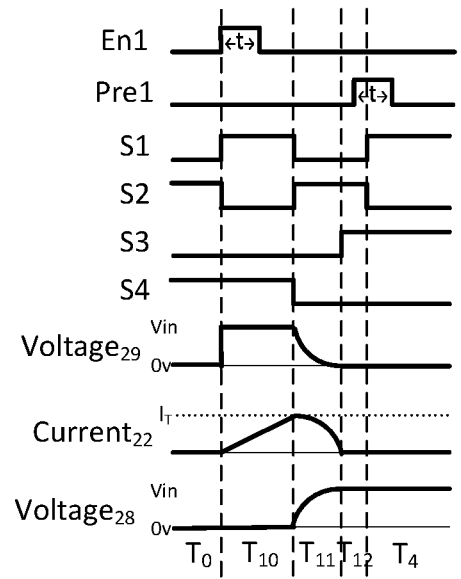

Reference is now made to FIGS. 13h and 13i. FIGS. 13h and 13i illustrate timelines showing waveforms that describe, according to some aspects of the disclosure, change of voltage 28 (e.g., the voltage across load 27 in FIGS. 13a-13e), as a function of changing the state of switches $S_1$-$S_4$ (e.g., turned OFF/ON) controlled by corresponding control signals.

The sequences of states of switches $S_1$-$S_4$ described in FIGS. 13h and 13i, according to some aspects of the disclosure, may demonstrate a wide-dynamic range of features and a flexible and adaptable control system for drive 21 to meet different requirements, and/or specifications, and/or design considerations. For example, drive 21 may support a scenario where enable signal En1 does not have periodic features and/or a scenario where synchronization circuit 23 might not completely accurately estimate/predict an arrival time of enable signal En1.

For example, FIG. 13h illustrates a sequence of states of switches $S_1$-$S_4$, according to some aspects of the disclosure, where enable signal En1 arrives before drive 21 charges inductor 22 to threshold value $I_T$ (e.g., 1 A, 2 A, 5 A).

During time interval $T_8$ of FIG. 13h, drive 21 may control switches $S_1$ and $S_4$ to be turned ON and switches $S_2$ and $S_3$ to be turned OFF, based on arrival of pre-charge signal Pre1. Following time interval $T_0$ (e.g., may be similar to time interval $T_0$ of FIGS. 13f and 13g), when voltage 28 across load 27 is about 0V and drive 21 changes the states of switches $S_1$-$S_4$ as shown in as shown in FIG. 13b, voltage 29 increases to about voltage level +$V_{IN}$. As a result of voltage 29 being about +$V_{IN}$, a current flowing through inductor 22 and the magnetic field of inductor 22 may increase positively (instantaneous current entering inductor's 22 'dot' end).

As shown in the timeline illustrated in FIG. 13h, in some aspects enable signal En1 may arrive before drive 21 charges inductor 22 to threshold value $I_T$ (e.g., 1 A, 2 A, 5 A). Decision-making circuits, e.g., control circuit 26, may be configured to decide, according to priorities and requirements of drive 21 (e.g., timing considerations, efficiency considerations, decision rules, etc.), in which sequence of states of switches $S_1$-$S_4$ to charge load 27. This example illustrates a charging sequence where the timing considerations are prioritized over efficiency considerations. Hence, with an occurrence of enable signal En1, drive 21 may change states of switches $S_1$-$S_4$ to a state of fast charging. During time interval $T_9$ of FIG. 13h drive 21 may turn ON switch $S_3$ and turn OFF switch $S_4$, such that load 27 may be charged by: (i) energy stored in the magnetic field of inductor 22 during time interval $T_8$, or (ii) energy supplied directly from the power supply through input terminals In1 and In2 via switches $S_1$ and $S_3$. In this case, there would be no change of the states of the switches between time interval $T_9$ and time interval $T_4$.

Another example for a case where enable signal En1 arrives before drive 21 charges inductor 22 to threshold value $I_T$, due to a not completely accurate estimation/prediction of the arrival time of the following enable signal En1, is shown in FIG. 13i. FIG. 13i illustrates a scenario where enable signal En1 arrives before pre-charge signal Pre1 (e.g., a signal indicating drive 21 to generate current through inductor 22).

When voltage 29 is still about a null voltage level (e.g., 0V) and the current flowing through inductor 22 is about zero, enable signal En1 may arrive indicating drive 21 to charge/regulate load 27 to voltage level +$V_{IN}$ (e.g., 12V). Decision-making circuits, e.g., control circuit 26, may be configured to decide, according to priorities and requirements of drive 21 (e.g., timing considerations, efficiency considerations, decision rules, etc.), in which sequence of states of switches $S_1$-$S_4$ to charge load 27. This example illustrates a charging sequence where the efficiency considerations/decision rules are prioritized over timing considerations/decision rules. Hence, with an occurrence of enable signal En1, controller 26/drive 21 may change states of switches $S_1$-$S_4$ to a state of charging inductor 22 (as shown in FIG. 13b) during time interval $T_{10}$ of FIG. 13i, prior to transferring energy to load 27 in time interval $T_{11}$. During time intervals $T_{11}$ and $T_{12}$ circuit 21 may be in a state described in FIGS. 13c and 13d.

In some aspects, circuit 20/drive 21 may monitor load 27 (i.e., charge and discharge) based on a rise of enable signal En1. For example, in FIG. 13i drive 21 may charge load 27 with an occurrence of enable signal En1 having a predetermined signal duration 't' (e.g., 10 ns, 100 ns, 1 μs, 100 μs, 1 ms, 10 ms).

In some aspects, drive 21 may charge load 27 and maintain load 27 charged based on a rise of enable signal En1, and may discharge load 27 and maintain load 27 discharged based on a decrease/fall of enable signal En1, e.g., as shown in FIGS. 13f, 13g, and 13h.

Reference is now made to FIGS. 14a-14f. FIGS. 14a-14e illustrate diagrams of an electrical circuit (e.g., a drive circuit with synchronization system) according to aspects of the disclosure herein. FIGS. 14a-14e illustrate possible states of the drive circuit control (e.g. switching circuit) of circuit 20 of FIG. 12 in accordance with embodiments herein. The control may be determined by controller 26, according to one or more electrical parameters of circuit 20 of FIG. 12, for example applied voltage 29, output voltage 28, current flowing through inductor 22, etc.

Figure 14A:
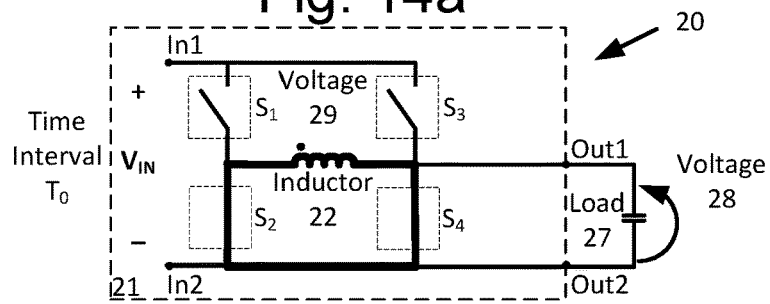
FIGS. 14a-14e illustrate diagrams of an electrical circuit according to aspects of the disclosure.
Figure 14B:
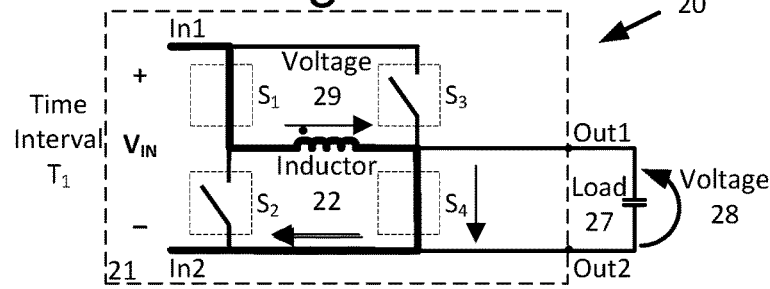
Figure 14C:
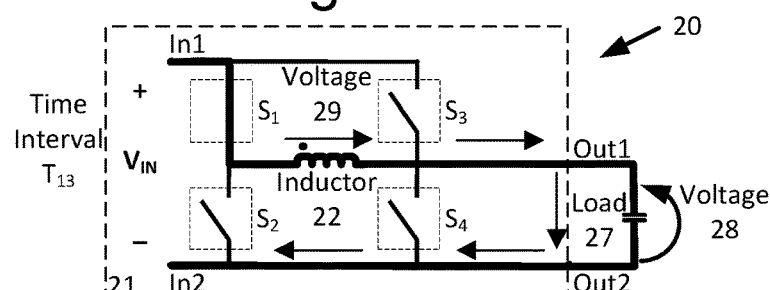
Figure 14D:
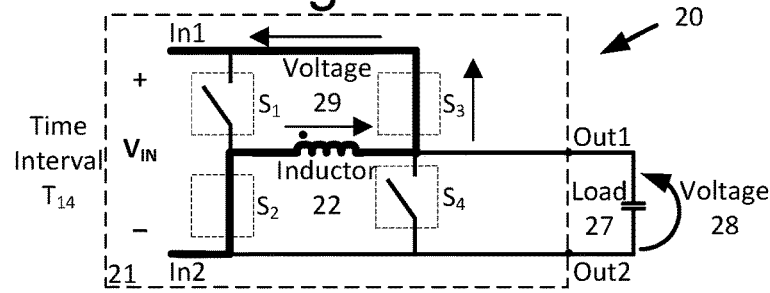
Figure 14E:
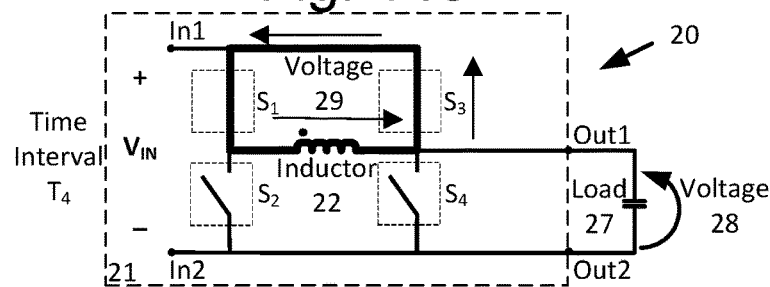
Figure 14F:
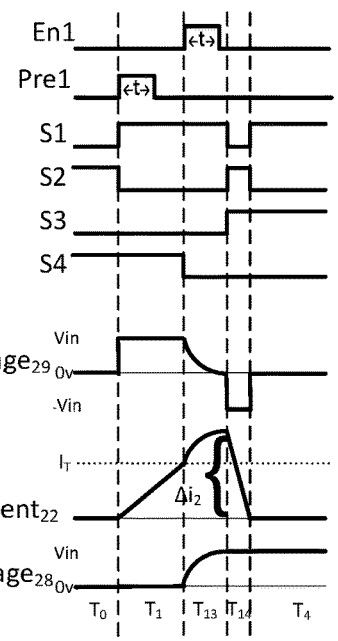
FIG. 14f illustrates a timing diagram of an electrical circuit according to aspects of the disclosure.

FIG. 14f illustrates a timeline showing waveforms that describe, according to some aspects of the disclosure with respect to FIGS. 14a-14e, monitoring voltage 28 (e.g., the voltage across load 27 in FIGS. 14a-14e), as a function of an occurrence of enable signal En1 and/or an occurrence of pre-charge signal Pre1.

In some aspects, enable signal En1 may provide an indication to drive 21 to monitor (e.g., charge/discharge) and change voltage 28, based on being ON/OFF for a predetermined amount of time. For example, enable signal En1 of FIG. 14f (and as a consequence pre-charge signal Pre1) may be a normally OFF signal. When enable signal En1 of FIG. 14f is ON for a predetermined amount of time ($t_{min}$) or longer (e.g., t≥$t_{min}$), controller 26 may start a monitoring/regulating operation (e.g., charging/discharging) of load 27.

In some aspects, decision-making circuits, e.g., of control circuit 26, drive 21, etc., may prioritize timing considerations according to design considerations and requirements of drive 21, e.g. based on one or more decision rules. In such cases, drive 21 may implement a sequence of states of switches S1-S4 that may accelerate the charging of load 27. FIG. 14f illustrates a sequence of states of switches S1-S4 that may accelerate the charging of load 27.

During time intervals $T_0$, $T_1$, and $T_4$ of FIG. 14f, the state of drive 21 may be similar to the state of drive 21 during intervals $T_0$, $T_1$, and $T_4$ of FIG. 13f respectively, as shown in FIGS. 14a, 14b and 14e. The length/width of the corresponding time intervals of FIGS. 14f and 13f may be similar or different and, in consequence, the permutations (e.g., change(s) of voltage(s)/current(s)) of drive 21 may be similar or different.

During time interval $T_1$ of FIG. 14f, drive 21 may, by controlling switches $S_1$ and $S_4$ to be turned ON and switches $S_2$ and $S_3$ to be turned OFF, apply voltage +$V_{IN}$ (e.g., 12V) across inductor 22 and charge inductor 22 (as illustrated in FIG. 14b).

When (i) voltage 29 is still about zero voltage level, (ii) the current flowing through inductor 22 is about zero, and (iii) drive circuit 21 changes, based on an arrival of pre-charge signal Pre1 determined and generated by synchronization circuit 23 (not shown), to the state where switches $S_1$-$S_4$ are in states as shown in FIG. 14b, a corresponding voltage +$V_{IN}$ (e.g., 12V) may be induced across inductor 22 thereby inducing an increasing magnetic field and storing power in the windings of inductor 22.

Following the example above referring to time interval $T_1$, when voltage 28 is still about zero voltage level, the current flowing through inductor 22 increases to a threshold value $I_T$ (e.g., 1 A, 2 A, 5 A) and drive circuit 21 changes, based on an arrival of signal En1, to the state where switches $S_1$-$S_4$ are in states as shown in FIG. 14c.

FIG. 14c illustrates a charging/regulation of voltage 28 across load 27 to voltage level $+V_{IN}$ (e.g., 12V), by circuit 21. In this configuration, switches $S_2$, $S_3$ and $S_4$ may be turned OFF (e.g., nonconducting) and switch $S_1$ may be turned ON (e.g., conducting) which, in turn, inductor 22 and load 27 form via input terminals In1 and In2 a closed loop with resonant characteristics.

When voltage 28 across load 27 is about null voltage and the current flowing through inductor 22 is equal or above a threshold level (e.g., 1 A, 2 A, 5 A, 10 A), changing the state of drive 21 as shown in FIG. 14c may transfer power from the input power supply (e.g., $V_{IN}$) to load 27 via inductor 22. The power supplied by $V_{IN}$ may increase the magnetic field of inductor 22 and the current flowing through it during time interval $T_{13}$. Load 27 may be charged by the increasing current supplied from the input power supply via switch $S_1$. By virtue of the resonant characteristics, voltage 28 across load 27 may increase positively during time interval $T_{13}$ of FIG. 14f.

Voltage 228 may increase until reaching a voltage level of about $+V_{IN}$ (e.g., 12V). Charging load 27 by the increasing current may speed up the charging of load 27. For example, time interval $T_{13}$ of FIG. 14f may be about equal to or shorter than time interval $T_2$ of FIG. 13f, by virtue of the charging and transferring power directly from the input power supply and the pre-charged current (e.g., above threshold value $I_T$).

As a result of charging load 27 as illustrated in the example above, when voltage 28 increases to voltage level $+V_{IN}$ (e.g., 12V) at the end of time interval $T_{13}$, the magnetic field of inductor 22 may still store energy and a current (e.g., at level $\Delta i_2$) may still flow through inductor 22.

Hence, controller 26 may change the state of drive 21 as shown in FIG. 14d—switches $S_2$, $S_3$ may be turned ON and switches $S_1$ and $S_4$ to be turned OFF, thereby applying voltage level $-V_{IN}$ (e.g., -12V) across voltage 29.

During time interval $T_{14}$ of FIG. 14f, when drive 21 applies voltage level $-V_{IN}$ (e.g., -12V) across voltage 29 and a current entering inductor's 22 'dot' end is flowing (as illustrated in FIG. 14d), drive 21 may enable power/current stored in the magnetic field of inductor 22 to flow back to the power supply via input terminal In1 (e.g., positive terminal). Hence, energy at a level $E_L=\frac{1}{2}L\Delta I_2^2$ (e.g., where L represents the inductance of inductor 22) consumed during charging/regulating load's input voltage, may be reused by drive 21. When the energy stored in the magnetic field of inductor 22 and the current flowing through inductor 22 may decrease to about zero, controller 26 may change the configuration of drive 21 as shown in FIG. 14e—switches $S_1$, $S_3$ may be turned ON and switches $S_2$ and $S_4$ to be turned OFF. As a result, voltage 29 across inductor 22 may be a null voltage and a freewheeling current may flow through inductor 22.

Figure 15A:
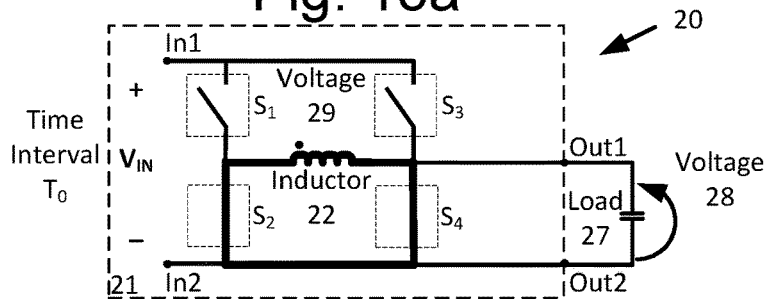
FIGS. 15a-15e illustrate diagrams of an electrical circuit according to aspects of the disclosure.
Figure 15B:
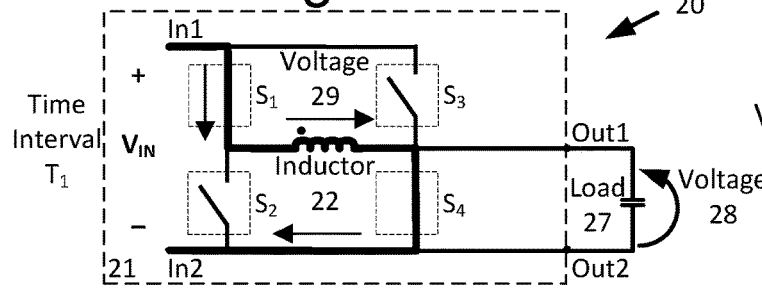
Figure 15C:
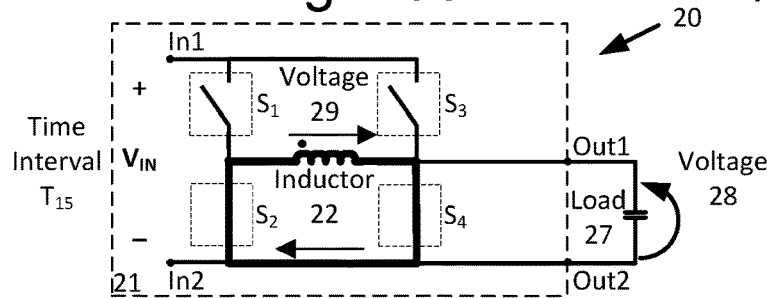
Figure 15D:
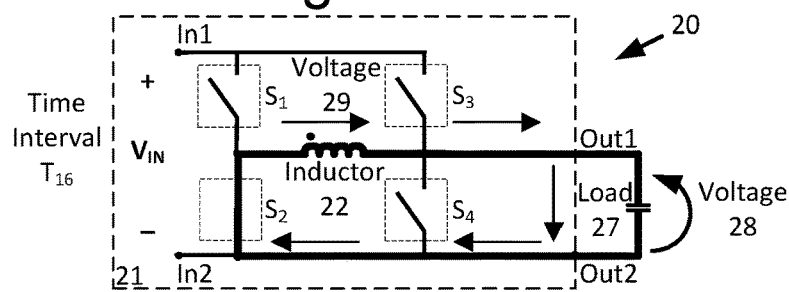
Figure 15E:
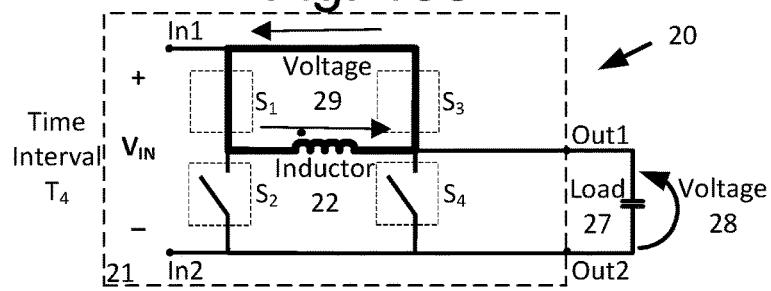
Figure 15F:
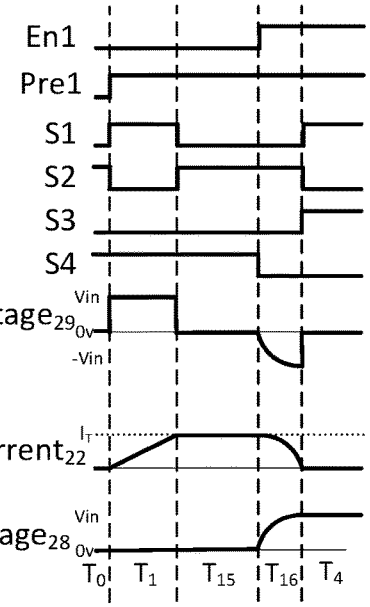
FIG. 15f illustrates a timing diagram of an electrical circuit according to aspects of the disclosure.

Reference is now made to FIGS. 15a-15f. FIGS. 15a-15e illustrate diagrams of an electrical circuit (e.g., a drive circuit with synchronization system) according to aspects of the disclosure herein. FIGS. 15a-15e illustrate possible states of the drive circuit control (e.g. switching circuit) of circuit 20 of FIG. 12 in accordance with embodiments herein. The control may be determined by controller 26, according to one or more electrical parameters of circuit 20 of FIG. 12, for example applied voltage 29, output voltage 28, current flowing through inductor 22, etc. FIG. 15f illustrates a timeline showing waveforms that describe, according to some aspects of the disclosure, based on FIGS. 15a-15e, monitoring voltage 28 (e.g., the voltage across load 27 in FIGS. 15a-15e), as a function of an occurrence of enable signal En1 and/or an occurrence of pre-charge signal Pre1.

In some aspects, decision-making circuits, e.g., of control circuit 26, drive 21, etc., may prioritize timing considerations according to design considerations and requirements of drive 21, e.g. based on one or more decision rules. In such cases, drive 21 may implement a sequence of states of switches S1-S4 that may pre-charge the current flowing through inductor 22 to or above a threshold value $I_T$ (e.g., 1 A, 2 A, 5 A), such that with an arrival of enable signal En1, drive 21 may have a pre-charged current that may speed up the charging of load 27.

Threshold value $I_T$ may be calculated/estimated such that the energy stored in the magnetic field of inductor (e.g., $E_L=\frac{1}{2}LI^2$ where L represents the inductance of inductor 22) may be equal to the energy required to charge load 27 to a voltage level V (e.g., $E_C=\frac{1}{2}CV^2$ where C represents the load capacitance).

During time intervals $T_0$, $T_1$, and $T_4$ of FIG. 15f, the states of drive 21 may be similar to the states of drive 21 during intervals $T_0$, $T_1$, and $T_4$ of FIG. 13f respectively, as shown in FIGS. 15a, 15b and 15e. The duration of the corresponding time intervals of FIGS. 15f and 13f may be similar or different and, in consequence, the permutations (e.g., change(s) of voltage(s)/current(s)) of drive 21 may be similar or different.

During time interval $T_1$ of FIG. 15f, drive 21 may, by controlling switches $S_1$ and $S_4$ to be turned ON and switches $S_2$ and $S_3$ to be turned OFF, apply voltage $+V_{IN}$ (e.g., 12V) across inductor 22 and charge inductor 22.

When (i) voltage 29 is still at about a null voltage level (e.g., 0V), (ii) the current flowing through inductor 22 is about zero, and (iii) drive circuit 21 changes, based on an arrival of pre-charge signal Pre1 estimated and generated by synchronization circuit 23 (not shown), to the state where switches $S_1$-$S_4$ are in states as shown in FIG. 15b, a corresponding voltage $+V_{IN}$ (e.g., 12V) may be induced across inductor 22 thereby inducing an increasing magnetic field and storing power in the winding(s) of inductor 22.

Following the example above referring to time interval $T_1$, when voltage 28 is still about zero voltage level, the current flowing through inductor 22 increases to or above a threshold value $I_T$ (e.g., 1 A, 2 A, 5 A) and drive circuit 21 changes, to the state where switches $S_1$-$S_4$ are in states as shows FIG. 15c.

FIG. 15c illustrates a state of circuit 20 wherein load 27 may be charged substantially to voltage level +VIN (e.g., 12V), and the current flowing through inductor 22 may maintain the current level of the previous state, for example equal to or above the threshold value $I_T$ (e.g., 1 A, 2 A, 5 A).

In this state, switches S1 and S3 may be turned OFF (e.g., non conducting) and switches S2 and S4 may be turned ON (e.g., conducting) which, in turn, causes a short circuit or near-short circuit across inductor 22. As a result, voltage 29 across inductor 22 may be a null voltage and a freewheeling (e.g., pre-charged) current may flow through inductor 22.

During $T_{15}$ of FIG. 15f, drive 21 may maintain the current level of the pre-charged current flowing through inductor 22, as reached in the previous state (e.g., FIG. 15b). Drive 21 may change the state based on an arrival of enable signal En1.

FIG. 15d illustrates charging/regulation of voltage 28 across load 27 to voltage level $+V_{IN}$ (e.g., 12V), by circuit 21, based on an arrival of enable signal En1. In this state, switches $S_2$, $S_3$ and $S_4$ may be turned OFF (e.g., nonconducting) and switch $S_1$ may be turned ON (e.g., conducting)

which, in turn, inductor 22 and load 27 form, via input terminals In1 and In2, a closed loop with resonant characteristics.

When voltage 28 across load 27 is at about a null voltage and the pre-charged current flowing through inductor 22 is equal or above a threshold level (e.g., 1 A, 2 A, 5 A, 10 A), changing the state of drive 21 as shown in FIG. 15d may transfer power from inductor 22 to load 27. By virtue of the resonant characteristics, voltage 28 across load 27 may increase positively during time interval $T_{16}$ of FIG. 15f.

Voltage 28 may increase until reaching a voltage level about $+V_{IN}$ (e.g., 12V). Charging load 27 by the pre-charged current (e.g., during time interval $T_{15}$) may speed up the charging of load 27.

As a result of charging load 27 as illustrated in the example above, when voltage 28 increases to voltage level $+V_{IN}$ (e.g., 12V) at the end of time interval $T_{15}$, the magnetic field of inductor 22 may still store energy and a current (e.g., at level $\Delta i_2$) may still flow through inductor 22. Drive 21 may change the configuration to decrease the energy stored in the magnetic field of inductor 22 and transfer the energy back to the power supply, for example as illustrated in FIG. 13d.

FIG. 15e illustrates a freewheeling current flowing after charging load 27. If and when the energy stored in the magnetic field of inductor 22 and the current flowing through inductor 22 decreases to about zero, controller 26 may change the state of drive 21 as shown in FIG. 14e—switches $S_1$, $S_3$ may be turned ON and switches $S_2$ and $S_4$ to be turned OFF. As a result, voltage 29 across inductor 22 may be a null voltage and a freewheeling current may flow through inductor 22.

Reference is now made to FIGS. 16a-16f. FIGS. 16a-16e illustrate diagrams of an electrical circuit (a drive circuit with synchronization system) according to aspects of the disclosure herein. FIGS. 16a-16e illustrate possible states of the drive circuit control (e.g. switching circuit) of circuit 20 of FIG. 12 in accordance with embodiments herein. The control may be determined by controller 26, according to one or more electrical parameters of circuit 20 of FIG. 12, for example applied voltage 29, output voltage 28, current flowing through inductor 22, etc.

Figure 16A:
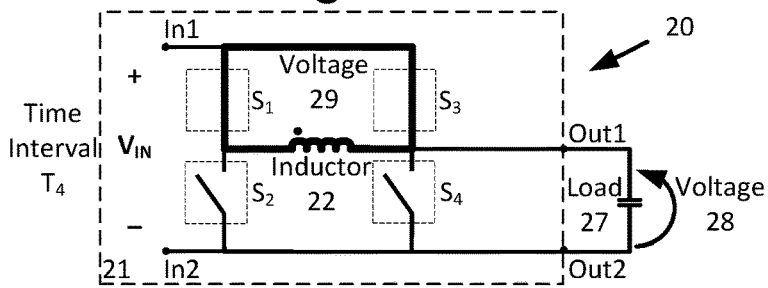
FIGS. 16a-16e illustrate diagrams of an electrical circuit according to aspects of the disclosure.
Figure 16B:
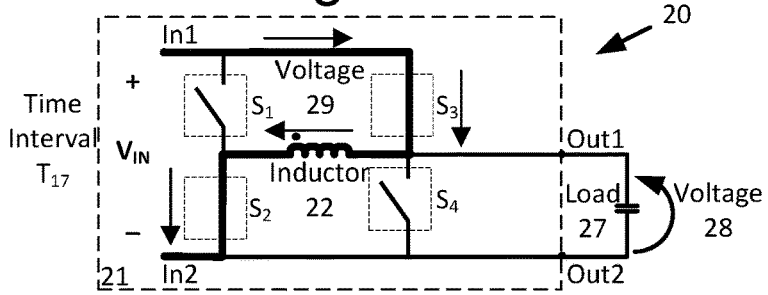
Figure 16C:
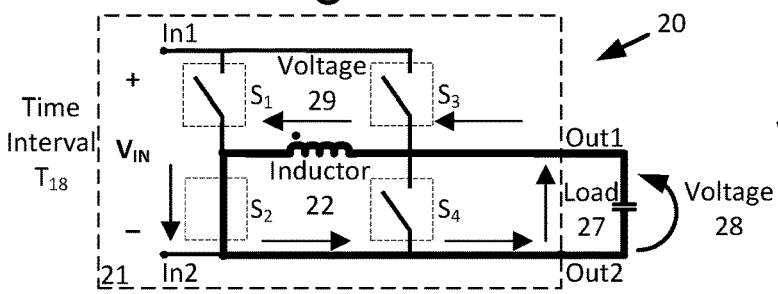
Figure 16D:
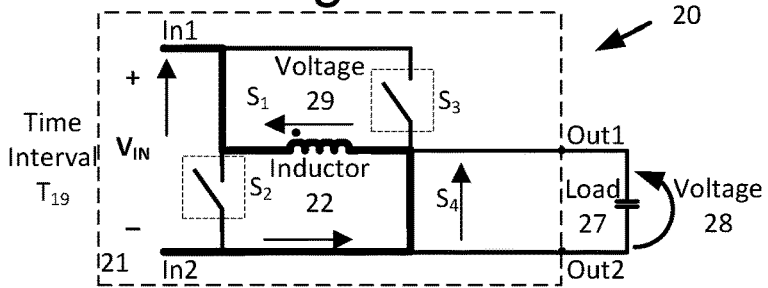
Figure 16E:
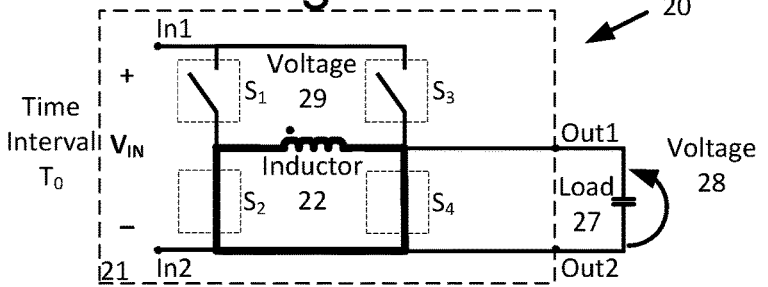
Figure 16F:
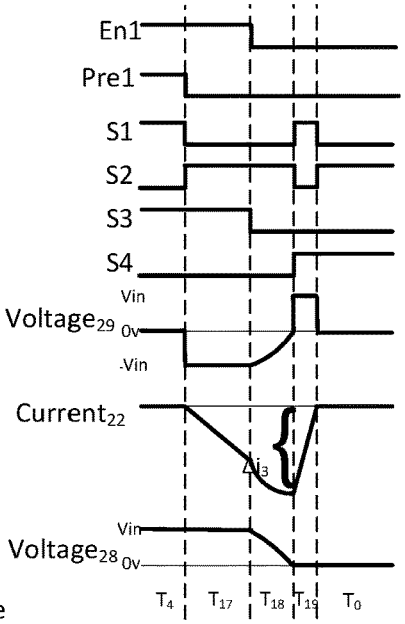
FIG. 16f illustrates a timing diagram of an electrical circuit according to aspects of the disclosure.

FIG. 16f illustrates a timeline showing waveforms that describe, according to some aspects of the disclosure with respect to FIGS. 16a-16e, monitoring (e.g., discharging) voltage 28 (e.g., the voltage across load 27 in FIGS. 16a-16e), as a function of an occurrence of enable signal En1 and/or an occurrence of pre-charge signal Pre1.

For the sake of convenience and without loss of functionality, controller 26 and synchronization circuit 23 of FIG. 12 are not shown in FIGS. 16a-16e.

FIG. 16a illustrates a state of circuit 20 wherein load 27 may be charged, substantially to voltage level $+V_{IN}$ (e.g., 12V), and the current flowing through inductor 22 may be substantially a null current (e.g., 0 A, 0.1 A, −0.1 A, etc. which may be due to a short circuit or near-short circuit across inductor 22).

In this state, switches $S_2$ and $S_4$ may be turned OFF (e.g., nonconducting) and switches $S_1$ and $S_3$ may be turned ON (e.g., conducting) which, in turn, causes a short circuit or near-short circuit across inductor 22. As a result, voltage 29 across inductor 22 may be a null voltage and a freewheeling current may flow through inductor 22.

FIG. 16b illustrates a state of circuit 20 charging inductor 22 negatively (instantaneous current flowing out of inductor's 22 'dot' end). In this state, switches $S_1$ and $S_4$ may be turned OFF (e.g., nonconducting) and switches $S_2$ and $S_3$ may be turned ON (e.g., conducting) which, in turn, forms a closed loop through inductor 22 and input terminals In1 and In2 receiving an input DC power (e.g., $V_{IN}$). When voltage 28 across load 27 is about 0V and drive 21 changes the configuration as shown in FIG. 16b, voltage 29 decreases to voltage level $-V_{IN}$. As a result of voltage 29 being about $-V_{IN}$, a current flowing through inductor 22 may increase negatively, by virtue of the characteristics of inductive elements. In some aspects, the increase of the current flowing through inductor 22 may be linear.

FIG. 16c illustrates a discharging of voltage 28 across load 27 from a voltage level about $V_{IN}$ to a null voltage (e.g., 0V, 0.1V, −0.1V, etc. which may be due to a short circuit or near-short circuit across load 27), by circuit 20. In this state, switches $S_1$, $S_3$ and $S_4$ may be turned OFF (e.g., nonconducting) and switch $S_2$ may be turned ON (e.g., conducting), such that inductor 22 and load 27 form a closed loop with resonant characteristics. When voltage 28 across load 27 is about $V_{IN}$ and the current flowing through inductor 22 is equal or above a threshold level (e.g., 1 A, 2 A, 5 A, 10 A), changing the state of drive 21 as shown in FIG. 16c may transfer power from load 27 to inductor 22. The threshold value may be calculated/estimated such that the energy stored in the magnetic field of inductor 22 (e.g., $E_L = \frac{1}{2} L I^2$ where L represents the inductance of inductor 22) may be equal to the energy stored in load 27 (e.g., $E_C = \frac{1}{2} C V_{IN}^2$ where C represents the load capacitance). By virtue of the resonant characteristics, voltage 28 across load 27 may decrease. Voltage 29 across inductor 22 may decrease accordingly in the opposite direction. The current flowing through inductor 22 may increase similarly to a sine wave, due to the resonant behavior of circuit 20 during the state shown in FIG. 16c and the release of energy from load 27. Voltage 28 may decrease until reaching a null voltage level (e.g. 0V, 0.1V, −0.1V or another current corresponding to a ripple current or a noise). Drive 21 may change the states of switches $S_1$-$S_4$ if and when voltage 28 decreases to a null voltage level.

FIG. 16d illustrates a state of circuit 20 enabling a current flowing through inductor 22 to flow back to input terminal In1 (e.g., positive terminal). Accordingly, energy stored in inductor 22 is returned to the input power supply coupled to input terminals In1 and In2. In this state, switches $S_2$ and $S_3$ may be turned OFF (e.g., nonconducting) and switches $S_1$ and $S_4$ may be turned ON (e.g., conducting) which, in turn, forms a closed loop through inductor 22 and input terminals In1 and In2 receiving an input DC power (e.g., $V_{IN}$). When (i) voltage 28 across load 27 is at about a null voltage level, (ii) voltage 29 is about voltage level $-V_{IN}$ (e.g., −12V), and (iii) a current is entering inductor's 22 'dot' end, changing the state of drive 21 as shown in FIG. 16d may transfer power/current from inductor 22 back to the power supply via input terminal In1 (e.g., positive terminal).

FIG. 16e illustrates a state of circuit 20 wherein load 27 may be discharged substantially to a null voltage level, and the current flowing through inductor 22 may be substantially a null current (e.g., 0 A, 0.1 A, −0.1 A, etc. which may be due to a short circuit or near-short circuit across inductor 22).

In this state, switches $S_1$ and $S_3$ may be turned OFF (e.g., non conducting) and switches $S_2$ and $S_4$ may be turned ON (e.g., conducting) which, in turn, causes a short circuit or near-short circuit across inductor 22. As a result, voltage 29 across inductor 22 may be a null voltage and a freewheeling current may flow through inductor 22.

Reference is now made to FIG. 16f. FIG. 16f illustrates a timeline showing waveforms that describe, according to some aspects of the disclosure, changing (e.g., discharging) voltage 28 (e.g., the voltage across load 27 in FIGS. 16a-16e), as a function of changing the state of switching circuit 25—switches $S_1$-$S_4$ (e.g., turned OFF/ON) controlled by corresponding control signals. Changing the state of switches $S_1$-$S_4$ of switching circuit 25 may change voltage 29 (e.g., the voltage applied across inductor in FIGS. 16a-16e) and the current flowing through inductor 22, according to implementations of the steps discussed above with respect to FIGS. 16a-16e. The waveforms may be part of a periodic waveform or of an interval with periodic characteristics.

Time intervals $T_4$, $T_{17}$, $T_{18}$, $T_{19}$, and $T_0$, represent the duration of a state of switches $S_1$-$S_4$, in accordance with the steps described above with respect to FIGS. 16a, 16b, 16c, 16d and 16e respectively. The duration of each voltage level during each period may be controlled in accordance with one or more enable signals (e.g., pulse width modulated signals).

The waveforms of FIG. 16f describes a sequence of states of switches $S_1$-$S_4$, according to some aspects of the disclosure, that may discharge voltage 28 from a voltage level of about +$V_{IN}$ (e.g., 12V) to about a null voltage. The waveforms depict the main characteristics of voltages 28 and 29 and the current flowing through inductor 22 throughout time intervals and some of the transitions between voltage/current levels as being immediate. However, it should be understood that the transitions might not be immediate and some of the currents shown in FIGS. 16a-16e may flow throughout the transitions.

In some aspects, the duration of a particular voltage level may remain constant for each interval of the particular voltage level. In other cases, the duration of a particular voltage level may change over time for each interval of the particular voltage level. For example, $T_{17}$ may last 5 ms/50 ns/5 ns in a first cycle, while in the following cycle $T_{17}$ may last 3 ms/30 ns/3 ns. This change in intervals may be due to changes in the timing of enable signals EN generated by controller 20 based on feedback and/or predictions.

FIG. 16f describes a sequence of states of switches $S_1$-$S_4$ (of switching circuit 25) that may pre-charge inductor 22 and may, based on an arrival of enable signal, transfer power stored in inductor 22 to charge load 27.

For example, a voltage level about +$V_{IN}$ (e.g., 12V) and a zero current may be assumed to be the initial voltage value of voltage 28 and current value of inductor 22, respectively. During time interval $T_4$ of FIG. 16f (for example may be similar to time interval $T_4$ of FIGS. 13f-13g), drive 21 may, by controlling switches $S_1$ and $S_3$ to be turned ON and switches $S_2$ and $S_4$ to be turned OFF, apply a null voltage across inductor 22 and maintain the current flowing through inductor 22 at about 0 A and voltage 28 at about 0V.

During time interval $T_{17}$ of FIG. 16f, drive 21 may, by controlling switches $S_2$ and $S_3$ to be turned ON and switches $S_1$ and $S_4$ to be turned OFF, apply voltage -$V_{IN}$ (e.g., -12V) across inductor 22 and charge inductor 22 negatively. Following the above example, when (i) voltage 29 is still about +$V_{IN}$ (e.g., 12V), (ii) the current flowing through inductor 22 is about zero level, and (iii) drive circuit 21 changes, based on an occurrence of pre-charge signal Pre1 estimated and generated by synchronization circuit 23 (not shown), to the state where switches $S_1$-$S_4$ are in states as shown in FIG. 16b, a corresponding voltage -$V_{IN}$ (e.g., -12V) may be induced across inductor 22 thereby inducing an increasing magnetic field and storing power in the winding(s) of inductor 22.

During time interval $T_{18}$ of FIG. 16f, drive 21 may, by controlling switch $S_2$ to be turned ON and switches $S_1$, $S_3$ and $S_4$ to be turned OFF, transfer power stored in load 27 to charge inductor 22. Following the above example, when (i) voltage 28 is still about +$V_{IN}$, (ii) the current flowing through inductor 22 increases, and (iii) drive circuit 21 changes, based on an arrival of signal En1, to the state where switches $S_1$-$S_4$ are in states as shown in FIG. 16c, power stored in load 27 may discharge and may be transferred to charge inductor 22, by virtue of the closed loop with resonant characteristics. When voltage 28 decreases to a null voltage level and all the energy may be stored in inductor 22, a state of drive 21 may change.

During time interval $T_{19}$ of FIG. 16f, drive 21 may control switches $S_1$ and $S_4$ to be turned ON and switches $S_2$ and $S_3$ to be turned OFF. Following the above example, when voltage 28 is at about a null voltage level and a current at level $i_3$ is flowing through inductor 22, controller 26 may turn ON switch $S_3$ thereby applying voltage level -$V_{IN}$ (e.g., -12V) across inductor 22.

In some aspects, the energy stored in the magnetic field of inductor 22 may flow back to input terminal In1, thereby reusing the energy/power consumed during charging load 27 (e.g., as shown in FIGS. 13a-13g). Hence, during time interval $T_{19}$, energy, at a level $E_L = \frac{1}{2}L\Delta I_3^2$ (e.g., where L represents the inductance of inductor 22) consumed during charging/regulating load's input voltage, may be reused by drive 21.

During time interval $T_0$ of FIG. 16f, drive 21 may control switches $S_2$ and $S_4$ to be turned ON and switches $S_1$ and $S_3$ to be turned OFF. Following the above example, when voltage 28 is at about a null voltage level and controller 26 changes the states of switches $S_1$-$S_4$ as shown in FIG. 6e, voltage 28 and the current flowing through inductor 22 may maintain the voltage and current levels, respectively. As a result, voltage 29 across inductor 22 may be a null voltage and a freewheeling current may flow through inductor 22.

Reference is now made to FIGS. 17a-17e. FIGS. 17a-17d illustrate diagrams of an electrical circuit (a drive circuit with synchronization system) according to aspects of the disclosure herein. FIGS. 17a-17d illustrate possible states of the drive circuit control (e.g. switching circuit) of circuit 20 of FIG. 12 in accordance with embodiments herein. The control may be determined by controller 26, according to one or more electrical parameters of circuit 20 of FIG. 12, for example applied voltage 29, output voltage 28, current flowing through inductor 22, etc.

Figure 17A:
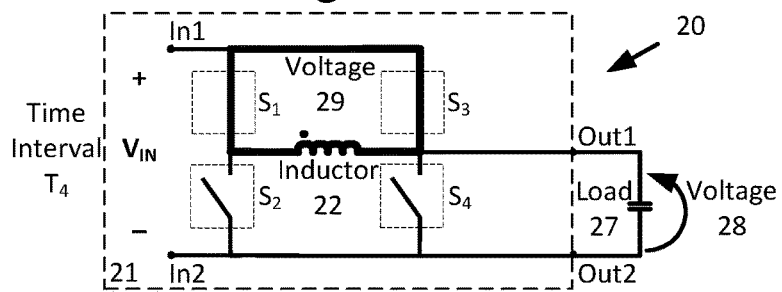
FIGS. 17a-17d illustrate diagrams of an electrical circuit according to aspects of the disclosure.
Figure 17B:
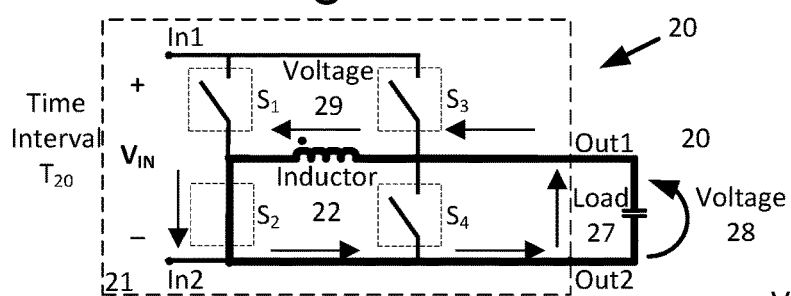
Figure 17C:
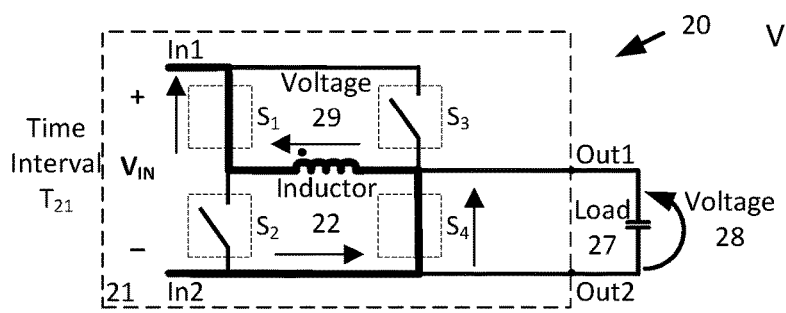
Figure 17E:
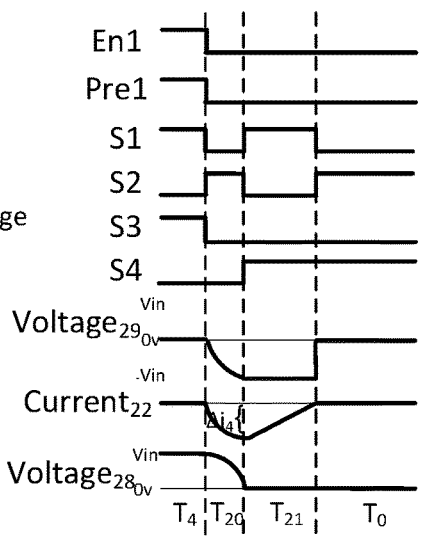
FIG. 17e illustrates a timing diagram of an electrical circuit according to aspects of the disclosure.

FIG. 17e illustrates a timeline showing waveforms that describe, according to some aspects of the disclosure based on FIGS. 17a-17d, monitoring (e.g., discharging) voltage 28 (e.g., the voltage across load 27 in FIGS. 17a-17d), as a function of an occurrence of enable signal En1 and/or an occurrence of pre-charge signal Pre1.

In some aspects, enable signal En1 may cause drive 21 to discharge load 27, before pre-charge signal Pre1 arrives or a current flowing through inductor 22 reaches a threshold level. Decision-making circuits, e.g., control circuit 26, may prioritize timing considerations according to design considerations and requirements of drive 21, e.g., based on one or more decision rules. In such cases, drive 21 may implement a sequence of states of switches S1-S4 that may discharge load 27. FIG. 17e illustrates a sequence of states of switches S1-S4 that may discharge load 27 when enable signal En1 arrives before pre-charge signal Pre1 arrives.

For example, load 27 may be gate-source capacitance of a MOSFET integrated in a power converter that operates at a fixed frequency. During the time load 27 is being charged and the MOSFET is conducting, an exception/interruption (e.g., overvoltage, overcurrent, transconductance, leakage, etc.) may be detected by controller 26 or another, such that controller 26 receives/generates an enable signal En1 to discharge load 27 and turn-off the MOSFET before pre-charge signal Pre1 arrives.

Figure 17D:
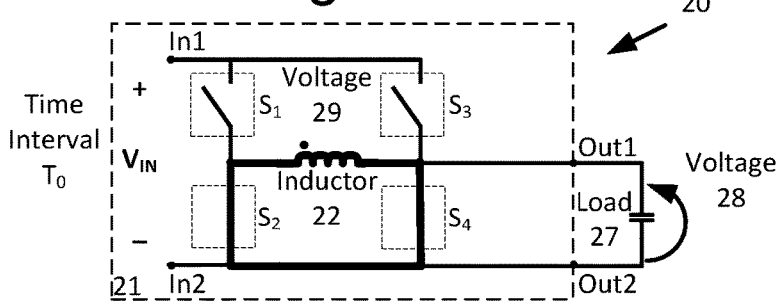

During time intervals $T_4$ and $T_0$ of FIG. 17e, the states of drive 21 may be similar to the states of drive 21 during intervals $T_4$ and $T_0$ of FIG. 16f, respectively, as shown in FIGS. 17a and 17d. The length/width of the corresponding time intervals of FIGS. 17e and 16f may be similar or different and, in consequence, the permutations (e.g., change(s) of voltage(s)/current(s)) of drive 21 may be similar or different.

During time interval $T_4$ of FIG. 17e, drive 21 may, by controlling switches $S_1$ and $S_3$ to be turned ON and switches $S_2$ and $S_4$ to be turned OFF, apply zero/null voltage across inductor 22 and enable freewheeling current to flow through inductor 22 (as shows FIG. 17b), when load 27 is charged.

Following the example above referring to time interval $T_4$, when voltage 29 is still at about a null voltage level (e.g., 0V) and the current flowing through inductor 22 is about zero or a freewheeling current, drive 21 may change, based on an arrival of enable signal En1, the states of switches $S_1$-$S_4$ as shown in FIG. 17b.

During time interval $T_{20}$ of FIG. 17e, drive 21 may, by controlling switch $S_2$ to be turned ON and switches $S_1$, $S_3$ and $S_4$ to be turned OFF, form a close loop with resonant characteristics including load 27 and inductor 22. By virtue of the resonant characteristics, voltage 28 may discharge and the power stored in load 27 may be converted and transferred to a negative increasing current flowing through inductor 22.

The increasing current flowing through inductor 22 may increase the magnetic field and the stored power in the magnetic field of the winding(s) of inductor 22.

Following the example above referring to time interval $T_1$, when voltage 28 decreases to about zero voltage level, drive circuit 21 may change the states of switches $S_1$-$S_4$ as shows FIG. 17c.

FIG. 17c illustrates a state of circuit 21 enabling a current flowing through inductor 22 to flow back to input terminal In1 (e.g., positive terminal). Accordingly, energy stored in inductor 22 is returned to the input power supply coupled to input terminals In1 and In2. In this state, switches $S_2$ and $S_3$ may be turned OFF (e.g., nonconducting) and switches $S_1$ and $S_4$ may be turned ON (e.g., conducting) which, in turn, forms a closed loop through inductor 22 and input terminals In1 and In2 receiving an input DC power (e.g., $V_{IN}$). When (i) voltage 28 across load 27 is at about a null voltage level, (ii) voltage 29 is about voltage level $-V_{IN}$ (e.g., −12V), and (iii) a current entering inductor's 22 'dot' end, changing the state of drive 21 as shown in FIG. 16d may transfer power/current from inductor 22 back to the power supply via input terminal In1 (e.g., positive terminal).

For example, during time interval $T_{21}$ of FIG. 17e, energy at a level $E_L = \frac{1}{2}L\Delta I_4^2$ (e.g., where L represents the inductance of inductor 22) consumed during charging/regulating load's input voltage, may be reused by drive 21.

During time interval $T_0$ of FIG. 17e, drive 21 may apply about a null/zero voltage across inductor 22 and a freewheeling current may flow through inductor 22.

Reference is now made to FIGS. 8a-8f. FIGS. 8a-8e illustrate diagrams of an electrical circuit 30 (a drive circuit with synchronization system), which may be an example of circuit 10 of FIG. 11a, according to aspects of the disclosure herein.

As shown in FIGS. 8a-8f, in some aspects, switching circuit 15 of FIG. 11a is a DC-DC converter and/or an H bridge circuit (e.g., an electronic circuit that may switch the polarity of a voltage applied across a load, in this case inductor 32). In some aspects, inductive element 12 of FIG. 11a is an inductor (e.g., inductor 32).

In some aspects, one or more of switches of the switching circuit may be one of a field-effect transistor (FET), a diode, a relay, and/or the like.

For example, circuit 30 includes a controller (not shown) like controller 16 of FIG. 11a, a switching circuit including H bridge circuit having MOSFETs $S_1$, $S_2$, $S_3$, $S_4$ (e.g., a full-bridge) and corresponding diodes $D_1$, $D_2$, $D_3$, $D_4$ (e.g., built-in, parasitic or in parallel), an inductor 32, a load 37, a synchronization circuit (not shown) like synchronization circuit 13 of FIG. 11a, input terminals In1-In2 (e.g., positive and negative), and output terminals Out1-Out2.

MOSFETs $S_1$, $S_2$, $S_3$, $S_4$, inductor 32, synchronization circuit, input terminals In1-In2 and output terminals Out1-Out2 may be collectively referred to as a drive 31 and configured to reduce power consumption in monitoring/controlling/regulating voltage 38 across load 37.

In operation, switching circuit may supply voltage 39 across winding(s) of inductor 32 by changing the configuration (e.g., conducting/ON or nonconducting/OFF) of MOSFETs $S_1$, $S_2$, $S_3$, $S_4$.

Each one of MOSFETs $S_1$, $S_2$, $S_3$, $S_4$ may be controlled by a corresponding control signal respectively (e.g., generated by the controller).

FIGS. 8a-8e illustrate possible states of the drive circuit control (e.g. switching circuit) of circuit 30 in accordance with embodiments herein. The control may be determined by a controller (not shown) like controller 16 of FIG. 11a, according to one or more electrical parameters of circuit 30 (for example, applied voltage 39, output voltage 38, current flowing through inductor 32) in accordance with embodiments herein.

Figure 18A:
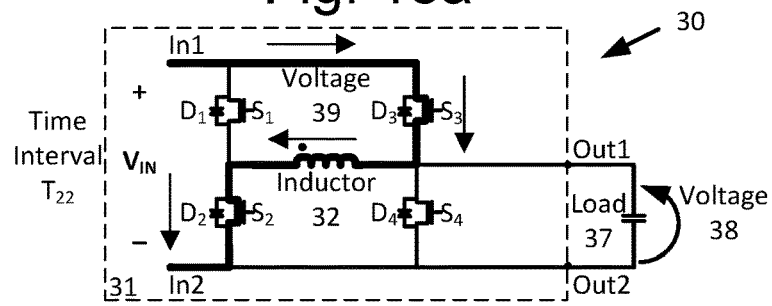
FIGS. 18a-18e illustrate diagrams of an electrical circuit according to aspects of the disclosure.
Figure 18B:
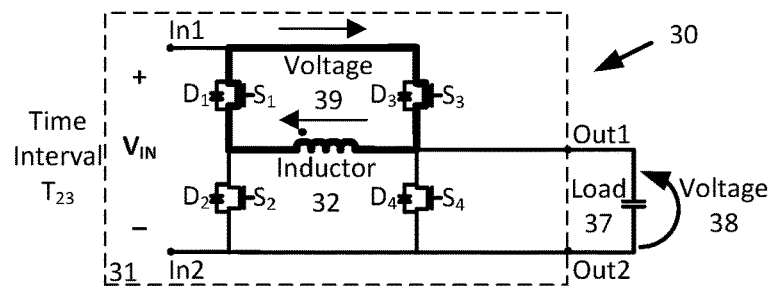
Figure 18C:
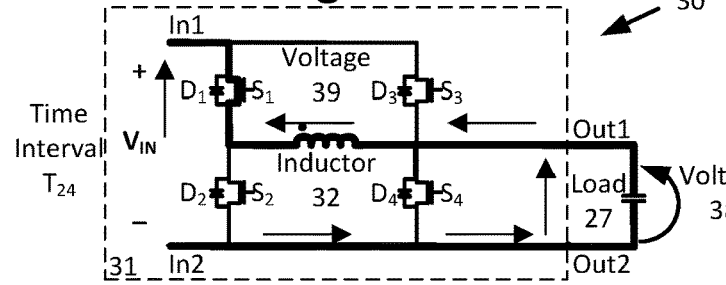
Figure 18D:
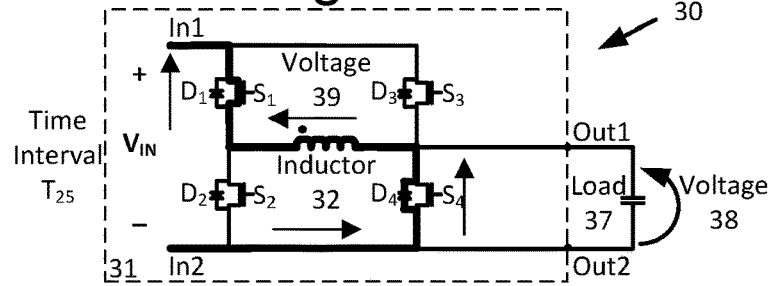
Figure 18E:
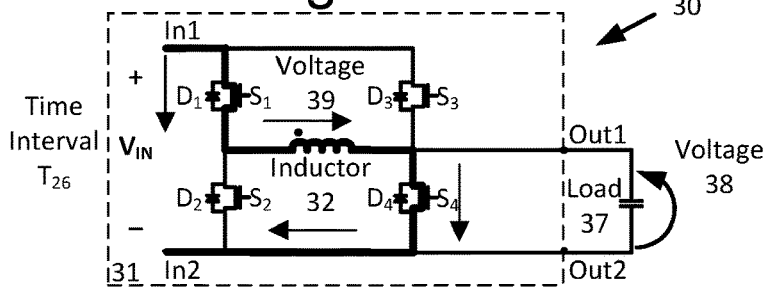
Figure 18F:
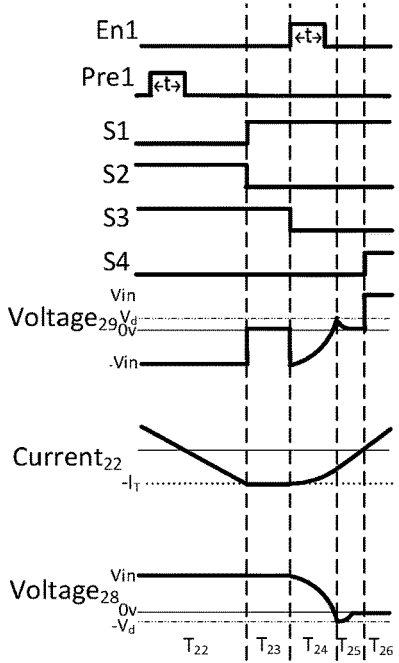
FIG. 18f illustrates a timing diagram of an electrical circuit according to aspects of the disclosure.

FIG. 18f illustrates a timeline showing waveforms that describe, according to some aspects of the disclosure with respect to FIGS. 18a-18e, monitoring (e.g., discharging) voltage 38 (e.g., the voltage across load 37 in FIGS. 18a-18e), as a function of an occurrence of enable signal En1 and/or an occurrence of pre-charge signal Pre1.

In some aspects, enable signal En1 may indicate drive 31 to monitor (e.g., charge/discharge) and change voltage 38, based on being ON/OFF for a predetermined amount of time. For example, enable signal En1 of FIG. 18f (and as a consequence pre-charge signal Pre1) may be a normally OFF signal. When enable signal En1 of FIG. 18f is on for a predetermined amount of time ($t_{min}$) or longer (e.g., $t \geq t_{min}$), the controller may start a monitoring operation (e.g., charging/discharging) of load 37.

In some aspects, decision-making circuits, e.g., the controller circuit may prioritize timing considerations according to design considerations and requirements of drive 31, based on one or more decision rules. In such cases, drive 31 may implement a sequence of states of MOSFETs $S_1$-$S_4$ that may accelerate the discharging of load 37. For example, FIG. 18f illustrates a sequence of states of MOSFETs $S_1$-$S_4$ that may accelerate the charging of load 37. For example, FIG. 18f illustrates a sequence of states the may negatively pre-charge inductor 32 based on an occurrence of pre-charge signal Pre1, such that corresponding to an occurrence of a subsequent enable signal En1, drive 31 may discharge load 37 faster.

FIG. 18a illustrates a negative charging of inductor 32 to a threshold value $-I_T$ by drive circuit 31, when load 37 is charged to voltage level $+V_{IN}$ (e.g., 12V). In this configuration, MOSFETs $S_1$ and $S_4$ may be turned OFF (e.g., nonconducting) and MOSFETs $S_2$ and $S_3$ may be turned ON (e.g., conducting) which, in turn, forms a closed loop including inductor 32 and input terminals In1 and In2. A voltage level $-V_{IN}$ (e.g., −12V) may be applied across inductor 32. The applied voltage may generate a magnetic field and store energy in the magnetic field of the winding(s) of inductor 32.

In some aspects, the negative charging of inductor 32 may follow a state of discharging inductor 32 and a decrease of a positive current flowing through inductor 32, for example as illustrated in FIGS. 13d and 14d. For example, during time interval $T_{22}$ of FIG. 18f, when drive 31 discharges inductor 32 and decreases a positive current flowing through inductor 32, pre-charge signal Pre1 may occur. As a consequence, drive 31 may maintain the states of MOSFETs $S_1$-$S_4$ to negatively charge inductor 32 until reaching threshold value $-I_T$ or greater.

Following the example above referring to time interval $T_{22}$ and FIG. 18a, when voltage 38 is still about voltage level $+V_{IN}$ (e.g., 12V) and current 32 increases negatively to a threshold value $-I_T$ (e.g., −1 A, −2 A, −5 A) or greater, drive circuit 31 may change the states of MOSFETs $S_1$-$S_4$ as shown in FIG. 18b to maintain the pre-charged current flowing through inductor 32.

In this state, MOSFETs $S_2$ and $S_4$ may be turned OFF (e.g., non conducting) and MOSFETs $S_1$ and $S_3$ may be turned ON (e.g., conducting) which, in turn, causes a short circuit or near-short circuit across inductor 32. As a result, voltage 39 across inductor 32 may be a null voltage and a freewheeling (e.g., pre-charged) current may flow through inductor 32.

During $T_{23}$ of FIG. 18f, drive 31 may maintain the current level of the pre-charged current flowing through inductor 32 (e.g., threshold value $-I_T$), as reached in the previous state (e.g., FIG. 18b). Drive 31 may change the state based on an arrival of enable signal En1.

Some aspects of the disclosure herein may be implemented along with the optional method to reduce switching-on losses of the one or more MOSFETs (e.g., $S_1$-$S_4$) by employing zero-voltage switching (ZVS). Zero-voltage switching (ZVS) is a soft-switching technique addressing the high turn-on losses of the voltage regulator/converter by eliminating high current body diode conduction prior to turning on the high side MOSFET, bringing the drain-source voltage of the high side MOSFET to zero or nearly zero and producing no high current spikes or damaging ringing.

For example, drive 31 may only turn-off MOSFET $S_2$, such that the freewheeling current may flow through diode $D_1$ throughout $T_{23}$ or until drive 31 turns-on MOSFET $S_1$. Switching the MOSFETs (e.g., turning off $S_2$ and turning on $S_1$) in stages may reduce switching losses, by virtue of reducing the voltage across MOSFET $S_1$ prior to turning on.

FIG. 18c illustrates discharging/regulation of voltage 38 across load 37, by circuit 31, based on an arrival of enable signal En1. In this configuration, drive 31 may turn OFF MOSFET $S_3$ which, in turn, inductor 32 and load 37 form via input terminals In1 and In2 a closed loop with resonant characteristics.

When (i) voltage 38 across load 37 is about voltage level $+V_{IN}$ (e.g., 12V), (ii) the negative pre-charged current flowing through inductor 32 is equal or greater than threshold level (e.g., −1 A, −2 A, −5 A, −10 A), and (iii) enable signal En1 arrives, drive 31 may change states as shown in FIG. 18c. During time interval $T_{24}$ of FIG. 18f, voltage 38 across load 37 may discharge and transfer energy to charge the magnetic field of the winding(s) of inductor 32, by virtue of the resonant characteristics.

Voltage 38 may decrease until reaching a voltage level about $-V_d$ (e.g., 0.1V, 0.5V, 1V, 1.5V, 2V), the forward threshold voltage of diode $D_4$ (e.g., may supply an external forward bias and cause the diode to be turned on and a current to flow through). When voltage 38 reaches voltage level $-V_d$ diode, $D_4$ may turn on and conduct during time interval $T_{25}$ of FIG. 18f, thereby enabling the current flowing through inductor 32 to decrease to a null level, and voltage 38 to increase to a null voltage level.

Following the example above referring to time interval $T_{25}$, when voltage 38 is about zero voltage level and the current flowing through 32 decreases to about null/zero, drive circuit 31 may change, based on a measurement/predetermined amount of time, to the state where MOSFETs $S_1$-$S_4$ are in states as shown in FIG. 18e—turning on MOSFET $S_4$.

FIG. 18e illustrates a configuration of circuit 30 pre-charging inductor 32 positively, before implementing another cycle of charging load 37. In this configuration, MOSFETs $S_2$ and $S_3$ may be turned OFF (e.g., nonconducting) and switches $S_1$ and $S_4$ may be turned ON (e.g., conducting) which, in turn, forms a closed loop through inductor 32 and input terminals In1 and In2 receiving an input DC power (e.g., $V_{IN}$). When voltage 38 across load 37 is about 0V and drive 31 changes states as shown in FIG. 18e, voltage 39 increases to voltage level $+V_{IN}$. As a result of voltage 39 being about $+V_{IN}$, a current flowing through inductor 32 may increase positively, by virtue of the characteristics of inductive elements. The state illustrated in FIG. 18e may be similar to the state illustrated in FIG. 15f during $T_1$.

Figure 19:
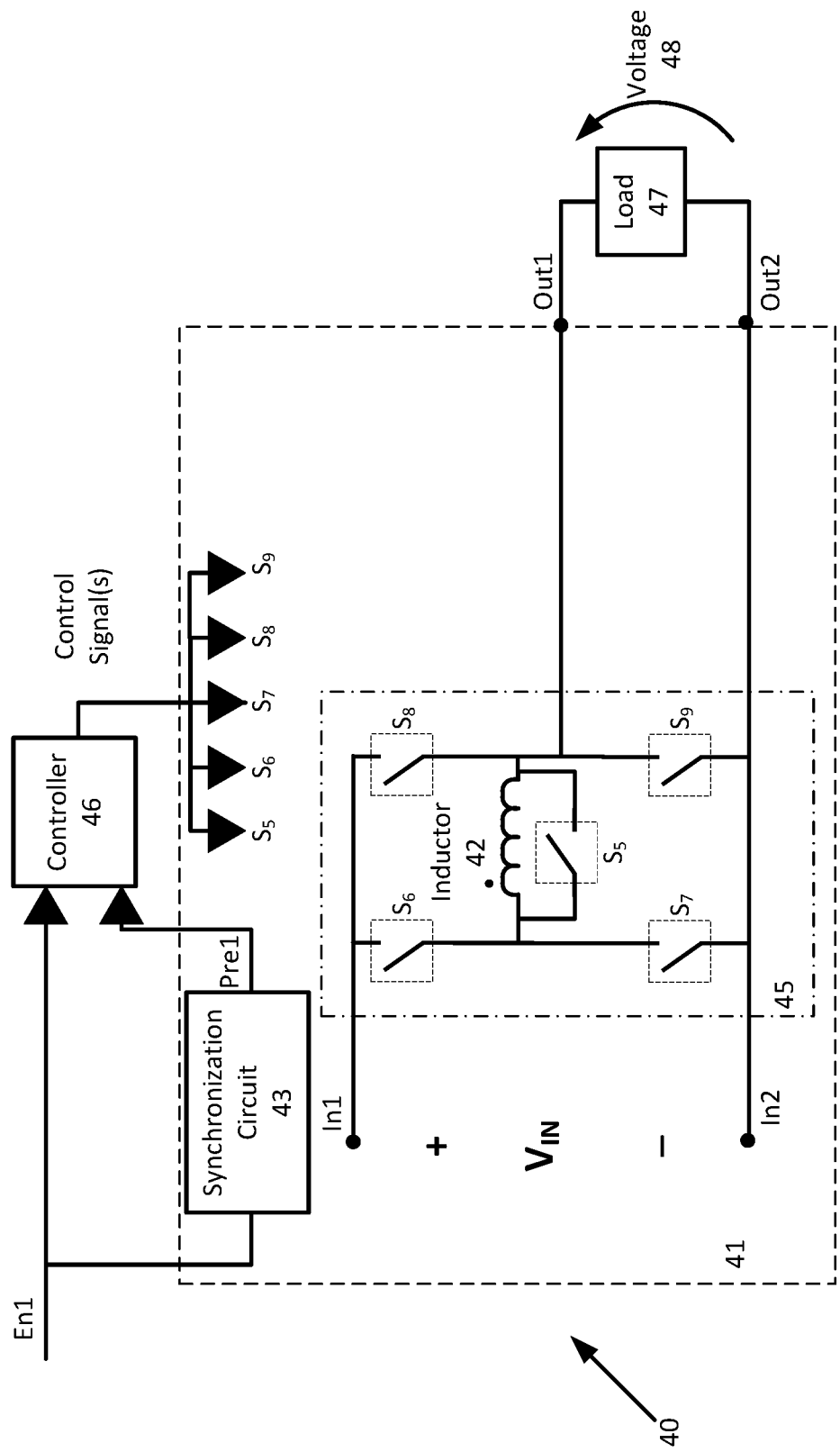
FIG. 19 illustrates a diagram of an electrical circuit according to aspects of the disclosure.

Reference is now made to FIG. 19, which illustrates a diagram of electrical circuit 40, which may be an example of circuit 10 of FIG. 11a, according to aspects of the disclosure. As shown in FIG. 19, in some aspects, switching circuit 15 of FIG. 11a is a DC-DC converter and/or an H bridge circuit (e.g., an electronic circuit that may switch the polarity of a voltage applied across a load, in this case inductor 42) and inductive element 12 of FIG. 11a is an inductor (e.g., inductor 42). In this example, a switching element $S_5$ is connected across the inductor 42. The switching element can be, for example, one or more of: a (freewheeling) switch, a MOSFET, diode(s), etc. The switching element is illustrated in FIG. 19 as a freewheeling switch $S_5$.

Circuit 40 includes controller 46, switching circuit 45 including H bridge circuit having switches $S_6$, $S_7$, $S_8$, $S_9$ (e.g., a full-bridge), inductor 42, freewheeling switch $S_5$, load 47 including capacitive element(s), synchronization circuit 43, input terminals In1-In2 (e.g., positive and negative) and output terminals Out1-Out2.

Drive 41 may include a switching circuit 45 including H bridge circuit having switches $S_6$, $S_7$, $S_8$, and $S_9$, a freewheeling switch $S_5$, an inductor 42, a synchronization circuit 43, input terminals In1-In2, and output terminals Out1-Out2. Drive 41 may be configured to reduce power consumption in monitoring/controlling/regulating voltage 48 across load 47.

In some aspects, controller 46 and/or synchronization circuit 43 may receive one or more estimations and/or determinations (e.g., measurements collected by sensors) and/or data, of one or more electrical parameters of circuit 40.

Drive 41 may monitor/control/regulate voltage 48 across load 47 to two DC voltage levels, V1 (e.g., 12V, 5V, 3.3V) and V2 (e.g., 0V), based on an arrival of enable signal En1, as discussed above with respect to FIGS. 13a-13i, 14a-14f, 15a-15f, 16a-16f, 17a-17e, and 18a-18f.

In some aspects, freewheeling switch $S_5$ may have a relatively low on-state resistance compared with the on-state resistance of switches $S_6$, $S_7$, $S_8$ and $S_9$. In this example, "on-state" may refer to when the switch/diode is conducting.

In some aspects, controller 46 may control freewheeling switch $S_5$ by a control signal.

In some aspects, freewheeling switch $S_5$ may be implemented as a bi-directional diode(s) having low forward resistance.

In these cases, drive 41 may achieve reduced dissipated power (e.g., conductance losses) during different states of drive 41 (for example, similar states as those illustrated in FIGS. 13a, 13e, 14a, 14e, 15a, 15e, 15c, 16a, 16e, 17a, 17d) wherein a freewheeling current is flowing.

Figure 20:
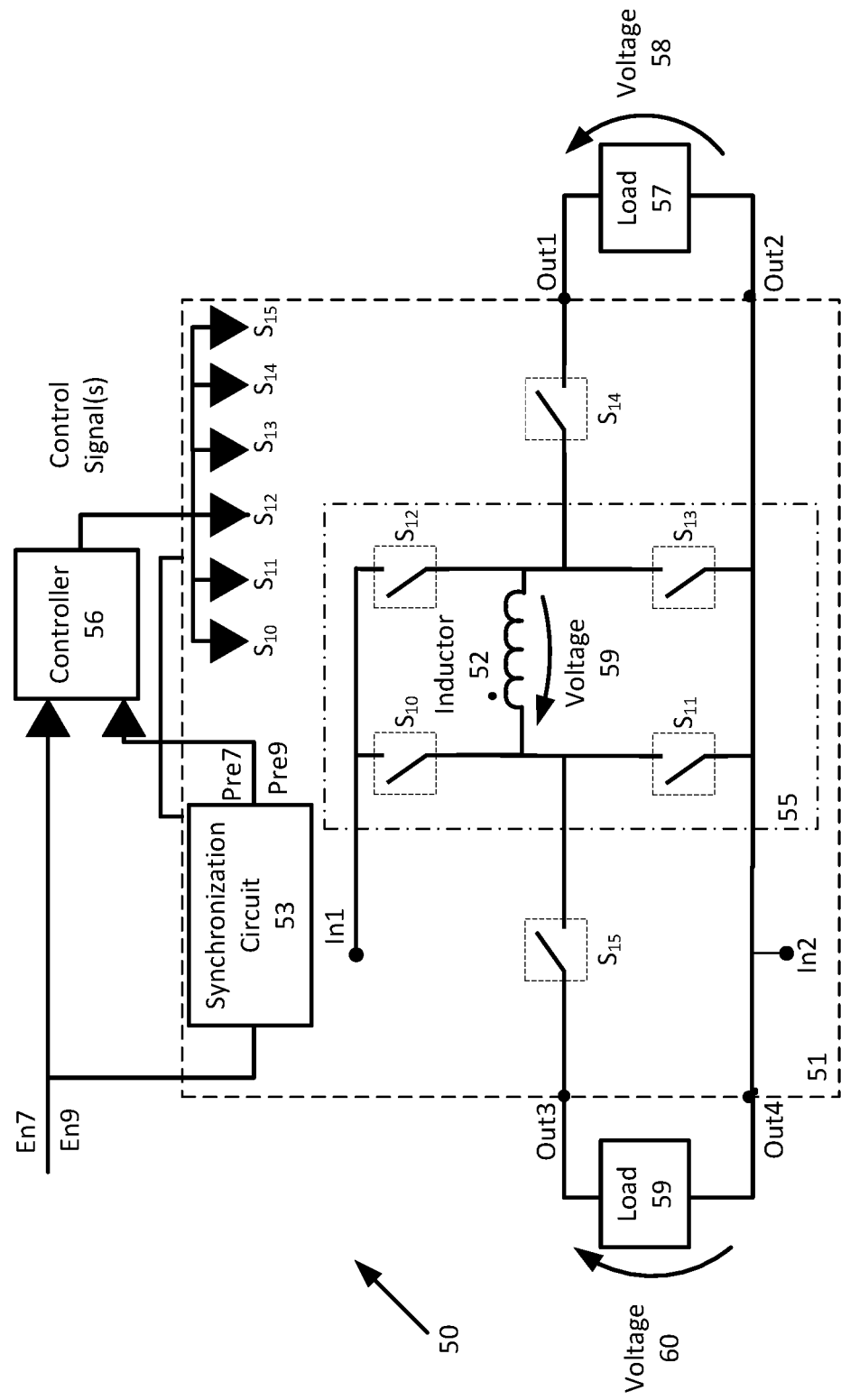
FIG. 20 illustrates a diagram of an electrical circuit according to aspects of the disclosure.

Reference is now made to FIG. 20, which illustrates a diagram of an electrical circuit 50 according to aspects of the disclosure herein.

In some aspects, the drive circuit may regulate input voltage of two or more capacitive loads (e.g., MOSFET's gate terminal). Driving two capacitive loads by a common drive may reduce the total energy consumed in monitoring/controlling/regulating the loads' input voltage by reusing the energy consumed during regulation of a first load to charge the second load, and may reduce the size and the costs of the system, by sharing and using common components (e.g., inductor).

For example, circuit 50 includes controller 56, switching circuit 55 including H bridge circuit having switches $S_{10}$, $S_{11}$, $S_{12}$, $S_{13}$ (e.g., a full-bridge), inductor 52, switches $S_{14}$ and $S_{15}$, loads 57 and 59 including capacitive element(s), synchronization circuit 53, input terminals In1-In2 (e.g., positive and negative), and output terminals Out1-Out2 and Out3-Out4.

Input terminals In1 and In2 (e.g., positive and negative) may be coupled with switching circuit 55 and may provide switching circuit 55 with a DC power supply (e.g., 12V, 5V, 3.3V). Load 57 may be coupled between output terminals Out1 and Out2, such that output terminal Out1 may be coupled to one terminal of inductor 52 via switches $S_{14}$, and output terminal Out2 may be coupled (optionally through additional circuit elements, such as a series resistor, a switch, an inductor, etc.) to input terminal In2. Load 59 may be coupled between output terminals Out3 and Out4, such that output terminal Out3 may be coupled to one terminal of inductor 52 via switches $S_{15}$ and output terminal Out4 may be coupled (optionally through additional circuit elements, such as a series resistor, a switch, an inductor, etc.) to input terminal In2.

Drive 51 may include switching circuit 55 including H bridge circuit having switches $S_{10}$, $S_{11}$, $S_{12}$, and $S_{13}$, inductor 52, synchronization circuit 53, switches $S_{14}$ and $S_{15}$, input terminals In1-In2, and output terminals Out1-Out2, Out3-Out4. Drive 51 may be configured to reduce power consumption in monitoring/controlling/regulating voltage 58 across load 57 and voltage 60 across load 59.

Each one of switches $S_{10}$, $S_{11}$, $S_{12}$, $S_{13}$, $S_{14}$, $S_{15}$ may be controlled by a corresponding control signal respectively (e.g., generated by controller 56), Loads 57 and 59 may have a capacitance, for example, an equivalent capacitance between source and gate terminals of a transistor (gate-source capacitance—$C_{gs}$), a capacitive impedance of a communication circuit (e.g., used for loop signaling), etc.

In some aspects, controller 56 and/or synchronization circuit 53 may receive one or more estimations and/or determinations (e.g., measurements collected by sensors) and/or data, of one or more electrical parameters of circuit 50.

Synchronization circuit 53 may include a phase-locked loop (PLL)/delay-locked loop (DLL) for each one of enable signals En7 and En9.

Drive 51 may regulate voltage 58 and 60 across load 57 and 59, correspondingly, to two DC voltage levels, V1 (e.g., 12V, 5V, 3.3V) and V2 (e.g., 0V), based on an arrival of enable signals En7, En9 and pre-charge signals Pre7, Pre9, correspondingly.

Controller 56 may receive both enable signals En7, En9 and pre-charge signals Pre7, Pre9 and, based on one or more decision rules, e.g., using decision-making circuits, may generate control signals to drive one or more switches of switching circuit 55, as discussed above with respect to FIGS. 13a-13k, 14a-14f, 15a-15f, 16a-16f, 17a-17e, and 18a-18f.

Controller 56 may turn on switch $S_{14}$ to charge/discharge load 57 and may turn on switch $S_{15}$ to charge/discharge load 59.

Synchronization circuit 53 may receive enable signals En7, En9 and, based on previous occurrences of En7, En9, may estimate/predict an arrival time (e.g., a rise of En7, a fall of En7) of subsequent enable signals En7, En9. Based on the estimated arrival time of a subsequent enable signal En7, En9, synchronization circuit 53 may generate pre-charge signals Pre7, Pre9. The estimating/predicting may include a detection of a frequency or a phase of previous occurrences of enable signals En7, En9. Synchronization circuit 53 may generate pre-charge signals Pre7, Pre9 having a voltage level corresponding with the voltage level of enable signals En7, En9.

In some aspects, pre-charge signals Pre7, Pre9 may precede an arrival of subsequent corresponding enable signals En7 and En9.

In some aspects, drive 51 may control/monitor/regulate loads 57 and 59 in a staggered manner and complimentary manner. For example, for a time interval when drive 51 is changing voltage 58 (e.g., charging/discharging) across load 57 and/or implementing steps aimed to change voltage 58 (e.g., pre-charging inductor 52), voltage 60 across load 59 may remain substantially constant (e.g., within a variation of ±0.1V, ±0.3V, etc. which may be due to a ripple voltage or a noise) in a charged or discharged state. Vice versa, when drive 51 is changing voltage 60 across load 59 and/or implementing steps aimed to change voltage 60, voltage 58 across load 57 may remain substantially constant in a charged or discharged state.

In some aspects, a dead time may be implemented between ON intervals (e.g., when the load is charged) of loads 57 and 59. For example, in a case that loads 57 and 59 are gate-source capacitance of serially connected MOSFETs, the implementation of a dead time may prevent cross-conduction of the MOSFETs.

In some aspects, drive circuit 51 may transfer energy stored in a charged load (e.g., load 57) to a discharged load (e.g., load 59), thereby reusing the energy consumed during regulation of the charged load's input voltage to charge the discharged load.

Figure 21:
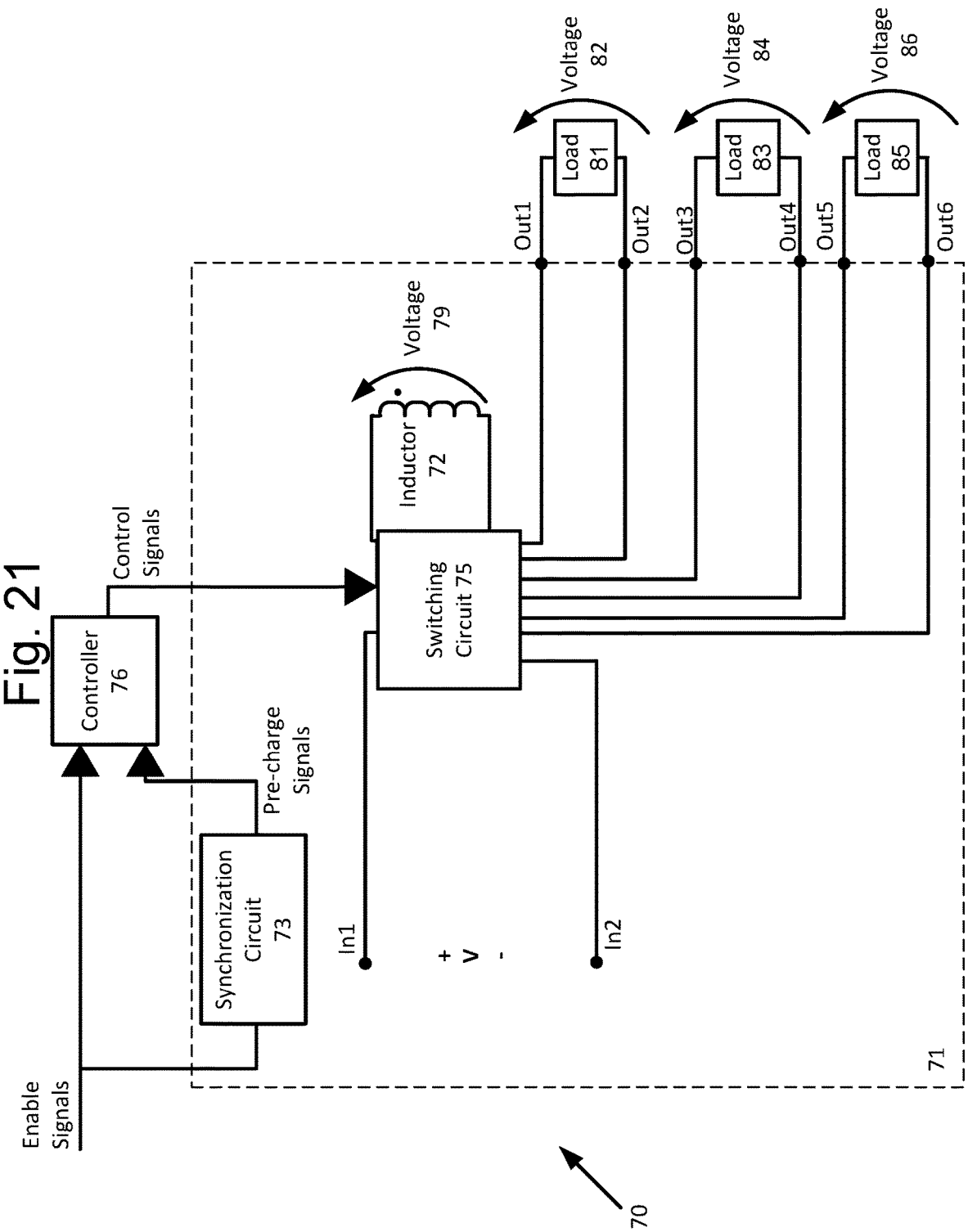
FIG. 21 illustrates a diagram of an electrical circuit according to aspects of the disclosure.

Reference is now made to FIG. 21, which illustrates a diagram of an electrical circuit according to aspects of the disclosure herein.

In some aspects, the drive circuit may be a single-inductor-multiple-output (SIMO) circuit. The drive may regulate input voltage of two or more capacitive loads (e.g., MOSFET's gate terminal) having capacitive elements by a single inductor. Driving two or more capacitive loads by a common drive may reduce the total energy consumed in regulating the loads' input voltage and may reduce the size and the costs of the system.

For example, circuit 70 includes controller 76, switching circuit 75, inductor 72, loads 81, 83 and 85 including capacitive element(s), synchronization circuit 73, input terminals In1-In2 (e.g., positive and negative), and output terminals Out1-Out2, Out3-Out4 and Out5-Out6.

Input terminals In1 and In2 (e.g., positive and negative) may be coupled with switching circuit 75 and may provide switching circuit 75 a DC power supply (e.g., 12V, 5V, 3.3V). Load 81 may be coupled between output terminals Out1 and Out2. Load 83 may be coupled between output terminals Out3 and Out4. Load 85 may be coupled between output terminals Out5 and Out6.

In some aspects, two or more of output terminals Out2, Out4 and Out6 may be coupled and/or attributed to the same voltage reference (e.g., ground). In other aspects, each of output terminals Out2, Out4 and Out6 may be attributed with a different voltage reference.

Drive 71 may include switching circuit 75, inductor 72, synchronization circuit 73, input terminals In1-In2, and output terminals Out1-Out2, Out3-Out4, Out5-Out6. Drive 71 may be configured to reduce power consumption in regulating voltage 82 across load 81, voltage 84 across load 83, and voltage 86 across load 85.

Drive 71 may regulate each of load 81, load 83, and load 85 as a function of an occurrence of a corresponding enable signal and/or an occurrence of a corresponding pre-charge signal, generated by synchronization circuit 73.

Switching circuit 75 may be controlled by one or more control signals generated by controller 76.

In some aspects, controller 76 and/or synchronization circuit 73 may receive one or more estimations and/or determinations (e.g., measurements collected by sensors) and/or data, of one or more electrical parameters of circuit 70.

Synchronization circuit 73 may include a phase-locked loop (PLL)/delay-locked loop (DLL) for each one of the enable signals.

Loads 81, 83, and 85 may have a capacitance, for example, an equivalent capacitance between source and gate terminals of a transistor (gate-source capacitance—$C_{gs}$), a capacitive impedance of a communication circuit (e.g., used for loop signaling), etc.

Drive 71 may regulate voltage 82, 84 and 86 across load 81, 83 and 85, correspondingly, to two DC voltage levels, V1 (e.g., 12V, 5V, 3.3V) and V2 (e.g., 0V), based on an arrival of enable signals.

In operation, controller 76 may control switching circuit 75 to pre-charge inductor 72, based on receiving one or more pre-charge signals generated by synchronization circuit 73 that may predict/estimate an arrival of enable signals. Drive 71 may change the state of switching circuit 75 based on one or more decision rules, e.g. using decisions circuit(s).

Figure 22:
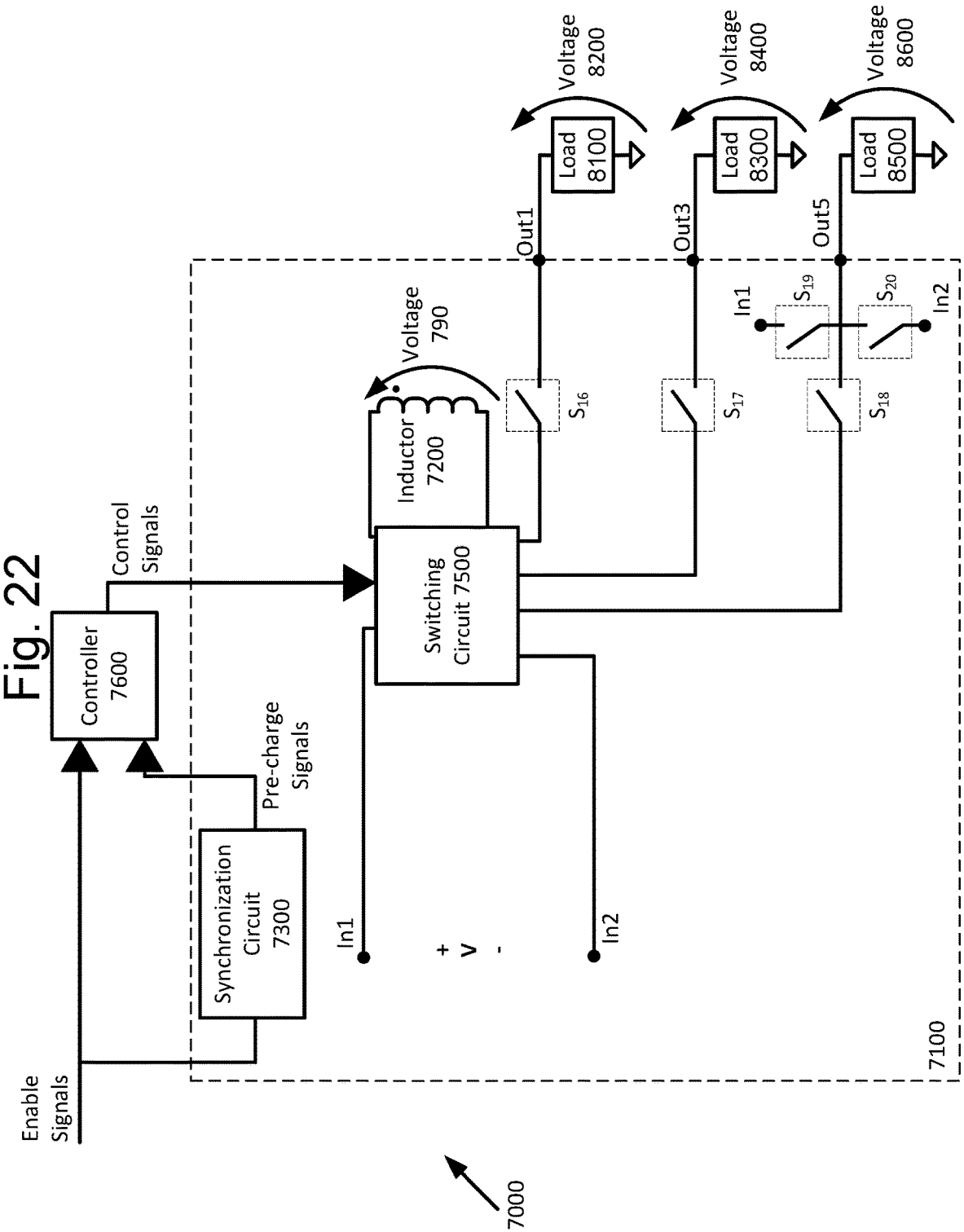
FIG. 22 illustrates a diagram of an electrical circuit according to aspects of the disclosure.

Reference is now made to FIG. 22, which illustrates a diagram of electrical circuit 700, which may be an example of circuit 70 of FIG. 21, according to aspects of the disclosure. As shown in FIG. 22, in some aspects, two or more loads may be monitored/regulated by a single-inductor-multiple-output (SIMO) drive circuit and/or may be coupled/attributed to the same voltage reference (e.g., ground).

Circuit 7000 includes: controller 7600, switching circuit 7500, inductor 7200, switches $S_{16}$, $S_{17}$, $S_{18}$, $S_{19}$, and $S_{20}$, loads 8100, 8300 and 8500 including capacitive element(s), synchronization circuit 7300, input terminals In1-In2 (e.g., positive and negative), and output terminals Out1, Out3 and Out5.

Drive 7100 may include switching circuit 7500, inductor 7200, switches $S_{16}$, $S_{17}$, $S_{18}$, $S_{19}$, and $S_{20}$, synchronization circuit 7300, input terminals In1-In2 (e.g., positive and negative), and output terminals Out1, Out3 and Out5. Drive 7100 (e.g., SIMO drive circuit) may be configured to reduce power consumption in regulating loads 8100, 8300 and 8500 and to reduce the size and the costs of the system.

Input terminals In1 and In2 (e.g., positive and negative) may be coupled with switching circuit 7500 and may provide switching circuit 7500 with a DC power supply (e.g., 12V, 5V, 3.3V). Load 8100 may be coupled between output terminal Out1 and a reference voltage (e.g., ground). Output terminal Out1 may be coupled to switching circuit 7500 via switch $S_{16}$. Load 8300 may be coupled between output terminal Out3 and the reference voltage (e.g., ground). Output terminal Out3 may be coupled to switching circuit 7500 via switch $S_{17}$. Load 8500 may be coupled between output terminal Out5 and the reference voltage (e.g., ground). Output terminal Out5 may be coupled to switching circuit 7500 via switch $S_{18}$.

Drive 7100 may regulate each of load 8100, load 8300, and load 8500 as a function of an occurrence of a corresponding enable signal and/or an occurrence of a corresponding pre-charge signal, generated by synchronization circuit 730.

Synchronization circuit 7300 may include a phase-locked loop (PLL)/delay-locked loop (DLL) for each one of the enable signals.

Controller 7600 may turn on switch $S_{16}$ to charge/discharge load 8100, may turn on switch $S_{17}$ to charge/discharge load 8300 and, may turn on switch $S_{18}$ to charge/discharge load 8500.

In operation, controller 7600 may control switching circuit 7500 to pre-charge inductor 7200 and/or increase a current flowing through inductor 7200 to a threshold value, based on receiving one or more pre-charge signals generated by synchronization circuit 7300, e.g., generated based on a prediction/estimation of an arrival of subsequent enable signal(s). Drive 7100 may change the state of switching circuit 7500, based on one or more decision rules, e.g. using decision circuit(s).

Drive 7100 may be configured to monitor one or more of load 8100, load 8300, and load 8500 in a staggered and complimentary manner with respect to the control of a different one of the loads. For example, when drive 7100 charges load 8100, drive 7100 may discharge load 8300. Vice versa, when drive 7100 discharges load 8100 drive 7100 may charge load 8300.

In some aspects, drive 7100 may charge/pre-charge inductor 7200 with a current at/above a first threshold value, sufficient to charge/discharge each one of loads 8100, 8300 and 8500 simultaneously.

In other aspects, drive 7100 may charge/pre-charge inductor 7200 with a current at/above a second threshold value, sufficient to charge/discharge only some of loads 8100, 8300 and 8500 simultaneously. In such a case, the second threshold value may be lower than the first threshold value and may reduce the system's losses and size (for example, inductor 7200 may be smaller).

In some aspects, a pull-up switch and/or a pull-down switch may be connected to one or more of the output terminals of the drive. The pull-up switch may be connected to a power supply/Vdd/input voltage (e.g., input terminal In1). The pull-down switch may be connected to a ground/reference voltage (e.g., input terminal In2) to ensure a well-defined ground voltage.

For example, in FIG. 22 pull-up switch $S_{19}$ and pull-down switch $S_{20}$ may be connected to output terminal Out5. In such a scenario, the utilization of pull-up switch $S_{19}$ and pull-down switch $S_{20}$ may: (i) stabilize and ensure a known state (e.g., charged/discharged) for voltage 860 across load 850 and prevent load 850 of being attributed to a floating point, and (ii) reduce conduction losses, by virtue of lower on-resistance of the pull-up/pull-down switches and reduced current flow compared to the current that may flow through switching circuit 750.

In some aspects, by virtue of using a single inductor to monitor/regulate two or more of the loads, drive 7100 may reduce the size and the costs of the system.

Figure 23:
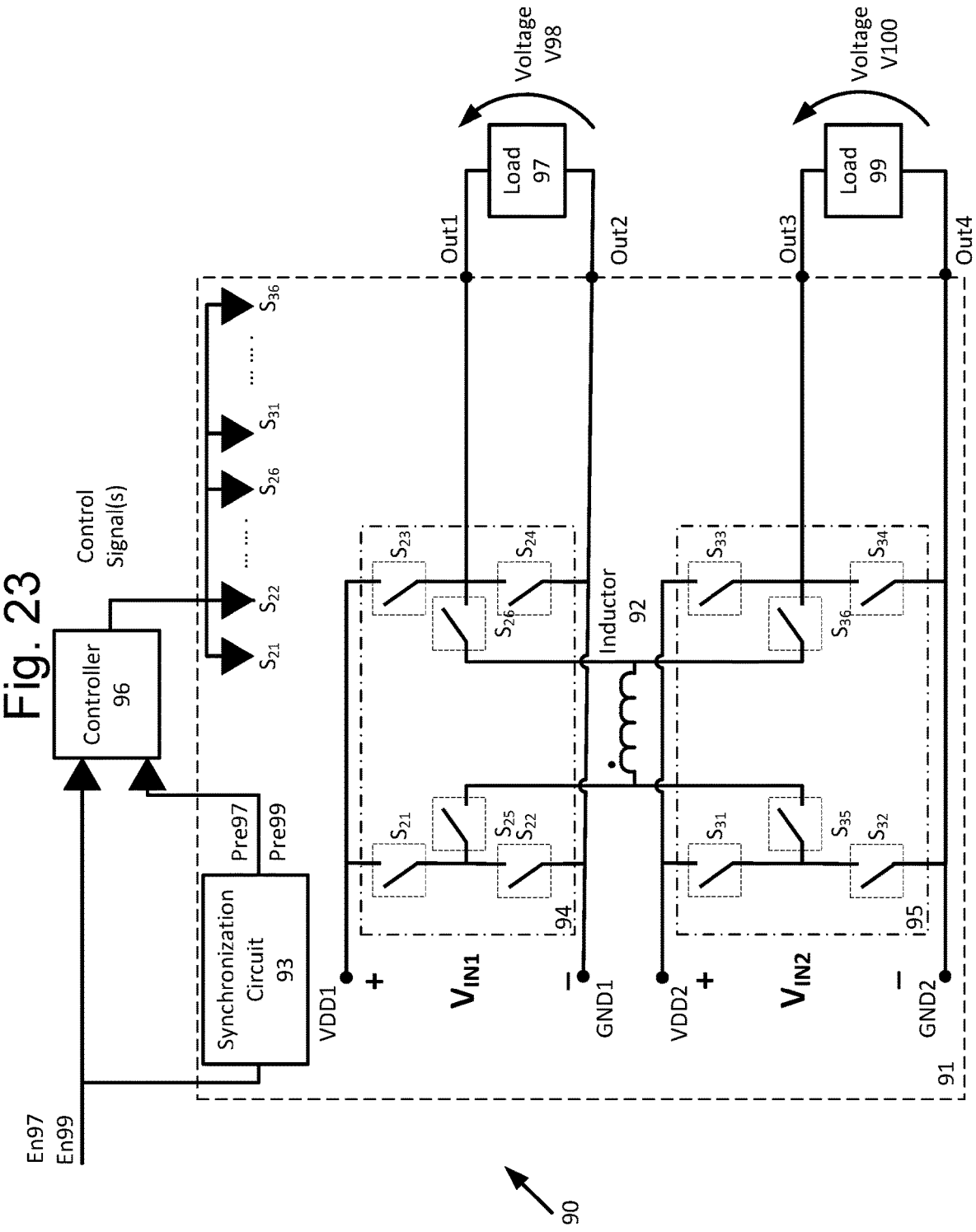
FIG. 23 illustrates a diagram of an electrical circuit according to aspects of the disclosure.

Reference is now made to FIG. 23, which illustrates a diagram of electrical circuit 90, according to aspects of the disclosure. As shown in FIG. 23, in some aspects, two or more of capacitive loads may be monitored by a single-inductor-multiple-output (SIMO) drive circuit.

In some aspects, some of the capacitive loads may be attributed to different voltage references. For example, drive circuit 91 of FIG. 23 may monitor/regulate load 97 and load 99. Load 97 may be referenced to voltage levels VDD1 and GND1, and load 99 may be referenced to different voltage levels VDD2 and GND2.

Circuit 90 includes: controller 96, switching circuit 94 including switches $S_{21}$, $S_{22}$, $S_{23}$, $S_{24}$, $S_{25}$, and $S_{26}$, switching circuit 95 including $S_{31}$, $S_{32}$, $S_{33}$, $S_{34}$, $S_{35}$, and $S_{36}$, inductor 92, loads 97 and 99 including capacitive element(s), synchronization circuit(s) 93, a first pair of input terminals VDD1 and GND1 (e.g., positive and negative), a second pair of input terminals VDD2 and GND2, a first pair of output terminals Out1, Out2, and a second pair output terminals Out3, Out4.

Drive 91 may include switching circuit 94 including switches $S_{21}$, $S_{22}$, $S_{23}$, $S_{24}$, $S_{25}$, and $S_{26}$, switching circuit 95 including $S_{31}$, $S_{32}$, $S_{33}$, $S_{34}$, $S_{35}$, and $S_{36}$, inductor 92, synchronization circuit(s) 93, input terminals VDD1 and GND1, VDD2 and GND2, and output terminals Out1, Out2, Out3, and Out4. Drive 91 (e.g., SIMO drive circuit) may be configured to reduce power consumption in regulating loads 97 and 99 and to reduce the size and the costs of the system.

Loads 97 and 99 may have a capacitance, for example, an equivalent capacitance between source and gate terminals of a transistor (gate-source capacitance—$C_{gs}$), a capacitive impedance of a communication circuit (e.g., used for loop signaling), etc.

Controller 96 may be implemented as one or more controllers. For example, in some aspects, a first controller may monitor/regulate load 97 by controlling switching circuit 94 and a second controller may monitor/regulate load 99 by controlling switching circuit 95. Controller 96 may be coupled to drive 91 and/or incorporated into drive 91. Synchronization circuit 93 may be coupled to drive 91 and/or incorporated into drive 91.

In some aspects, controller 96 and/or synchronization circuit 93 may receive one or more estimations and/or determinations (e.g., measurements collected by sensors) and/or data, of one or more electrical parameters of circuit 90.

Synchronization circuit 93 may include one or more phase-locked loop (PLL)/delay-locked loop (DLL) for each one of enable signals En97 and En99.

Drive 91 may regulate voltage V98 across load 97, for example, according to two DC voltage levels, VDD1 (e.g., 12V, 5V, 3.3V) and GND1 (e.g., 0V), based on an arrival of enable signal(s) En97 and pre-charge signal(s) Pre97, correspondingly.

Drive 91 may regulate voltage V100 across load 99, for example, according to two DC voltage levels, VDD2 (e.g., 12V, 5V, 3.3V) and GND2 (e.g., 0V), based on an arrival of enable signal(s) En99 and pre-charge signal(s) Pre99, correspondingly.

Controller 96 may receive both enable signals En97, En99 and pre-charge signals Pre97, Pre99, and based on one or more decision rules, e.g., using decision-making circuits, may generate control signals to drive (control and switch) one or more switches of switching circuits 94 and 95.

Synchronization circuit 93 may receive enable signals En97, En99 and, based on previous occurrences of enable signals En97, En99, may estimate/predict an arrival time (e.g., a change in the enable signal, such as, a rise of En97, or a fall of En97) of subsequent enable signals En97, En99. Based on the estimated arrival time of a subsequent enable signal En97, En99, synchronization circuit 93 may generate pre-charge signals Pre97, Pre99. The estimating/predicting may include a detection of a frequency or a phase of previous occurrences of enable signals En97, En99. Synchronization circuit 93 may generate pre-charge signals Pre97, Pre99 having a voltage level corresponding with the voltage level of enable signals En97, En99.

In some aspects, pre-charge signals Pre97 and Pre99 may precede an arrival of subsequent corresponding enable signals En97 and En99.

Controller 96 may generate one or more control signal(s) corresponding with each one of switches $S_{21}$, $S_{22}$, $S_{23}$, $S_{24}$, $S_{25}$, $S_{26}$, $S_{31}$, $S_{32}$, $S_{33}$, $S_{34}$, $S_{35}$, and $S_{36}$, respectively.

In some aspects, some of the input terminals VDD1, GND1, VDD2 and GND2 may be coupled and short-circuited. For example, input terminals GND1 and GND2 may be both earth grounded (e.g., 0V).

Input terminals VDD1 and GND1 (e.g., positive and negative) may be coupled with switching circuit 94 and may provide switching circuit 94 with a DC power supply (e.g., 12V, 5V, 3.3V). Input terminals VDD2 and GND2 (e.g., positive and negative) may be coupled with switching circuit 95 and may provide switching circuit 95 with a DC power supply (e.g., 12V, 5V, 3.3V).

Load 97 may be coupled between output terminals Out1 and Out2, such that output terminal Out1 may be coupled to one terminal of inductor 92 via switch $S_{26}$, and output terminal Out2 may be coupled (optionally through additional circuit elements, such as a series resistor, a switch, an inductor, etc.) to input terminal GND1. Load 99 may be coupled between output terminals Out3 and Out4, such that output terminal Out3 may be coupled to one terminal of inductor 92 via switch $S_{36}$, and output terminal Out4 may be coupled (optionally through additional circuit elements, such as a series resistor, a switch, an inductor, etc.) to input terminal GND2.

Switching circuit 94 may include H bridge circuit having switches $S_{21}$, $S_{22}$, $S_{23}$, $S_{24}$, $S_{25}$, and $S_{26}$. In some aspects, controller 96 may control (e.g., turn on/off) switches $S_{25}$ and $S_{26}$, thereby connecting and disconnecting inductor 92 to switching circuit 94.

Switching circuit 95 may include H bridge circuit having switches $S_{31}$, $S_{32}$, $S_{33}$, $S_{34}$, $S_{35}$, and $S_{36}$. In some aspects, controller 96 may control (e.g., turn on/off) switches $S_{35}$ and $S_{36}$, thereby connecting and disconnecting inductor 92 to switching circuit 95.

In such cases, drive 91 may operate each one of switching circuits 94 and 95 as discussed above with respect to switching circuit 25 of drive 21 and the switching circuit of drive 31, correspondingly, in FIGS. 13a-13k, 14a-14f, 15a-15f, 16a-16f, 17a-17e, and 18a-18f.

Figure 24:
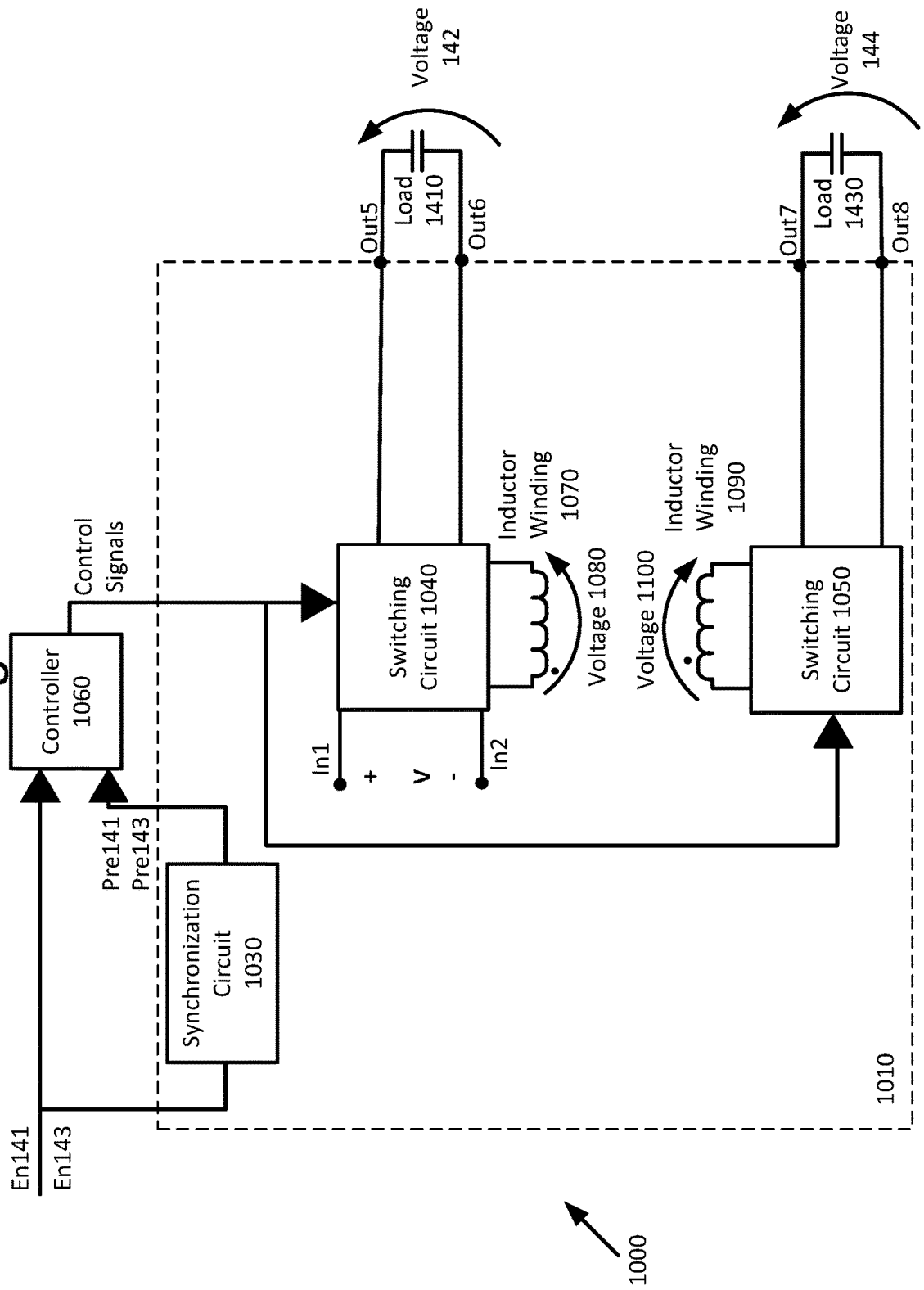
FIG. 24 illustrates a diagram of an electrical circuit according to aspects of the disclosure.

Reference is now made to FIG. 24, which illustrates a diagram of an electrical circuit according to aspects of the disclosure herein.

In some aspects, the drive circuit may include an isolating inductive element (e.g., coupled inductors, a transformer) including two or more windings. The inductive element, by virtue of its isolating and voltage inducing characteristics, may use a voltage applied across a primary winding of the inductive element (e.g., a power supply voltage) to induce a relative voltage level across a secondary winding of the inductive element. The secondary winding may be coupled with a floating circuit (e.g., a circuit which is not referenced to ground). In such case, the drive circuit may regulate a plurality of loads with a single input voltage (e.g., power supply), thereby reducing power consumption of the drive. For example, the drive may regulate input voltage of two or more capacitive loads (e.g., MOSFET's gate terminal) having capacitive elements. Driving two or more capacitive loads by a common drive and elements (e.g., inductive element) may reduce the total energy consumed in regulating the loads' input voltage and may reduce the size and the costs of the system.

For example, in circuit 1000 the inductive element corresponds to multi-winding coupled inductors including windings 1070 and 1090. Circuit 1000 includes controller 1060, switching circuits 1040 and 1050, windings 1070 and 1090, loads 1410 and 1430 including capacitive element(s), synchronization circuit 1030, input terminals In1-In2 (e.g., positive and negative), and output terminals Out5-Out6 and Out7-Out8.

Input terminals In1 and In2 (e.g., positive and negative) may be coupled with switching circuit 1040 and may provide switching circuit 1040 with a DC power supply (e.g., 12V, 5V, 3.3V). Switching circuit 1040 may be coupled with winding 1070. Load 141 may be coupled between output terminals Out5 and Out6.

Switching circuit 1050 may be coupled with winding 1090 and load 1430, which may be coupled between output terminals Out7 and Out8.

Windings 1070 and 1090 may be part of a multi-winding transformer or multi-winding coupled inductors that may contain more than one set of primary windings and/or more than one set of secondary windings, wound on a common core. Using a multi-winding transformer or multi-winding coupled inductors may enable a configuration of a plurality of isolated drive circuits on the same power supply that may be controlled accordingly (e.g. synchronously or asynchronously).

Windings 1070 and 1090 may have a winding turns ratio 1:N (e.g., N=5). The winding turns ratio may affect the corresponding voltage induced across one of the inductors, while applying a voltage across the other inductor.

In some aspects of the disclosure herein, the relative polarity of the windings 1070 and 1090 may be the same or opposite. For example, positively increasing instantaneous current entering primary winding 1070's 'dot' end may induce positive polarity voltage exiting the same end of secondary winding 1090 (as indicated by the 'dots' on the top (in FIG. 24) ends of the primary and secondary windings). The relative polarity of the multi-winding coupled inductors, represented as windings 1070 and 1090, may influence whether drive 1010 (e.g., a drive circuit) may regulate loads 1410 and 1430 synchronously or asynchronously.

In some aspects, two or more of output terminals Out5, Out6, Out7 and Out8 may be coupled and/or attributed to the same voltage reference (e.g., ground). In other aspects, each of output terminals Out5, Out6, Out7 and Out8 may be attributed to a different voltage reference.

Drive 1010 may include switching circuits 1040 and 1050, multi-winding coupled inductors including windings 1070 and 1090, synchronization circuit 1030, input terminals In1-In2, and output terminals Out5-Out6, Out7-Out8. Drive 1010 may be configured to reduce power consumption in monitoring/controlling/regulating voltage 142 across load 1410 and voltage 144 across load 1430.

Drive 1010 may regulate the voltage in each of loads 1410 and load 1430 as a function of an occurrence of a corresponding enable signal En141 and En143 and/or an occurrence of a corresponding pre-charge enable signal Pre141 and PRe143, e.g., generated by synchronization circuit 1030.

Each of switching circuits 1040 and 1050 may be controlled by one or more control signals generated by controller 1060.

Drive 1010 may regulate voltage 142 and 144 according to two DC voltage levels, V1 (e.g., 12V, 5V, 3.3V) and V2 (e.g., 0V), based on an arrival of enable signals.

In operation, controller 1060 may control switching circuits 1040 and 1050 to pre-charge inductors 1070 and/or 1090, based on receiving one or more pre-charge signals generated by synchronization circuit 1030 that may predict/ estimate an arrival of enable signals.

In some aspects, drive 1010 may operate each one of switching circuits 1040 and 1050 as discussed above with respect to switching circuit 25 of drive 21 and the switching circuit of drive 31, correspondingly, in FIGS. 13a-13k, 14a-14f, 15a-15f, 16a-16f, 17a-17e, and 18a-18f, based on one or more decision rules, e.g., using decision circuit(s).

In some aspects of the disclosure herein, switching circuit 1050 may be coupled also to a DC power source. In such case, the switching circuits 1040 and 1050 may operate in an interleaved manner and the transients of charging/discharging the loads may be faster.

Figure 25:
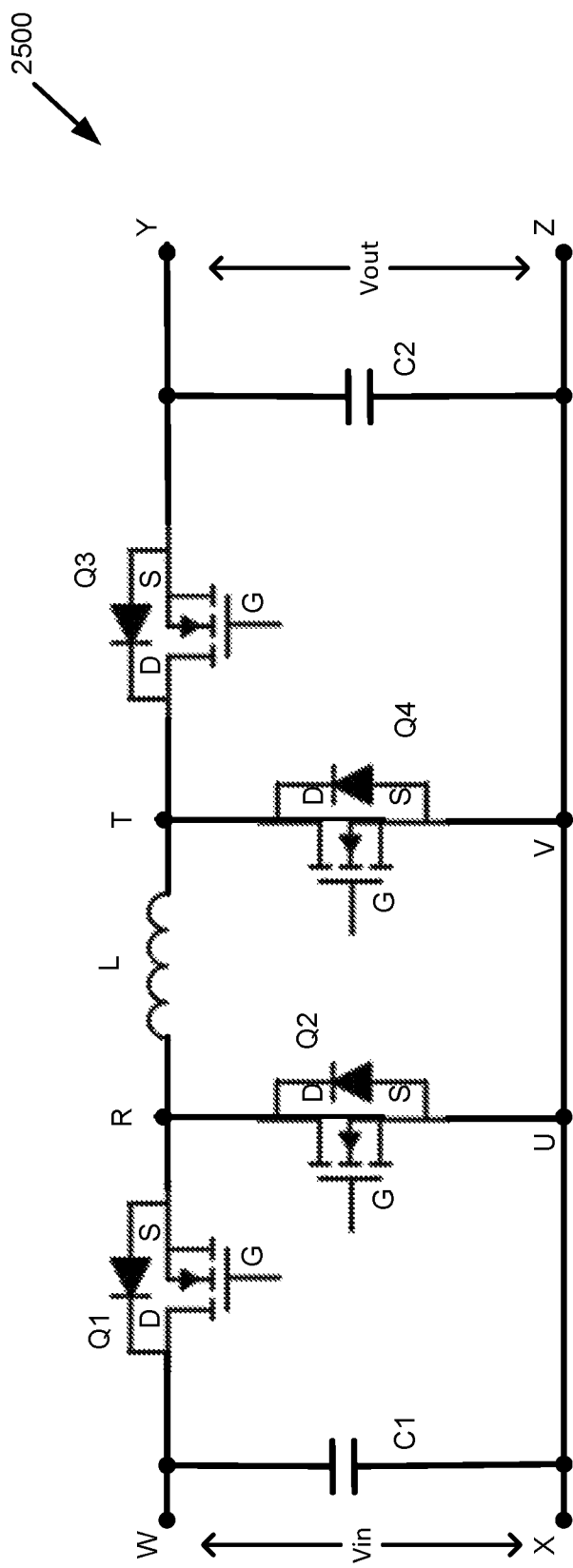
FIG. 25 illustrates a diagram of an electrical circuit according to aspects of the disclosure.

Reference is now made to FIG. 25, which illustrates a diagram of an electrical circuit according to aspects of the disclosure herein.

Circuit 2500 includes input terminals W and X, capacitor C1, inductor L, capacitor C2, output terminals Y and Z and metal-oxide-semiconductor field-effect transistors (e.g., MOSFETs) Q1, Q2, Q3 and Q4. For example, MOSFET Q1 may be an n-type enhancement metal-oxide-semiconductor field-effect transistor comprising drain, source and gate terminals (denoted D, S and G respectively).

In some aspects of the disclosure herein, drain D of MOSFET Q1 may be coupled with input terminal W, and source S of MOSFET Q1 may be coupled with node R. Drain D of MOSFET Q2 may be coupled with node R, and source S of MOSFET Q2 may be coupled with node U. Drain D of MOSFET Q3 may be coupled with node T, and source S of MOSFET Q3 may be coupled with output terminal Y. Drain D of MOSFET Q4 may be coupled with node T, and source S of MOSFET Q4 may be coupled with node V. Input terminal X, node U, node V and node Z may be coupled and short-circuited. Inductor L may be coupled between node R and node T. Capacitor C1 may be coupled between input terminals W and X, and Capacitor C2 may be coupled between output terminals Y and Z.

In some aspects, gate terminal G of one or more of MOSFETs Q1, Q2, Q3 and Q4 may be controlled by a (e.g. resonant) gate-drive circuit. For example, gate terminal G may be controlled by drive 150 of FIGS. 1a-1d, drive 250 of FIGS. 2a-2d or drive 11 as shown in FIG. 11a. In such case, a gate capacitance (e.g., of one or more of MOSFETs Q1, Q2, Q3 and Q4) comprising a capacitance between source S and gate G terminals of a transistor (gate-source capacitance—Cgs) and a capacitance between drain D and gate G terminals of a transistor (gate-drain capacitance—Cgd) may be the capacitance of load 104, 204 and 17 (of FIGS. 1a-1d, 2a-2d and 11a correspondingly). The Miller effect may increase this capacitance in certain circuits, for example, in inverting voltage amplifiers. In some aspects, a gate-drive circuit controlling one or more of MOSFETs Q1, Q2, Q3 and Q4 may include similar circuits to drive 150 of FIGS. 1a-1d, drive 250 of FIGS. 2a-2d or drive 11 as shown in FIG. 11a, or a combination thereof.

In some aspects, the gate-drive circuit may include a synchronization circuit. The synchronization circuit may receive a first enable signal indicating when to drive the gate terminal G of one or more of MOSFETs Q1, Q2, Q3 and Q4 that may be controlled by the gate-drive circuit. Based on previous occurrences of the first enable signal, the synchronization circuit may estimate/predict an arrival time (e.g., a change in the first enable signal, such as a rise and/or a fall of the enable signal) of a subsequent first enable signal (e.g., to be received after the first enable signal). Based on the estimated/predicted characteristic (e.g., estimated arrival time) of the subsequent first enable signal, the synchronization circuit may generate a second enable signal, e.g., a pre-charge signal. The estimating/predicting may include a detection of a frequency or a phase of previous occurrences of the first enable signal.

In some aspects, the controller(s) of the resonant gate-drive circuit (for example, controller 306 of FIG. 3, controller 16 of FIG. 11a, etc.) may control the resonant gate-drive based on and/or using a closed loop control system that may monitor one of the measured/estimated/sensed parameters of circuit 2500 (for example, rise time sampling of voltage Vout across capacitor C2, peak current flowing through inductor L, etc.) that may be obtained by a sampling/sensing circuit [not shown in FIG. 25].

In some aspects, circuit 2500 may be a DC-DC converter (for example, a buck+boost converter) configured to convert the input voltage across input terminals W and X from a first voltage level to a second voltage level across output terminals Y and Z.

It is to be understood that the inventions are not limited in application to the details set forth in the description contained herein or illustrated in the drawings. Other examples of the inventions are contemplated and the inventions are capable of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the examples described without departing from the scope, defined in and by the appended claims, of the disclosure. Further, various modifications should be readily appreciated from the following paragraphs describing various combinations of features set forth in numbered clauses.

Clause 1: An apparatus comprising: a controllable power supply; an isolating inductive element comprising a first inductor having a primary winding and a second inductor having a secondary winding, wherein a voltage applied by the controllable power supply across the first inductor induces a voltage across the second inductor; a switch electrically connected between a first terminal of the second inductor and a first terminal of a capacitive load; wherein the switch is configured to, based on a first polarity voltage supplied by the controllable power supply and based on a first voltage of the capacitive load, enter a first state in which current is passed to charge the capacitive load to a second voltage; wherein the switch is configured to, based on a null voltage supplied by the controllable power supply and based on the second voltage of the capacitive load, enter a second state in which current is restricted from passing through the switch to keep the capacitive load charged; and wherein the switch is configured to, based on a second polarity voltage supplied by the controllable power supply and based on the second voltage of the capacitive load, enter a third state in which current is passed to discharge the capacitive load, wherein the second polarity voltage has a polarity opposite to the first polarity voltage.

Clause 2: An apparatus comprising: a controllable voltage supply; an isolating inductive element comprising a first inductor having a primary winding and a second inductor having a secondary winding, wherein a voltage applied by the controllable voltage supply across the first inductor induces a voltage across the second inductor; a switch electrically connected between a first terminal of the second inductor and a first terminal of a capacitive load; wherein the switch is configured to, based on a first polarity voltage supplied by the controllable voltage supply and based on a first voltage of the capacitive load, enter a first state in which current is passed to charge the capacitive load to a second voltage; wherein the switch is configured to, based on a null voltage supplied by the controllable voltage supply and based on the second voltage of the capacitive load, enter a second state in which current is restricted from passing through the switch to keep the capacitive load charged; and wherein the switch is configured to, based on a second polarity voltage supplied by the controllable voltage supply and based on the second voltage of the capacitive load, enter a third state in which current is passed to discharge the capacitive load, wherein the second polarity voltage has a polarity opposite to the first polarity voltage.

Clause 3: The apparatus of any one of clauses 1 or 2, wherein the switch is configured to, based on a voltage of the capacitive load being a negative voltage, enter a fourth state in which current is passed to apply a null voltage across the capacitive load.

Clause 4: The apparatus of any one of clauses 1 to 3, further comprising a controller, wherein the controller is configured to control the switch according to an enable signal.

Clause 5: The apparatus of any one of clauses 1 to 4, wherein the switch is a Zener diode.

Clause 6: The apparatus of any one of clauses 1 to 5, wherein the switch is a field-effect transistor (FET).

Clause 7: The apparatus of any one of clauses 1 to 6, further comprising a controller, wherein the controller is configured to control a gate-source voltage of the FET, according to one or more measurements of one or more electrical parameters in the apparatus.

Clause 8: The apparatus of any one of clauses 1 to 7, wherein the controller is an analog circuit.

Clause 9: The apparatus of any one of clauses 1 to 8, further comprising a diode connected in parallel with the switch.

Clause 10: The apparatus of any one of clauses 1 to 9, wherein a second terminal of the second inductor is connected to a second terminal of the capacitive load.

Clause 11: The apparatus of any one of clauses 1 to 10, further comprising a second switch coupled across the first inductor.

Clause 12: The apparatus of any one of clauses 1 to 11, wherein the controllable power supply comprises a switching circuit configured to transfer power from a power supply.

Clause 13: The apparatus of any one of clauses 1 to 12, wherein the switching circuit comprises a full-bridge or a half-bridge.

Clause 14: The apparatus of any one of clauses 1 to 13, further comprising a controller, wherein the controller switches one or more switches of the switching circuit in zero-voltage switching or zero-current switching.

Clause 15: The apparatus of any one of clauses 1 to 14, further comprising a circuit coupled across the second inductor, wherein the circuit comprises a second switch and one or more capacitors.

Clause 16: The apparatus of any one of clauses 1 to 15, wherein the isolating inductive element further comprises a third inductor having a tertiary winding, wherein the voltage applied by the controllable power supply or controllable voltage supply across the first inductor induces a voltage across the third inductor, and wherein the third inductor is electrically connected to a second capacitive load through a second switch.

Clause 17: The apparatus of any one of clauses 1 to 16, further comprising one or more passive element coupled between a second terminal of the second inductor and a gate terminal of the FET.

Clause 18: The apparatus of any one of clauses 1 to 17, wherein the capacitive load is a gate terminal of a transistor.

Clause 19: The apparatus of any one of clauses 1 to 18, further comprising a DC-DC converter comprising the transistor.

Clause 20: The apparatus of any one of clauses 1 to 19, further comprising a controller configured to control the controllable power supply or controllable voltage supply based on a closed loop control of a measured parameter in the DC-DC converter comprising the transistor.

Clause 21: The apparatus of any one of clauses 1 to 20, further comprising a controller configured to control the controllable power supply or controllable voltage supply based on a closed loop control of a measured parameter in the apparatus.

Clause 22: The apparatus of any one of clauses 1 to 21, wherein the measured parameter in the apparatus is one of a rise time sampling of voltage across the capacitive load and a peak current flowing through the first inductor or second inductor.

Clause 23: The apparatus of any one of clauses 4 to 22, further comprising a synchronization circuit configured to generate a pre-charge signal based on the enable signal, wherein the controller is configured to switch, based on the enable signal or the pre-charge signal, between different states of the apparatus, and wherein the different states comprise a first state in which a voltage is applied across the first inductor and a second state in which power is transferred between the second inductor and the capacitive load.

Clause 24: A method, comprising: applying, by a controllable power supply and based on a first enable signal, a first polarity voltage across a primary winding of a first inductor to transfer energy from the primary winding to a secondary winding of a second inductor to induce a first current that flows from the secondary winding through a switch to a capacitive load to charge the capacitive load to a first voltage; and applying, by the controllable power supply and based on a second enable signal, a second polarity voltage, having a polarity opposite to the first polarity voltage, across the primary winding to transfer energy from the primary winding to the secondary winding to induce a second current that flows through the switch in a direction opposite of the first current to discharge the capacitive load.

Clause 25: The method of clause 24, further comprising: applying, by the controllable power supply and based on a determination that the capacitive load is charged to the first voltage, a null voltage across the primary winding to keep the capacitive load charged.

Clause 26: The method of any one of clauses 24 or 25, further comprising: after the applying the second polarity voltage, applying, by the controllable power supply, a null voltage across the primary winding to apply the null voltage across the capacitive load.

Clause 27: The method of any one of clauses 24 to 26, further comprising applying, prior to the applying the second polarity voltage, a second voltage, having a same polarity as the first polarity voltage, across the first inductor to decrease a voltage across the switch.

Clause 28: The method of any one of clauses 24 to 27, wherein the controllable power supply comprises a full-bridge circuit that transfers power from a power supply.

Clause 29: The method of any one of clauses 24 to 28, further comprising controlling a voltage between a source terminal of a field-effect transistor (FET) and a drain terminal of the FET by applying a voltage to a gate terminal of the FET, wherein the switch comprises the FET.

Clause 30: The method of any one of clauses 24 to 29, further comprising providing, by a circuit, a stable voltage across a capacitive component, wherein the circuit is coupled across the second inductor and comprises a second switch and the capacitive component.

Clause 31: The method of any one of clauses 24 to 30, further comprising: prior to the applying the null voltage, determining, based on a clock signal, that a period of time has elapsed.

Clause 32: The method of any one of clauses 24 to 31, further comprising: after the applying the null voltage, applying, by the controllable power supply the first polarity voltage across the primary winding of the first inductor to ensure the capacitive load is charged to the first voltage.

Clause 33: The method of any one of clauses 24 to 32, further comprising: ensuring the charging of the capacitive load to the first voltage, by applying, by the controllable power supply the first polarity voltage across the primary winding of the first inductor to refresh a voltage across the capacitive load.

Clause 34: The method of any one of clauses 24 to 33, further comprising: using resonant characteristics of the second inductor and the capacitive load to transfer energy.

Clause 35: The method of any one of clauses 24 to 34, wherein the capacitive load is a gate terminal of a transistor.

Clause 36: The method of any one of clauses 24 to 35, further comprising a DC-DC converter comprising the transistor.

Clause 37: The method of any one of clauses 24 to 36, further comprising a controller configured to control the controllable power supply based on a closed loop control of a measured parameter in the DC-DC converter.

Clause 38: The method of any one of clauses 24 to 37, further comprising a controller configured to control the controllable power supply based on a closed loop control of a measured parameter.

Clause 39: The method of any one of clauses 24 to 38, wherein the measured parameter is one of a rise time sampling of voltage across the capacitive load and a peak current flowing through the first inductor or second inductor.

Clause 40: The method of any one of clauses 24 to 39, further comprising:
receiving the first enable signal for regulating voltage; determining, based on the first enable signal, at least one predicted characteristic of a third enable signal to be received after the first enable signal; based on the at least one predicted characteristic, generating a pre-charge signal; controlling, based on the pre-charge signal, a switching circuit to switch to a first state; and applying, by the switching circuit in the first state, a voltage across the first inductor coupled to the switching circuit.

Clause 41: An apparatus comprising: a synchronization circuit configured to generate a pre-charge signal based on a first enable signal; an inductive element; and a switching circuit coupled to the inductive element and configured to switch, based on the first enable signal or the pre-charge signal, between different states of the apparatus, wherein the different states comprise a first state in which a voltage is applied across the inductive element and a second state in which power is transferred between the inductive element and a load.

Clause 42: An apparatus comprising: a synchronization circuit configured to:
receive a first enable signal to regulate a voltage; determine a predicted characteristic of a second enable signal to be received after the first enable signal; and generate, prior to receipt of the second enable signal and based on the predicted characteristic, a pre-charge signal to control a plurality of switches to change a state of a drive circuit to pre-charge an inductive element.

Clause 43: An apparatus comprising: a switching circuit comprising switches and an inductive element; a controller configured to generate control signals for controlling the switching circuit; and a synchronization circuit configured to: receive a first enable signal for regulating a voltage; determine a predicted characteristic of a second enable signal to be received after the first enable signal; and generate, prior to receipt of the second enable and based on the predicted characteristic, a pre-charge signal to control one or more of the switches to pre-charge the inductive element.

Clause 44: The apparatus of any one of clauses 41 to 43, wherein the pre-charge signal is configured to precede a second enable signal.

Clause 45: The apparatus of any one of clauses 41 to 44, wherein the synchronization circuit is configured to generate, based on a characteristic of the first enable signal, the pre-charge signal.

Clause 46: The apparatus of any one of clauses 41 to 45, wherein the switching circuit is configured to transfer power between the inductive element and a second load in a staggered manner with respect to the transfer of power to the load.

Clause 47: The apparatus of any one of clauses 41 to 46, wherein the inductive element comprises a plurality of magnetically coupled windings around a common core; and wherein each of the plurality of magnetically coupled windings transfers power with a corresponding load.

Clause 48: The apparatus of any one of clauses 41 to 47, wherein the synchronization circuit includes a phase-locked loop (PLL) or a delay-locked loop (DLL).

Clause 49: The apparatus of any one of clauses 41 to 48, wherein the switching circuit includes an H bridge.

Clause 50: The apparatus of any one of clauses 41 to 49, wherein the switching circuit is configured to periodically change the voltage across the inductive element between multiple direct current (DC) voltage levels.

Clause 51: The apparatus of any one of clauses 41 to 50, further comprising a controller, wherein the controller switches one or more switches of the switching circuit in zero-voltage switching or zero-current switching.

Clause 52: The apparatus of any one of clauses 41 to 51, wherein the switching circuit configured to charge a load.

Clause 53: The apparatus of any one of clauses 41 to 52, wherein the switching circuit configured to drive a load.

Clause 54: The apparatus of any one of clauses 41 to 53, wherein the load comprises capacitive elements.

Clause 55: The apparatus of any one of clauses 41 to 54, wherein the load is a gate terminal of a transistor.

Clause 56: The apparatus of any one of clauses 41 to 55, further comprising a DC-DC converter comprising the transistor.

Clause 57: The apparatus of any one of clauses 41 to 56, wherein the controller configured to control the switching circuit based on a closed loop control of a measured parameter in the DC-DC converter comprising the transistor.

Clause 58: The apparatus of any one of clauses 41 to 57, further comprising a controller configured to control the switching circuit based on a closed loop control of a measured parameter.

Clause 59: The apparatus of any one of clauses 41 to 58, wherein the measured parameter is one of a rise time sampling of voltage across the load and a peak current flowing through the inductive element.

Clause 60: The apparatus of any one of clauses 41 to 59, wherein the switching circuit configured to use characteristics of the inductive element and the load to transfer energy.

Clause 61: The apparatus of any one of clauses 41 to 60, wherein the inductive element comprising a first inductor having a primary winding and a second inductor having a secondary winding, wherein a voltage applied by the switching circuit across the first inductor induces a voltage across the second inductor.

Clause 62: The apparatus of any one of clauses 41 to 61, wherein the switching circuit configured to drive a second load coupled with the second inductor.

Clause 63: A method comprising: receiving a first enable signal for regulating voltage; determining, based on the first enable signal, at least one predicted characteristic of a second enable signal to be received after the first enable signal; based on the at least one predicted characteristic, generating a pre-charge signal; controlling, based on the pre-charge signal, a switching circuit to switch to a first state; and applying, by the switching circuit in the first state, a voltage across an inductive element coupled to the switching circuit.

Clause 64: A method comprising: receiving a first enable signal to regulate a voltage; determining a predicted characteristic of a second enable signal to be received after the first enable signal; and generating, prior to receipt of the second enable signal and based on the predicted characteristic, a pre-charge signal to control a plurality of switches to change a state of a drive circuit to pre-charge an inductive element.

Clause 65: The method of any one of clauses 63 or 64, wherein the determining the at least one predicted characteristic comprises: detecting a frequency or a phase of the first enable signal.

Clause 66: The method of any one of clauses 63 to 65, further comprising controlling, based on the second enable signal, the switching circuit to switch to a second state.

Clause 67: The method of any one of clauses 63 to 66, further comprising transferring, during the second state, power between the inductive element and a load.

Clause 68: The method of any one of clauses 63 to 67, wherein the transferring power comprises: creating a closed-loop circuit comprising the inductive element and the load.

Clause 69: The method of any one of clauses 63 to 68, wherein the generating the pre-charge signal occurs prior to receiving the second enable signal.

Clause 70: The method of any one of clauses 63 to 69, further comprising: based on the pre-charge signal, enabling a current to flow through the inductive element; and increasing the current by maintaining the voltage across the inductive element.

Clause 71: The method of any one of clauses 63 to 70, further comprising: limiting the current to a threshold value.

Clause 72: The method of any one of clauses 63 to 71, further comprising: based on the second enable signal, transferring power from the inductive element to a load; and decreasing the current.

Clause 73: The method of any one of clauses 63 to 72, further comprising:

maintaining the current at the threshold value; based on the second enable signal, transferring power from the inductive element to a load; and decreasing the current.

Clause 74: The method of any one of clauses 63 to 73, further comprising:

periodically changing the voltage between multiple direct current (DC) voltage levels.

Clause 75: The method of any one of clauses 63 to 74, wherein the switching circuit is configured to drive a load.

Clause 76: The method of any one of clauses 67, 68, 72, 73, or 75, wherein the load is a gate terminal of a transistor.

Clause 77: The method of any one of clauses 63 to 76, further comprising a DC-DC converter comprising a transistor comprising a gate terminal configured to operate as a load.

Clause 78: The method of clause 77, further comprising a controller configured to control the switching circuit based on a closed loop control of a measured parameter in the DC-DC converter.

Clause 79: The method of any one of clauses 63 to 78, further comprising a controller configured to control the switching circuit based on a closed loop control of a measured parameter.

Clause 80: The method of clause 79, wherein the measured parameter is one of a rise time sampling of voltage across the load and a peak current flowing through the inductive element.

Clause 81: A system comprising: a switching circuit comprising switches and an inductive element; a controller configured to generate control signals for controlling the switching circuit; and a synchronization circuit configured to: receive a first enable signal for regulating a voltage; determine a predicted characteristic of a second enable signal to be received after the first enable signal; and generate, prior to receipt of the second enable and based on the predicted characteristic, a pre-charge signal to control one or more of the switches to pre-charge the inductive element.

What is claimed is:

1. An apparatus comprising:
a controllable power supply;
an isolating inductive element comprising a first inductor having a primary winding and a second inductor having a secondary winding, wherein a voltage applied by the controllable power supply across the first inductor induces a voltage across the second inductor;
a controller configured to output an enable signal; and
a switch electrically connected between a first terminal of the second inductor and a first terminal of a capacitive load and configured to switch between conducting and nonconducting states based on the enable signal;
wherein the controller is configured to, based on a first polarity voltage supplied by the controllable power supply and based on a first voltage of the capacitive load, control the switch to cause the apparatus to enter a first state in which current is passed to charge the capacitive load to a second voltage;
wherein the controller is configured to, based on a null voltage supplied by the controllable power supply and based on the second voltage of the capacitive load, control the switch to cause the apparatus to enter a second state in which current is restricted from passing between the first terminal of the second inductor and the first terminal of the capacitive load to keep the capacitive load charged;
wherein the controller is configured to, based on a second polarity voltage supplied by the controllable power supply and based on the second voltage of the capacitive load, control the switch to cause the apparatus to enter a third state in which current is passed to discharge the capacitive load, wherein the second polarity voltage has a polarity opposite to the first polarity voltage; and
wherein the controller is configured to, based on the null voltage supplied by the controllable power supply and a negative voltage of the capacitive load, control the switch to cause the apparatus to enter a fourth state in which current is passed through the switch to charge the capacitive load to a null voltage.

2. The apparatus according to claim 1, wherein the switch is the only switch connected in series with the capacitive load across the second inductor.

3. The apparatus according to claim 1, wherein the enable signal comprises a pulse width modulated signal generated by the controller.

4. The apparatus according to claim 1, further comprising:
a synchronization circuit configured to generate a pre-charge signal,
wherein the controller is configured to switch, based on the pre-charge signal, the apparatus between different apparatus states.

5. The apparatus according to claim 1, wherein the switch is a field-effect transistor (FET), and wherein the controller comprises a microprocessor.

6. The apparatus according to claim 5, wherein the controller is configured to control a gate-source voltage of the FET, according to one or more measurements of one or more electrical parameters in the apparatus.

7. The apparatus according to claim 1, further comprising a diode connected in parallel with the switch.

8. The apparatus according to claim 1, wherein a second terminal of the second inductor is connected to a second terminal of the capacitive load.

9. The apparatus according to claim 1, further comprising a second switch coupled across the first inductor.

10. The apparatus according to claim 1, wherein the controller is configured to cause the apparatus to re-enter the first state.

11. The apparatus according to claim 1, further comprising a circuit coupled across the second inductor, wherein the circuit comprises one or more capacitors.

12. The apparatus according to claim 1, wherein the isolating inductive element further comprises a third inductor having a tertiary winding, wherein the voltage applied by the controllable power supply across the first inductor induces a voltage across the third inductor, and wherein the third inductor is electrically connected to a second capacitive load through a second switch.

13. A method, comprising:
transmitting, from a controller to a switch, an enable signal to control the switch to pass a first current in a first direction to charge a capacitive load and to pass a second current in a second direction, opposite to the first direction, to discharge the capacitive load;
applying, by a controllable power supply, a first polarity voltage across a primary winding of a first inductor to induce, in a secondary winding of a second inductor, the first current that passes through the switch to charge the capacitive load to a first voltage;
applying, by the controllable power supply and based on a determination that the capacitive load is charged to the first voltage, a first null voltage across the primary winding while the switch restricts current from passing between the secondary winding and the capacitive load to keep the capacitive load charged;
applying, by the controllable power supply, a second polarity voltage, having a polarity opposite to the first polarity voltage, across the primary winding to induce, in the secondary winding, the second current that passes through the switch to discharge the capacitive load; and
applying, by the controllable power supply, a second null voltage across the primary winding while the switch passes current to charge the capacitive load to a third null voltage.

14. The method of claim 13, wherein the enable signal comprises a pulse width modulated signal generated by the controller.

15. The method of claim 13, further comprising: prior to the applying the first null voltage, determining, based on a clock signal, that a period of time has elapsed.

16. The method of claim 13, further comprising: after the applying the second null voltage across the primary winding, applying, by the controllable power supply, the first polarity voltage across the primary winding of the first inductor to induce, in the secondary winding of the second inductor, the first current that passes through the switch to charge the capacitive load to the first voltage.

17. The method of claim 13, further comprising: applying, prior to the applying the second polarity voltage, a second voltage, having a same polarity as the first polarity voltage, across the first inductor to decrease a voltage across the switch.

18. The method of claim 13, wherein the transmitting the enable signal to control the switch comprises applying a voltage to a gate terminal of a field-effect transistor (FET), wherein the switch comprises the FET.

19. The method of claim 13, further comprising: providing, by a circuit, a stable voltage across a capacitive component, wherein the circuit is coupled across the second inductor and comprises the capacitive component.

20. The method of claim 13, wherein the applying the second polarity voltage comprises applying the second polarity voltage to charge the capacitive load to a negative voltage.

* * * * *